United States Patent
Ishizaki et al.

(10) Patent No.: US 10,126,888 B2
(45) Date of Patent: Nov. 13, 2018

(54) METHOD OF MANUFACTURING ELECTRODE SUBSTRATE, ELECTRODE SUBSTRATE, DISPLAY APPARATUS AND INPUT DEVICE

(71) Applicant: Japan Display Inc., Tokyo (JP)

(72) Inventors: Koji Ishizaki, Tokyo (JP); Hayato Kurasawa, Tokyo (JP); Masanobu Ikeda, Tokyo (JP); Yoshihiro Watanabe, Tokyo (JP); Toshimasa Ishigaki, Tokyo (JP); Daisuke Sonoda, Tokyo (JP); Tatsuya Ide, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 351 days.

(21) Appl. No.: 14/831,443

(22) Filed: Aug. 20, 2015

(65) Prior Publication Data
US 2016/0062512 A1 Mar. 3, 2016

(30) Foreign Application Priority Data
Aug. 28, 2014 (JP) ................... 2014-174627

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *H05K 3/28* (2013.01); *G06F 2203/04103* (2013.01); *G06F 2203/04111* (2013.01); *G06F 2203/04112* (2013.01); *H05K 1/16* (2013.01); *H05K 1/162* (2013.01);
(Continued)

(58) Field of Classification Search
None
See application file for complete search history.

(56) References Cited

U.S. PATENT DOCUMENTS

| 6,127,082 A * | 10/2000 | Humberstone ......... B05B 5/025 118/621 |
| 2002/0142507 A1* | 10/2002 | Egashira ........... H01L 21/76243 438/48 |
| 2010/0321603 A1* | 12/2010 | Liu ................... G02F 1/133528 349/56 |

FOREIGN PATENT DOCUMENTS

| JP | 2010-181474 A | 8/2010 |
| JP | 2014-026386 | 2/2014 |

(Continued)

OTHER PUBLICATIONS

Japanese Patent Office Action dated Apr. 25, 2017 corresponding to Japanese Serial No. 2014-174627.

*Primary Examiner* — Amare Mengistu
*Assistant Examiner* — Shawna Stepp Jones
(74) *Attorney, Agent, or Firm* — Dentons US LLP

(57) ABSTRACT

A manufacturing process of an electrode substrate includes a step of forming a protective layer so as to cover a conductor pattern by applying raw material liquid discharged as droplets to an upper surface of a substrate in a first region and a second region of the upper surface of the substrate. At this time, an application amount of the raw material liquid per unit area in the second region is made smaller than an application amount of the raw material liquid per unit area in the first region, so that an average film thickness of the protective layer of a portion formed in the second region is made smaller than an average film thickness of the protective layer of a portion formed in the first region.

9 Claims, 23 Drawing Sheets

(51) Int. Cl.
*H05K 3/28* (2006.01)
*H05K 1/16* (2006.01)

(52) U.S. Cl.
CPC ............... *H05K 2201/0191* (2013.01); *H05K 2201/09972* (2013.01); *H05K 2201/10053* (2013.01); *H05K 2203/013* (2013.01)

(56) References Cited

FOREIGN PATENT DOCUMENTS

| | | |
|---|---|---|
| JP | 2014-048762 | 3/2014 |
| JP | 2015-011568 | 1/2015 |

\* cited by examiner

METHOD OF MANUFACTURING ELECTRODE SUBSTRATE, ELECTRODE SUBSTRATE, DISPLAY APPARATUS AND INPUT DEVICE

CROSS-REFERENCE TO RELATED APPLICATION

The present application claims priority from Japanese Patent Application No. 2014-174627 filed on Aug. 28, 2014, the contents of which are hereby incorporated by reference into this application.

TECHNICAL FIELD OF THE INVENTION

The present invention relates to a method of manufacturing an electrode substrate, an electrode substrate, a display apparatus and an input device.

BACKGROUND OF THE INVENTION

In recent years, a technique of attaching an input device referred to as a touch panel or a touch sensor to a display surface side of a display apparatus and sensing and outputting an input position when input operations are performed by contacting the touch panel with a finger or an input tool such as a touch pen has been known. Such display apparatuses having a touch panel are widely used in portable information terminals such as mobile phones in addition to computers.

One sensing method for sensing contact positions at which a finger or the like has contacted the touch panel is the electrostatic capacitance method. In an electrostatic capacitive touch panel, a plurality of capacitive elements each made up of a pair of electrodes disposed to be opposed to each other with a dielectric layer interposed therebetween, that is, a driving electrode and a sensing electrode are provided in a plane of the touch panel. Then, the input positions are sensed by utilizing the characteristics that the electrostatic capacitance of capacitive elements varies when performing input operations by contacting the capacitive elements with a finger or an input tool such as a touch pen.

In the display apparatus to which an input device such as a touch panel is attached, it is desirable to reduce electric resistance of the sensing electrodes for improving the sensing performance, and thus a conductive film such as a metal film is sometimes used as a material of the conductor pattern made up of the sensing electrode and a lead wiring electrically connected to the sensing electrode. Thus, in an electrode substrate included in the display apparatus and having a substrate and a conductor pattern made up of a sensing electrode and a lead wiring formed on the substrate, a protective layer is formed on the electrode substrate so as to cover the conductor pattern made up of the sensing electrode and the lead wiring for preventing corrosion of the sensing electrode.

When a protective layer is formed on the electrode substrate as described above, it is sometimes necessary to adjust the protective layer so as to have different film thicknesses between two regions on an upper surface of the substrate included in the electrode substrate, for example, between a certain region included in a peripheral region on an outer peripheral side of a display region and a region on an outer peripheral side of the substrate than the certain region or between the display region and the peripheral region.

As an example of a technique of adjusting a film so as to have different film thicknesses between two regions described above, Japanese Patent Application Laid-Open Publication No. 2010-181474 (Patent Document 1) describes a technique of forming an organic film pattern having a stepped structure in a thickness direction in a method of manufacturing a reflection type liquid crystal display apparatus.

SUMMARY OF THE INVENTION

In the technique described in the Patent Document 1, the organic film pattern having the stepped structure in the thickness direction is formed by applying and forming an organic flattened film, which is a photosensitive organic resin film, by a spin coating method or the like, and then performing the development after the exposure by a half-tone exposure technique. However, in the technique described in the Patent Document 1, when the organic film pattern having the stepped structure in the thickness direction is formed, it is necessary to perform half-tone exposure using a special photomask such as a half-tone mask. Thus, the number of steps in the process of forming the electrode substrate increases, and the manufacturing cost of the electrode substrate increases.

As described above, it is difficult to easily adjust the film thickness of the protective layer so that the protective layer has different film thicknesses between two regions of the upper surface of the substrate included in the electrode substrate.

The present invention has been made in order to solve the problem of the related art described above, and an object thereof is to provide a method of manufacturing an electrode substrate capable of easily adjusting a film thickness of a protective layer so that the protective layer has different film thicknesses between two regions of an upper surface of a substrate when forming the protective layer so as to cover a conductor pattern on the substrate.

The following is a brief description of an outline of the typical invention disclosed in the present application.

A method of manufacturing an electrode substrate according to one aspect of the present invention includes: (a) a step of preparing a first substrate; (b) a step of forming a conductor pattern on a first main surface of the first substrate in a first region of the first main surface of the first substrate and in a second region of the first main surface of the first substrate; and (c) after the step (b), a step of forming a protective layer so as to cover the conductor pattern by applying a raw material liquid discharged as droplets to the first region and the second region of the first main surface of the first substrate. The second region is a region on an outer peripheral side of the first substrate than the first region. In addition, in the step (c), an application amount of the raw material liquid per unit area of the first main surface in the second region is made smaller than an application amount of the raw material liquid per unit area of the first main surface in the first region, so that an average film thickness of the protective layer of a portion formed in the second region is made smaller than an average film thickness of the protective layer of a portion formed in the first region.

Also, an electrode substrate according to another aspect of the present invention includes: a first substrate; a first electrode continuously formed on a first main surface of the first substrate from a first region of the first main surface of the first substrate via a second region of the first main surface of the first substrate to a third region of the first main surface of the first substrate; and a protective layer formed so as to cover the first electrode in the first region and the second region. A film thickness of the protective layer of a portion formed on the first electrode in the second region is smaller than a film thickness of the protective layer of a portion formed on the first electrode in the first region. In addition, a side surface of the first electrode of a portion formed in the third region is exposed from the protective layer.

BRIEF DESCRIPTIONS OF THE DRAWINGS

DESCRIPTIONS OF THE PREFERRED EMBODIMENTS

Figure 1:
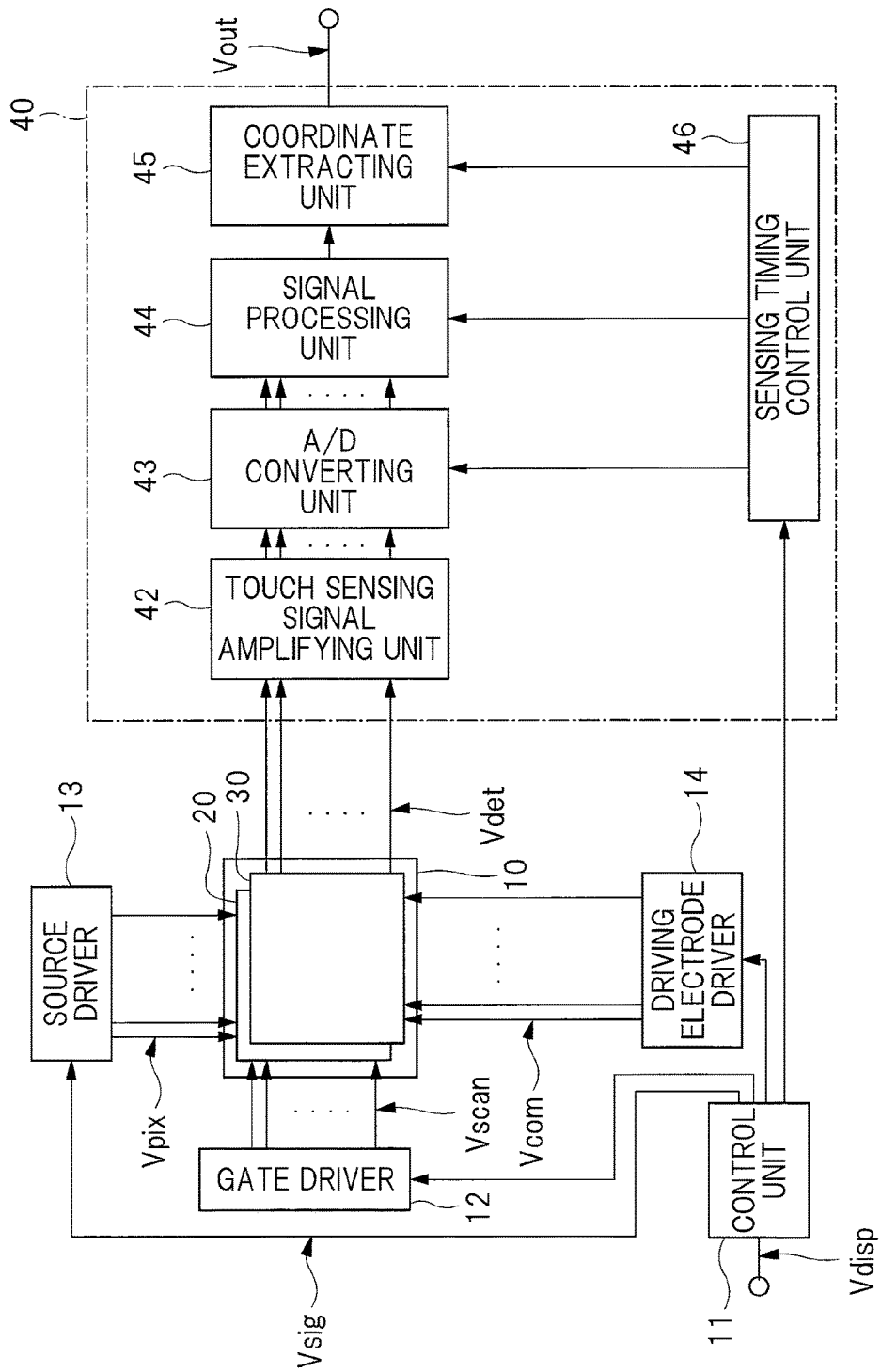
FIG. 1 is a block diagram illustrating a configuration example of a display apparatus according to the first embodiment.

Hereinafter, each embodiment of the present invention will be described with reference to the drawings.

Note that the disclosure is merely an example and suitable changes which may be easily anticipated by a person skilled in the art while maintaining the gist of the invention are included in the scope of the present invention as a matter of course. In addition, although the width, thickness, shape and others of respective parts may be schematically illustrated in the drawings as compared with the embodiments for clarity in the description, they are merely examples and do not limit the interpretation of the present invention.

In the specification and the drawings, the same components as those mentioned in previously presented drawings are denoted by the same reference characters and detailed descriptions thereof may be appropriately omitted.

In addition, in some drawings used in the embodiments, hatching (shading) given for distinguishing a structure is sometimes omitted depending on the drawings.

Moreover, in the embodiments described below, when a range is indicated as A to B, that range means A or more and B or less unless otherwise mentioned.

First Embodiment

First, an example in which a display device provided with a touch panel as an input device is applied to an in-cell liquid crystal display device with a touch sensing function will be described as the first embodiment. Note that, in this specification, the input device indicates an input device which senses at least an electrostatic capacitance varied depending on a capacitance of an object that approaches or is in contact with an electrode. Here, examples of the method of sensing the electrostatic capacitance include not only a mutual capacitance method that senses an electrostatic capacitance between two electrodes, but also a self-capacitance method that senses the electrostatic capacitance of one electrode. In addition, the liquid crystal display device with a touch sensing function indicates a liquid crystal display device in which a sensing electrode for touch sensing is provided on either one of a first substrate and a second substrate that form a display unit. Furthermore, in this first embodiment, an in-cell liquid crystal display device with a touch sensing function which is characterized in that a driving electrode is provided so as to operate as a driving electrode of the display unit and also as a driving electrode of the input device will be described.

<Overall Configuration>

First, the overall configuration of the display apparatus according to the present first embodiment will be described with reference to FIG. 1. FIG. 1 is a block diagram illustrating a configuration example of a display apparatus according to the first embodiment.

A display apparatus 1 includes a display device 10 with a touch sensing function, a control unit 11, a gate driver 12, a source driver 13, a driving electrode driver 14, and a touch sensing unit 40.

The display device 10 with a touch sensing function includes a display device 20 and a touch sensing device 30. In the first embodiment, the display device 20 is a display device using liquid crystal display elements as display elements. Therefore, hereinafter, the display device 20 is referred to as a liquid crystal display device 20 in some cases. The touch sensing device 30 is a touch sensing device of electrostatic capacitance type, that is, an electrostatic capacitive touch sensing device. Therefore, the display apparatus 1 is a display apparatus including an input device with a touch sensing function. Further, the display device 10 with a touch sensing function is a display device in which the liquid crystal display device 20 and the touch sensing device 30 are integrated, and is a display device incorporating a touch sensing function, namely, an in-cell display device with a touch sensing function.

Further, the display device 10 with a touch sensing function may be a display device in which the touch sensing device 30 is attached on the display device 20. Also, the display device 20 may be an organic EL (Electroluminescence) display device instead of the display device using the liquid crystal display element.

The display device 20 performs display by sequentially scanning each horizontal line in the display region in accordance with scanning signals Vscan supplied from the gate driver 12. The touch sensing device 30 operates in accordance with a principle of electrostatic capacitive touch sensing and outputs sensing signals Vdet as described later.

The control unit 11 is a circuit which respectively supplies control signals to the gate driver 12, the source driver 13, the driving electrode driver 14 and the touch sensing unit 40 based on video signals Vdisp supplied from outside for controlling them so that they are operated in synchronization with each other.

The gate driver 12 has a function of sequentially selecting one horizontal line, which is an object of display driving of the display device 10 with a touch sensing function, based on control signals supplied from the control unit 11.

The source driver 13 is a circuit which supplies pixel signals Vpix to sub-pixels SPix included in the display device 10 with a touch sensing function (see FIG. 7 to be described later) based on control signals of image signals Vsig supplied from the control unit 11.

The driving electrode driver 14 is a circuit which supplies driving signals Vcom to driving electrodes COML included in the display device 10 with a touch sensing function (see FIG. 5 or FIG. 6 to be described later) based on control signals supplied from the control unit 11.

The touch sensing unit 40 is a circuit which senses presence/absence of touches of a finger or an input tool such as a touch pen to the touch sensing device 30, namely, a state of contact or approach to be described later based on control signals supplied from the control unit 11 and sensing signals Vdet supplied from the touch sensing device 30 of the display device 10 with a touch sensing function. Also, the touch sensing unit 40 is a circuit which obtains coordinates of touches, namely, input positions in the touch sensing region in the case where the touches are present. The touch sensing unit 40 includes a touch sensing signal amplifying unit 42, an A/D (Analog/Digital) converting unit 43, a signal processing unit 44, a coordinate extracting unit 45 and a sensing timing control unit 46.

The touch sensing signal amplifying unit 42 amplifies sensing signals Vdet supplied from the touch sensing device 30. The touch sensing signal amplifying unit 42 may be provided with a low pass analog filter which removes high frequency components, namely, noise components included in the sensing signals Vdet and extracts and respectively outputs touch components.

<Principle of Electrostatic Capacitive Touch Sensing>

Figure 2:
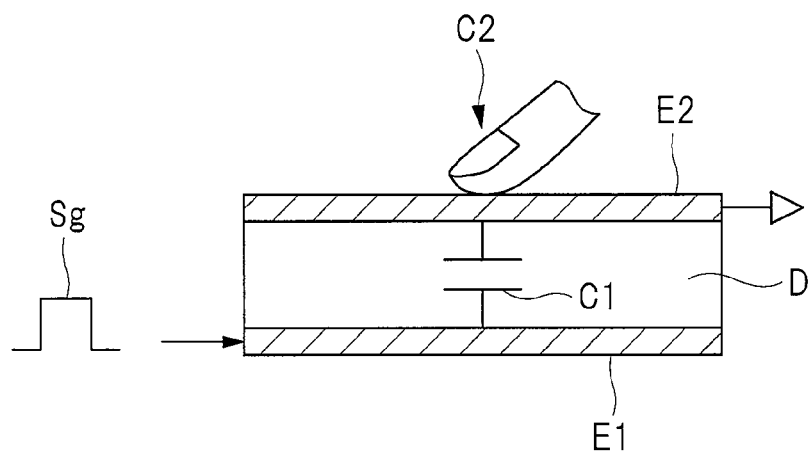
FIG. 2 is an explanatory diagram illustrating a state in which a finger is in contact with or approaches a touch sensing device.
Figure 3:
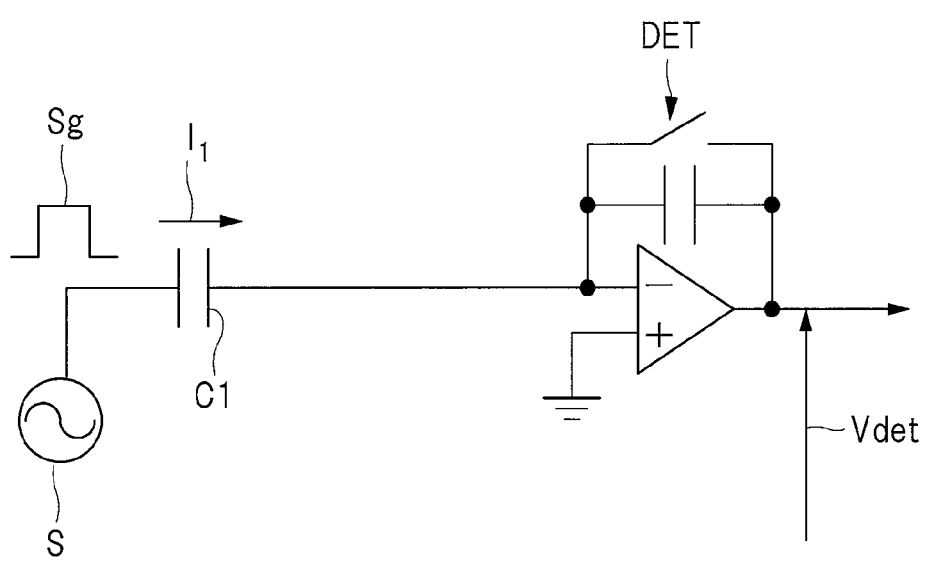
FIG. 3 is an explanatory diagram illustrating an example of an equivalent circuit in the state in which a finger is in contact with or approaches a touch sensing device.
Figure 4:
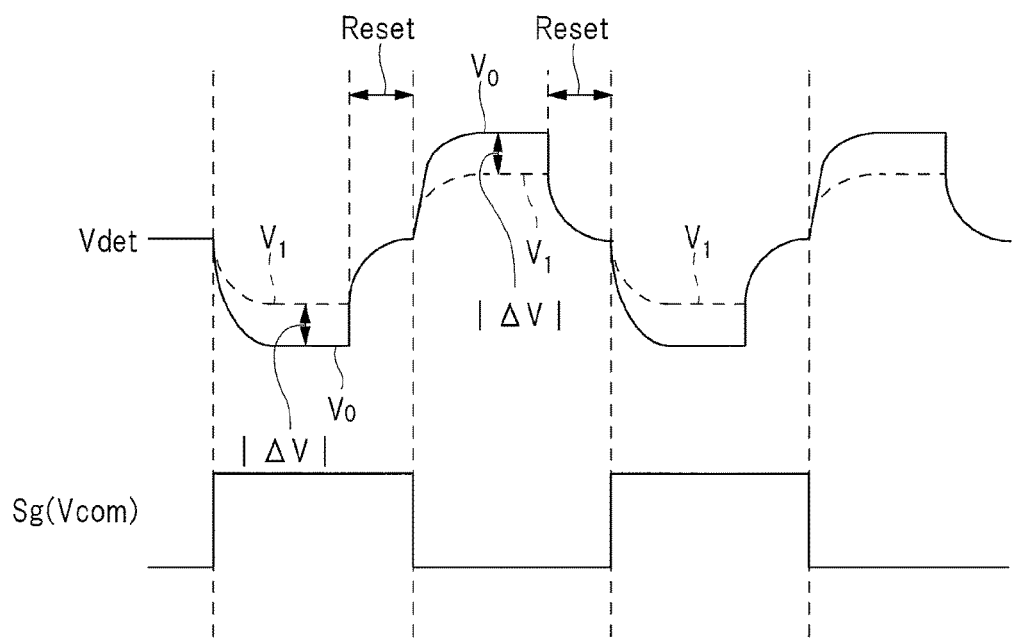
FIG. 4 is a diagram illustrating an example of waveforms of a driving signal and a sensing signal.

Next, the principle of touch sensing in the display apparatus 1 according to the present first embodiment will be described with reference to FIG. 1 to FIG. 4. FIG. 2 is an explanatory diagram illustrating a state in which a finger is in contact with or approaches a touch sensing device. FIG. 3 is an explanatory diagram illustrating an example of an equivalent circuit in a state in which a finger is in contact with or approaches the touch sensing device. FIG. 4 is a diagram illustrating an example of waveforms of a driving signal and a sensing signal.

As illustrated in FIG. 2, in the electrostatic capacitive touch sensing, an input device referred to as a touch panel or a touch sensor includes a driving electrode E1 and a sensing electrode E2 which are disposed to be opposed to each other with a dielectric body D interposed therebetween. A capacitive element C1 is formed by the driving electrode E1 and the sensing electrode E2. As illustrated in FIG. 3, one end of the capacitive element C1 is connected to an AC signal source S which is a driving signal source, and the other end of the capacitive elements C1 is connected to a voltage sensor DET which is the touch sensing unit. The voltage sensor DET is, for example, an integrating circuit included in the touch sensing signal amplifying unit 42 illustrated in FIG. 1.

When an AC rectangular wave Sg having a frequency in the range of, for example, several kHz to several hundreds kHz is applied from the AC signal source S to the one end of the capacitive element C1, namely, the driving electrode E1, a sensing signal Vdet which is an output waveform is generated via the voltage sensor DET connected to the other end of the capacitive element C1, namely, the sensing electrodes E2. Note that the AC rectangular wave Sg corresponds to, for example, the driving signal Vcom illustrated in FIG. 4.

In the state in which no finger contacts or approaches, namely, in the non-contact state, current $I_1$ corresponding to the capacitance value of the capacitive element C1 flows in accordance with charge and discharge of the capacitive element C1 as illustrated in FIG. 3. The voltage sensor DET converts the fluctuation in the current $I_1$ in accordance with the AC rectangular wave Sg into the fluctuation in voltage. The voltage fluctuation is represented as the waveform $V_0$ indicated by a solid line in FIG. 4.

On the other hand, in a state in which a finger is in contact or approaches, namely, in the contact state, the capacitance value of the capacitive element C1 formed of the driving electrode E1 and the sensing electrode E2 decreases due to the influence from the electrostatic capacitance C2 formed by the finger. Therefore, the current $I_1$ flowing in the capacitive element C1 illustrated in FIG. 3 fluctuates. The voltage sensor DET converts the fluctuation in the current $I_1$ in accordance with the AC rectangular wave Sg into the fluctuation in voltage. This voltage fluctuation is represented as the waveform $V_1$ indicated by a broken line in FIG. 4. In this case, the amplitude of the waveform $V_1$ is smaller than that of the above-described waveform $V_0$. Accordingly, the absolute value |ΔV| of the voltage difference between the waveform $V_0$ and waveform $V_1$ is varied in accordance with influences of an object approaching from outside such as a finger. Note that, in order to accurately sense the absolute value |ΔV| of the voltage difference between the waveform $V_0$ and the waveform $V_1$, it is preferable that a period Reset during which charge and discharge of the capacitor are reset in accordance with a frequency of the AC rectangular wave Sg by the switching in the circuit is provided in the operation of the voltage sensor DET.

In the example illustrated in FIG. 1, the touch sensing device 30 performs touch sensing for each sensing block corresponding to one or a plurality of driving electrodes COML (see FIG. 5 or FIG. 6 described later) in accordance with the driving signal Vcom supplied from the driving electrode driver 14. More specifically, the touch sensing device 30 outputs the sensing signal Vdet via the voltage sensor DET illustrated in FIG. 3 for each sensing block corresponding to each of the one or a plurality of driving electrodes COML, and supplies the output sensing signal Vdet to the touch sensing signal amplifying unit 42 of the touch sensing unit 40.

The A/D converting unit 43 is a circuit which samples each analog signal output from the touch sensing signal amplifying unit 42 at a timing in synchronization with the driving signal Vcom, thereby converting it into a digital signal.

The signal processing unit 44 is provided with a digital filter which reduces frequency components other than the frequency at which the driving signal Vcom is sampled, namely, noise components included in the output signal of the A/D converting unit 43. The signal processing unit 44 is a logic circuit which senses presence/absence of touches to the touch sensing device 30 based on the output signal of the A/D converting unit 43. The signal processing unit 44 performs the process of extracting only differential voltage caused by the finger. The differential voltage caused by the finger is the absolute value |ΔV| of the difference between the waveform $V_0$ and waveform $V_1$ mentioned above. It is also possible that the signal processing unit 44 performs calculations of averaging absolute values |ΔV| per each sensing block to obtain the average value of the absolute values |ΔV|. By this means, the signal processing unit 44 can reduce the influences of noise. The signal processing unit 44 compares the sensed differential voltage caused by the finger with a predetermined threshold voltage, and when the voltage is equal to or higher than the threshold voltage, it is determined to be the contact state of an externally approaching object which approaches from outside, and when the voltage is lower than the threshold voltage, it is determined to be the non-contact state of an externally approaching object. In this manner, touch sensing is performed by the touch sensing unit 40.

The coordinate extracting unit 45 is a logic circuit which obtains the coordinates of the position at which the touch has been sensed by the signal processing unit 44, namely, the input position on the touch panel. The sensing timing control unit 46 controls the A/D converting unit 43, the signal processing unit 44 and the coordinate extracting unit 45 so that they are operated in synchronization with each other. The coordinate extracting unit 45 outputs the touch panel coordinates as a signal output Vout.

<Module>

Figure 5:
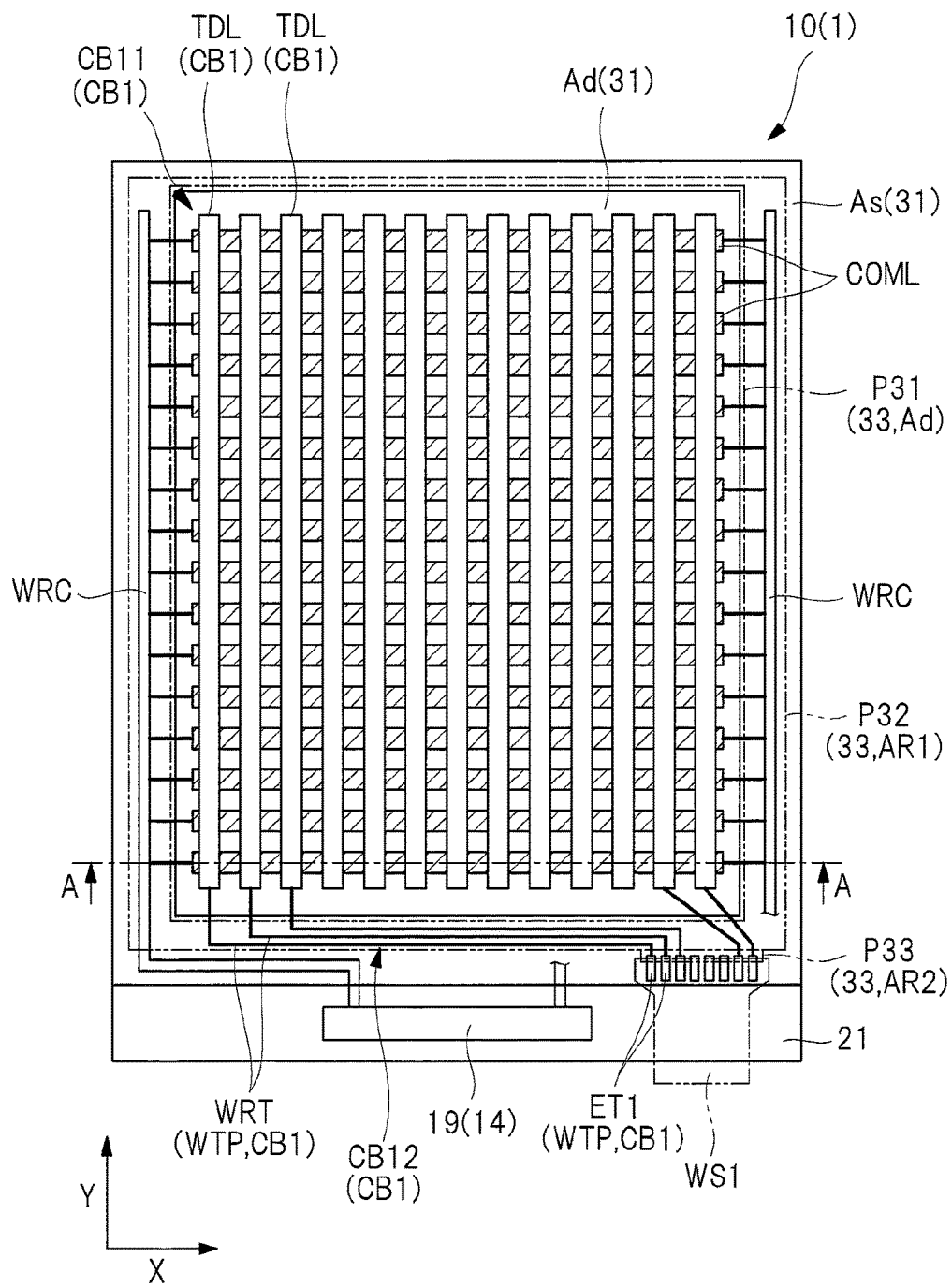
FIG. 5 is a plan view illustrating an example of a module having the display apparatus according to the first embodiment incorporated therein.

FIG. 5 is a plan view illustrating an example of a module having the display apparatus according to the first embodiment incorporated therein. In FIG. 5, portions P31, P32 and P33 of a protective layer 33 and a wiring substrate WS1 are indicated by two-dot chain lines.

As illustrated in FIG. 5, the display device 10 with a touch sensing function according to the first embodiment has a substrate 21, a substrate 31, a plurality of driving electrodes COML and a plurality of sensing electrodes TDL. The substrate 31 has an upper surface serving as one main surface and a lower surface serving as the other main surface on an opposite side of the upper surface. Here, two directions which mutually intersect, preferably orthogonally, with each other within the upper surface of the substrate 31 or the lower surface of the substrate 31 are defined to be an X axis direction and a Y axis direction. At this time, the plurality of driving electrodes COML respectively extend in the X axis direction and are arrayed in the Y axis direction when seen in a plan view. Further, the plurality of sensing electrodes TDL respectively extend in the Y axis direction and are arrayed in the X axis direction when seen in a plan view.

As will be described later with reference to FIG. 7, each of the plurality of driving electrodes COML is provided so as to overlap the plurality of sub-pixels SPix arrayed in the X axis direction when seen in a plan view. More specifically, one driving electrode COML is provided as a common electrode for the plurality of sub-pixels SPix.

Note that the expression "when seen in a plan view" in the present specification indicates the case in which components are seen from a direction perpendicular to the upper surface serving as the main surface of the substrate 31 or the substrate 21.

In the example illustrated in FIG. 5, the display device 10 with a touch sensing function has a rectangular shape with two sides which respectively extend in the X axis direction and are opposed to each other and two sides which respectively extend in the Y axis direction and are opposed to each other when seen in a plan view. Electrode terminals ET1 are provided on one side of the display device 10 with a touch sensing function in the Y axis direction. The electrode terminals ET1 and the sensing electrodes TDL are electrically connected by lead wirings WRT, respectively. The electrode terminal ET1 is electrically connected to the wiring substrate WS1, and the wiring substrate WS1 is connected to the touch sensing unit 40 (see FIG. 1) mounted to the outside of this module. Accordingly, the sensing electrode TDL is connected to the touch sensing unit 40 via the lead wiring WRT, the electrode terminal ET1 and the wiring substrate WS1.

A wiring part WTP as an electrode is formed from the lead wiring WRT and the electrode terminal ET1. More specifically, the wiring part WTP as an electrode has the lead wiring WRT and the electrode terminal ET1.

The display device 10 with a touch sensing function has a chip on glass (COG) 19. The COG 19 is a chip mounted on the substrate 21 and it incorporates respective circuits required for the display operation such as the control unit 11, the gate driver 12 and the source driver 13 illustrated in FIG. 1. In addition, the COG 19 may incorporate the driving electrode driver 14. The COG 19 and each of the plurality of driving electrodes COML are electrically connected by the lead wiring WRC though a detailed illustration thereof is omitted.

Note that various substrates transparent with respect to visible light, for example, a glass substrate, a film made of resin, or the like may be used as the substrate 21 and the substrate 31. In addition, in this specification, the expression "transparent with respect to visible light" means that transmittance with respect to the visible light is, for example, 90% or more, and the transmittance with respect to the visible light means an average value of the transmittance with respect to light having a wavelength of, for example, 380 to 780 nm. In addition, the transmittance means a proportion of light which is transmitted through a rear surface to a front surface on the opposite side of the rear surface of the display device 10 with a touch sensing function in a display region Ad out of the light emitted to the rear surface of the display device 10 with a touch sensing function (see FIG. 6 to be described later).

<Display Device with Touch Sensing Function>

Figure 6:
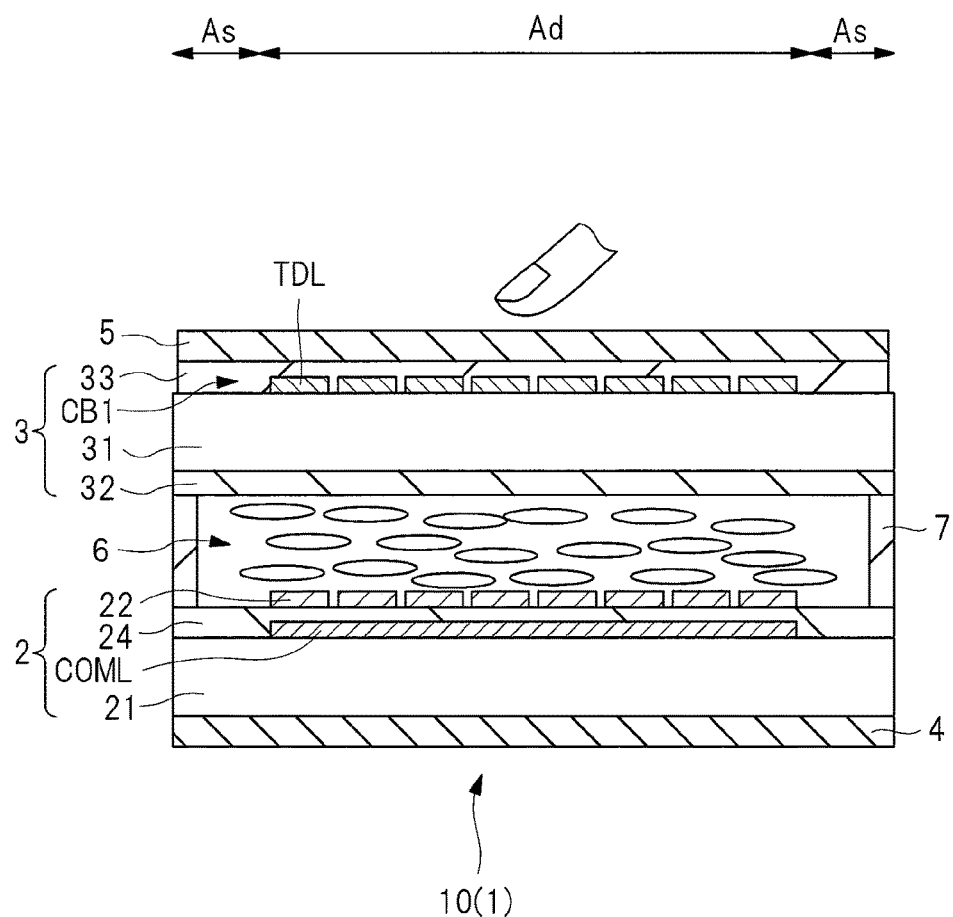
FIG. 6 is a cross-sectional view illustrating a display device with a touch sensing function of the display apparatus according to the first embodiment.

Next, the configuration example of the display device 10 with a touch sensing function will be described in detail with reference to FIGS. 5 to 8. FIG. 6 is a cross-sectional view illustrating the display device with a touch sensing function of the display apparatus according to the first embodiment. FIG. 7 is a circuit diagram illustrating the display device with a touch sensing function of the display apparatus according to the first embodiment. FIG. 8 is a perspective view illustrating a configuration example of the driving electrode and the sensing electrode of the display apparatus according to the first embodiment. FIG. 6 is a cross-sectional view taken along the line A-A of FIG. 5.

The display device 10 with a touch sensing function has an array substrate 2, an opposing substrate 3, a polarizing plate 4, a polarizing plate 5, a liquid crystal layer 6 and a sealing part 7. The opposing substrate 3 is arranged in opposition to the array substrate 2 so that an upper surface serving as a main surface of the array substrate 2 and a lower surface serving as a main surface of the opposing substrate 3 face each other. The polarizing plate 4 is provided on an opposite side of the opposing substrate 3 with the array substrate 2 interposed therebetween. The polarizing plate 5 is provided on an opposite side of the array substrate 2 with the opposing substrate 3 interposed therebetween. The liquid crystal layer 6 is provided between the array substrate 2 and the opposing substrate 3. Namely, the liquid crystal layer 6 is sandwiched between the upper surface of the substrate 21 and the lower surface of the substrate 31. The sealing part 7 is provided between an outer peripheral portion of the array substrate 2 and an outer peripheral portion of the opposing substrate 3, and an outer peripheral portion of a space between the array substrate 2 and the opposing substrate 3 is sealed with the sealing part 7. Then, the space whose outer peripheral portion is sealed with the sealing part 7 is filled with the liquid crystal layer 6.

The array substrate 2 has the substrate 21. In addition, the opposing substrate 3 has the substrate 31. The substrate 31 has the upper surface serving as one main surface and the lower surface serving as the other main surface on the opposite side of the upper surface, and it is arranged in opposition to the substrate 21 so that the upper surface serving as the main surface of the substrate 21 and the lower surface serving as the main surface of the substrate 31 face each other. The substrate 31 has the display region Ad and the peripheral region As the regions of the upper surface of the substrate 31. The peripheral region As is a region positioned on an outer peripheral side of the substrate 31 than the display region Ad. Also, the display region Ad and the peripheral region As may be included in the lower surface serving as the other main surface of the substrate 31.

Alternatively, the display region Ad and the peripheral region As may be included in the upper surface serving as one main surface of the substrate 21. At this time, the substrate 21 has the display region Ad and the peripheral region As as the regions of the upper surface of the substrate 21. The peripheral region As is a region positioned on an outer peripheral side of the substrate 21 than the display region Ad.

Figure 7:
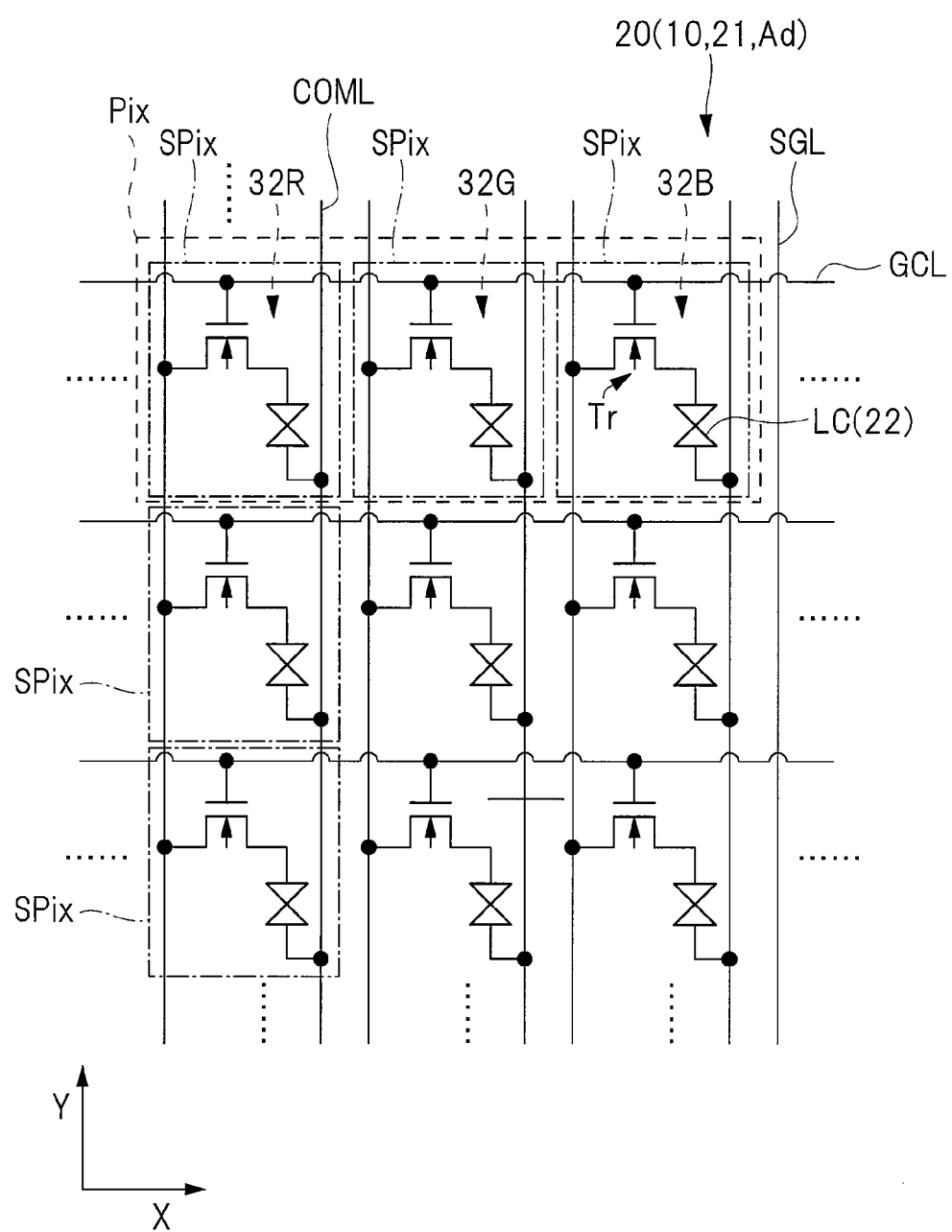
FIG. 7 is a circuit diagram illustrating the display device with a touch sensing function of the display apparatus according to the first embodiment.
Figure 8:
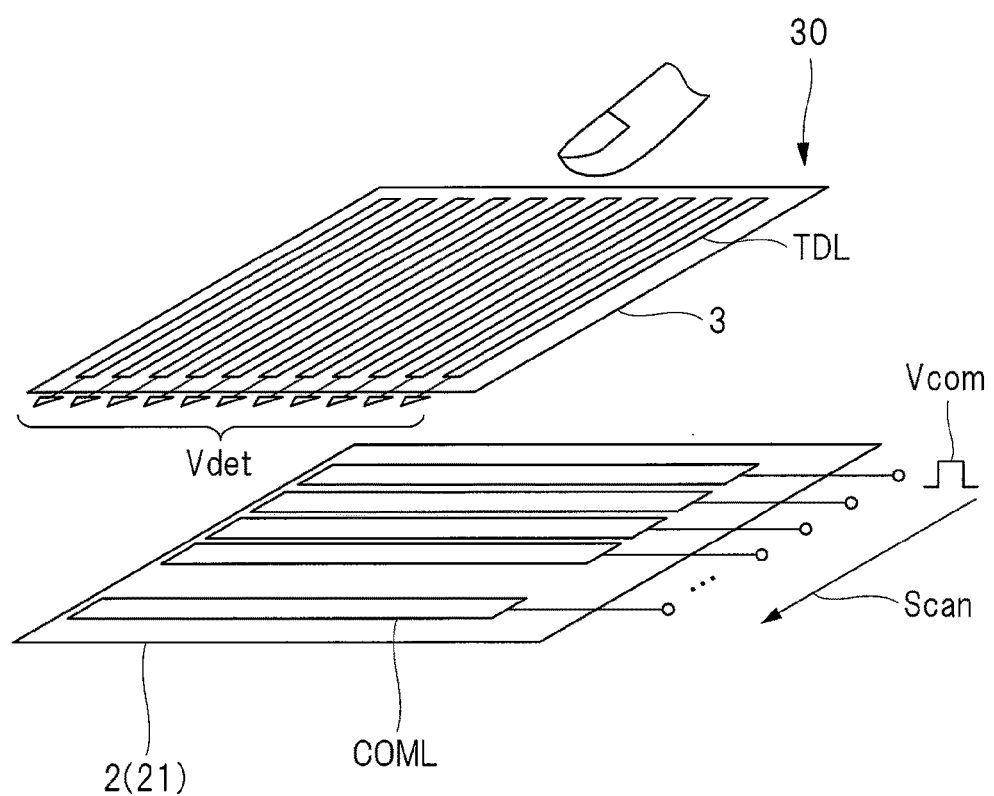
FIG. 8 is a perspective view illustrating a configuration example of a driving electrode and a sensing electrode of the display apparatus according to the first embodiment.

As illustrated in FIG. 7, in the display region Ad, a plurality of scanning lines GCL, a plurality of signal lines SGL and a plurality of TFT elements Tr which are thin film transistors (TFT) are formed on the substrate 21. Note that, in FIG. 6, the illustration of the scanning lines GCL, the signal lines SGL and the TFT elements Tr is omitted. In addition, the scanning line means a gate wiring and the signal line means a source wiring.

As illustrated in FIG. 7, the plurality of scanning lines GCL respectively extend in the X axis direction and are arrayed in the Y axis direction in the display region Ad. The plurality of signal lines SGL respectively extend in the Y axis direction and are arrayed in the X axis direction in the display region Ad. Accordingly, each of the plurality of signal lines SGL intersects with the plurality of scanning lines GCL when seen in a plan view. In this manner, sub-pixels SPix are arranged at intersections between the plurality of scanning lines GCL and the plurality of signal lines SGL which intersect with each other when seen in a plan view, and a single pixel Pix is formed from a plurality of sub-pixels SPix having different colors. More specifically, the plurality of sub-pixels SPix are provided on the upper surface of the substrate 21, and arranged in the display region Ad and arrayed in a matrix form in the X axis direction and the Y axis direction when seen in a plan view.

The TFT element Tr is formed at an intersecting portion at which each of the plurality of scanning lines GCL and each of the plurality of signal lines SGL intersect with each other when seen in a plan view. Accordingly, in the display region Ad, the plurality of TFT elements Tr are formed on the substrate 21, and the plurality of TFT elements Tr are arrayed in a matrix form in the X axis direction and the Y axis direction. More specifically, each of the plurality of sub-pixels SPix is provided with the TFT element Tr. Also, each of the plurality of sub-pixels SPix is provided with a liquid crystal element LC in addition to the TFT element Tr.

The TFT element Tr is made up of, for example, a thin film transistor such as a n-channel MOS (metal oxide semiconductor). The gate electrode of the TFT element Tr is connected to the scanning line GCL. One of the source electrode and the drain electrode of the TFT element Tr is connected to the signal line SGL. The other one of the source electrode and the drain electrode of the TFT element Tr is connected to one end of the liquid crystal element LC. One end of the liquid crystal element LC is connected to the source electrode or the drain electrode of the TFT element Tr, and the other end thereof is connected to the driving electrode COML.

As illustrated in FIG. 6, the array substrate 2 includes the substrate 21, the plurality of driving electrodes COML, an insulating film 24, and a plurality of pixel electrodes 22. The plurality of driving electrodes COML are provided on the upper surface serving as one main surface of the substrate 21 in the display region Ad when seen in a plan view. The insulating film 24 is formed on the upper surface of the substrate 21 with the inclusion of the front surfaces of each of the plurality of driving electrodes COML. In the display region Ad, a plurality of pixel electrodes 22 are formed on the insulating film 24. Accordingly, the insulating film 24 electrically insulates the driving electrodes COML and the pixel electrodes 22.

As illustrated in FIG. 7, each of the plurality of pixel electrodes 22 is formed within each of the plurality of sub-pixels SPix arrayed in a matrix form in the X axis direction and the Y axis direction in the display region Ad when seen in a plan view. Accordingly, the plurality of pixel electrodes 22 are arrayed in a matrix form in the X axis direction and the Y axis direction.

In the example illustrated in FIG. 6, each of the plurality of driving electrodes COML is formed between the substrate 21 and the pixel electrodes 22. Also, as schematically illustrated in FIG. 7, each of the plurality of driving electrodes COML is provided so as to overlap the plurality of pixel electrodes 22 when seen in a plan view. Then, by applying voltage between each of the plurality of pixel electrodes 22 and each of the plurality of driving electrodes COML so that an electric field is formed in the liquid crystal element LC provided between each of the plurality of pixel electrodes 22 and each of the plurality of driving electrodes COML, that is, in each of the plurality of sub-pixels SPix, an image is displayed in the display region Ad. At this time, a capacitance Cap is formed between the driving electrode COML and the pixel electrode 22, and the capacitance Cap functions as a retention volume.

The liquid crystal display device 20 serving as a display control unit for controlling the image display is formed of the liquid crystal element LC, the plurality of pixel electrodes 22, the driving electrode COML, the plurality of scanning lines GCL and the plurality of signal lines SGL. The liquid crystal display device 20 serving as the display control unit controls the image display in the display region Ad by controlling the voltage applied between each of the plurality of pixel electrodes 22 and each of the plurality of driving electrodes COML. The liquid crystal display device 20 serving as the display control unit is provided between the substrate 21 and the substrate 31.

Incidentally, each of the plurality of driving electrodes COML may be formed on the opposite side of the substrate 21 with the pixel electrode 22 interposed therebetween. In addition, in the example illustrated in FIG. 6, the arrangement of the driving electrodes COML and the pixel electrodes 22 is formed as the arrangement in a fringe field switching (FFS) mode as a transverse electric field mode in which the driving electrodes COML overlap the pixel electrodes 22 when seen in a plan view. However, the arrangement of the driving electrodes COML and the pixel electrodes 22 may be formed as the arrangement in an in-plane switching (IPS) mode as the transverse electric field mode in which the driving electrodes COML do not overlap the pixel electrodes 22 when seen in a plan view. Alternatively, the arrangement of the driving electrodes COML and the pixel electrodes 22 may be formed as the arrangement in a twisted nematic (TN) mode, a vertical alignment (VA) mode or the like as a vertical electric field mode.

The liquid crystal layer 6 is provided to modulate light passing therethrough in accordance with the state of the electric field, and a liquid crystal layer adapted to a transverse electric field mode such as a FFS mode or an IPS mode described above is used. More specifically, a liquid crystal display device of a transverse electric field mode such as the FFS mode or the IPS mode is used as the liquid crystal display device 20. Alternatively, as described above, a liquid crystal display device adapted to a vertical electric field mode such as the TN mode or the VA mode may be used. Note that an alignment film may be provided between the liquid crystal layer 6 and the array substrate 2 and between the liquid crystal layer 6 and the opposing substrate 3 illustrated in FIG. 6, respectively.

As illustrated in FIG. 7, the plurality of sub-pixels SPix arrayed in the X axis direction, that is, the plurality of sub-pixels SPix which belong to the same row of the liquid crystal display device 20 are connected to each other by the scanning line GCL. The scanning lines GCL are connected to the gate driver 12 (see FIG. 1) and scanning signals Vscan (see FIG. 1) are supplied thereto from the gate driver 12. Also, the plurality of sub-pixels SPix arrayed in the Y axis direction, that is, the plurality of sub-pixels SPix which belong to the same column of the liquid crystal display device 20 are connected to each other by the signal line SGL. The signal lines SGL are connected to the source driver 13 (see FIG. 1) and pixel signals Vpix (see FIG. 1) are supplied thereto from the source driver 13. Further, the plurality of sub-pixels SPix arrayed in the X axis direction, that is, the plurality of sub-pixels SPix which belong to the same row of the liquid crystal display device 20 are connected to each other by the driving electrode COML.

The driving electrodes COML are connected to the driving electrode driver 14 (see FIG. 5) and driving signals Vcom (see FIG. 1) are supplied thereto from the driving electrode driver 14. In other words, in the example illustrated in FIG. 7, the plurality of sub-pixels SPix which belong to the same row share one driving electrode COML. The plurality of driving electrodes COML respectively extend in the X axis direction and are arrayed in the Y axis direction in the display region Ad. As described above, since the plurality of scanning lines GCL respectively extend in the X axis direction and are arrayed in the Y axis direction in the display region Ad, the direction in which each of the plurality of driving electrodes COML extends is parallel to the direction in which each of the plurality of scanning lines GCL extends. However, the direction in which each of the plurality of driving electrodes COML extends is not limited, and for example, the direction in which each of the plurality of driving electrodes COML extends may be a direction which is parallel to the direction in which each of the plurality of signal lines SGL extends.

The gate driver 12 illustrated in FIG. 1 sequentially selects one row, namely, one horizontal line from among the sub-pixels SPix which are arrayed in a matrix form in the liquid crystal display device 20 as an object of display driving by applying the scanning signals Vscan to the gate electrode of the TFT element Tr of each of the sub-pixels SPix via the scanning lines GCL illustrated in FIG. 7. The source driver 13 illustrated in FIG. 1 supplies the pixel signals Vpix to each of the plurality of sub-pixels SPix which constitute one horizontal line sequentially selected by the gate driver 12 via the signal lines SGL illustrated in FIG. 7. Then, displays in accordance with the supplied pixel signals Vpix are made at the plurality of sub-pixels SPix constituting one horizontal line.

The driving electrode driver 14 illustrated in FIG. 1 applies driving signals Vcom to drive the driving electrodes COML for each of the sensing blocks corresponding to one or a plurality of driving electrodes COML.

In the liquid crystal display device 20, the gate driver 12 is driven so as to sequentially scan the scanning lines GCL on time division basis, thereby sequentially selecting the sub-pixels SPix for each horizontal line. Also, in the liquid crystal display device 20, the source driver 13 supplies pixel signals Vpix to the sub-pixels SPix which belong to one horizontal line, so that displays are made for each horizontal line. In performing this display operation, the driving electrode driver 14 applies driving signals Vcom to a sensing block including the driving electrodes COML corresponding to the one horizontal line.

The driving electrodes COML of the display apparatus 1 according to the present first embodiment operate as driving electrodes of the liquid crystal display device 20 and operate also as driving electrodes of the touch sensing device 30. FIG. 8 is a perspective view illustrating one configuration example of the driving electrodes and the sensing electrodes of the display apparatus according to the present first embodiment.

The touch sensing device 30 includes a plurality of driving electrodes COML provided on the array substrate 2 and a plurality of sensing electrodes TDL provided on the opposing substrate 3. The plurality of sensing electrodes TDL respectively extend in the direction which intersects with the direction in which each of the plurality of driving electrodes COML extends when seen in a plan view. In other words, the plurality of sensing electrodes TDL are arrayed at intervals so as to respectively intersect with the plurality of driving electrodes COML when seen in a plan view. Also, each of the plurality of sensing electrodes TDL faces each of the plurality of driving electrodes COML in a direction which is perpendicular to the upper surface of the substrate 21 included in the array substrate 2. In other words, each of the plurality of driving electrodes COML is provided so as to overlap each of the plurality of sensing electrodes TDL when seen in a plan view. Also, each of the plurality of sensing electrodes TDL is respectively connected to the touch sensing signal amplifying unit 42 (see FIG. 1) of the touch sensing unit 40.

Electrostatic capacitance is generated at intersecting portions between each of the plurality of driving electrodes COML and each of the plurality of sensing electrodes TDL seen in a plan view. Thus, input positions are sensed based on the electrostatic capacitance between each of the plurality of driving electrodes COML and each of the plurality of sensing electrodes TDL. More specifically, by the electrode substrate like the substrate 31 on which the sensing electrodes TDL are formed (see FIG. 6) and the driving electrodes COML, a sensing unit for sensing the input position, that is, an input device is formed.

With the configuration described above, when performing the touch sensing operation in the touch sensing device 30, one sensing block corresponding to one or a plurality of driving electrodes COML in a scanning direction Scan is sequentially selected by the driving electrode driver 14. Then, in the selected sensing block, driving signals Vcom for measuring the electrostatic capacitance between the driving electrodes COML and the sensing electrodes TDL are input to the driving electrodes COML, and sensing signals Vdet for sensing input positions are output from the sensing electrodes TDL. In this manner, the touch sensing device 30 is configured so as to perform the touch sensing for each sensing block. More specifically, one sensing block corresponds to the driving electrode E1 of the above-described principle of touch sensing, and the sensing electrode TDL corresponds to the sensing electrode E2.

Note that a range of the sensing block at the display operation and a range of the sensing block at the touch sensing operation may be equal to or different from each other.

As illustrated in FIG. 8, the plurality of driving electrodes COML and the plurality of sensing electrodes TDL which intersect with each other when seen in a plan view form an electrostatic capacitive touch sensor having a matrix arrangement. Accordingly, by scanning the entire touch sensing surface of the touch sensing device 30, positions which have been contacted or approached by a finger or the like can be sensed.

Note that, as the touch sensing device 30, it is not limited to the touch sensing device 30 of the mutual capacitance method provided with the driving electrodes and the sensing electrodes. For example, as described later with reference to FIG. 33 and FIG. 34, the touch sensing device 30 of the self-capacitance method provided with only the sensing electrodes may be used as the touch sensing device 30. In the self-capacitance method, when the sensing electrodes TDL are disconnected from the sensing circuit and are electrically connected to a power source, a charge amount is stored in the sensing electrodes TDL. Next, when the sensing electrodes TDL are disconnected from the power source and are electrically connected to the sensing circuit, the charge amount flowing to the sensing circuit is sensed. More specifically, the sensing unit senses the input position based on the electrostatic capacitance of each of the plurality of sensing electrodes TDL.

Here, in the case where a finger is in contact with or approaches the sensing electrode TDL, the electrostatic capacitance of the sensing electrode TDL varies due to the capacitance of the finger, and the charge amount flowing to the sensing circuit varies when the sensing electrode TDL is connected to the sensing circuit. Accordingly, it is possible to determine whether the finger is in contact with or approaches the sensing electrode TDL by measuring the flowing charge amount by the sensing circuit and sensing the variation of the electrostatic capacitance of the sensing electrode TDL.

As illustrated in FIGS. 5 and 6, the opposing substrate 3 has the substrate 31, a color filter 32, a conductor pattern CB1 and the protective layer 33.

As described above, the substrate 31 has the upper surface serving as the main surface and the lower surface serving as the main surface on an opposite side of the upper surface. The color filter 32 is formed on the lower surface of the substrate 31.

The conductor pattern CB1 is formed on the upper surface of the substrate 31. The conductor pattern CB1 includes the plurality of sensing electrodes TDL and the plurality of wiring parts WTP. The plurality of sensing electrodes TDL are the sensing electrodes of the touch sensing device 30, and are formed on the upper surface of the substrate 31. Each of the plurality of wiring parts WTP includes the lead wiring WRT and the electrode terminal ET1. The lead wiring WRT and the electrode terminal ET1 are formed on the upper surface of the substrate 31. The protective layer 33 is formed on the upper surface of the substrate 31 so as to cover the conductor pattern CB1. Note that shapes of the conductor pattern CB1 and the protective layer 33 will be described later.

For example, color filters colored in three colors of red (R), green (G) and blue (B) are arrayed in the X axis direction as the color filter 32. In this manner, as illustrated in FIG. 7, a plurality of sub-pixels SPix corresponding to each of color regions 32R, 32G and 32B of the three colors of R, G and B are formed, and one pixel Pix is formed by one set of the plurality of sub-pixels SPix each corresponding to the color regions 32R, 32G and 32B. The pixels Pix are arrayed in a matrix form in the direction in which the scanning lines GCL extend (X axis direction) and the direction in which the signal lines SGL extend (Y axis direction). Further, the region in which the pixels Pix are arrayed in a matrix form is the above-described display region Ad. Note that a dummy region in which a dummy pixel is provided may be provided in a periphery of the display region Ad.

The combination of colors of the color filter 32 may be another combination including a plurality of colors other than R, G and B. It is also possible to provide no color filter 32. Alternatively, one pixel Pix may include a sub-pixel SPix which is not provided with the color filter 32, that is, a white-colored sub-pixel SPix. In addition, the color filter may be provided on the array substrate 2 by color filter on array (COA) technique.

<Configuration of Electrode Substrate>

Next, a configuration of the electrode substrate will be described with reference to FIGS. 5, 6, 9 and 10. Note that, in the description of the first embodiment, an electrode substrate used as an opposing substrate on which sensing electrodes are formed in a display device with an input device is taken as an example.

Figure 9:
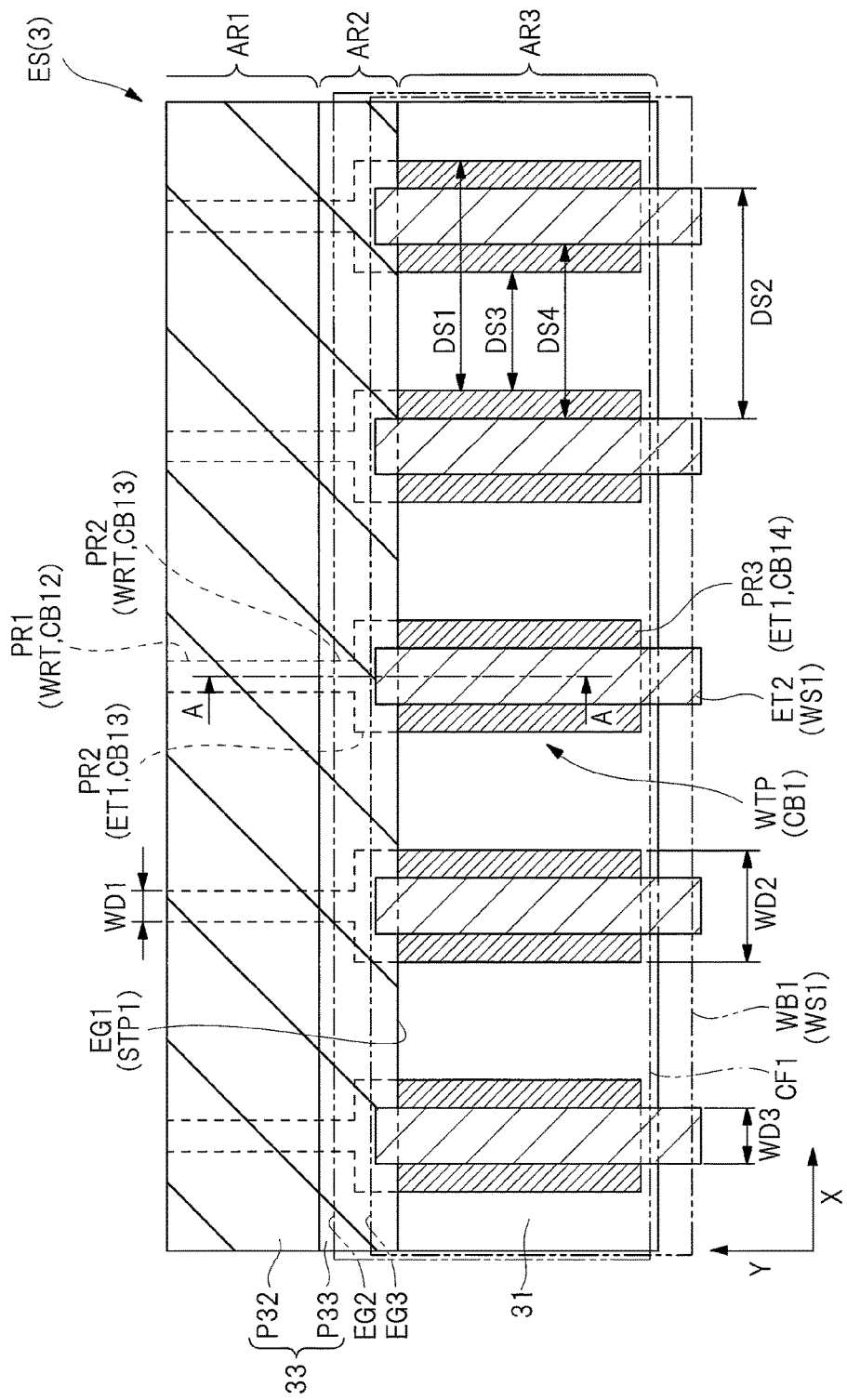
FIG. 9 is a plan view illustrating an electrode substrate according to the first embodiment.
Figure 10:
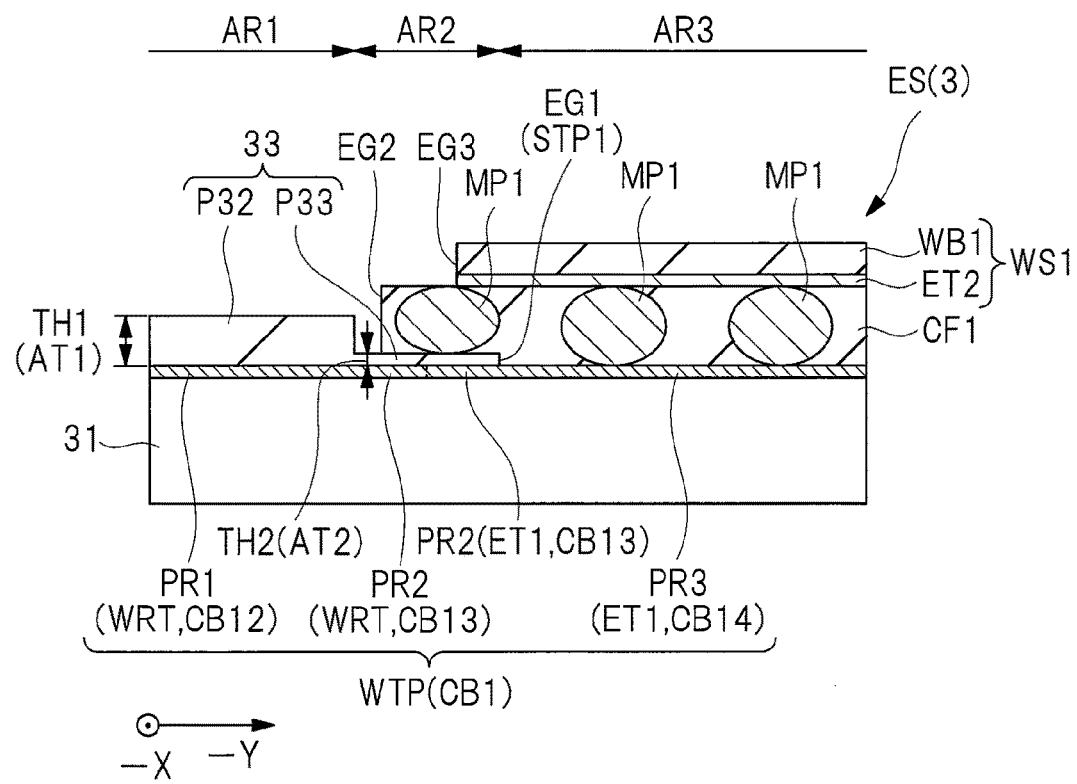
FIG. 10 is a cross-sectional view illustrating the electrode substrate according to the first embodiment.

FIG. 9 is a plan view illustrating the electrode substrate according to the first embodiment. FIG. 10 is a cross-sectional view illustrating the electrode substrate according to the first embodiment. The cross-sectional view of FIG. 10 is taken along the line A-A of FIG. 9. Note that, in FIG. 9, a state in which the wiring substrate WS1 and the anisotropic conductive film CF1 are eliminated is illustrated and the outer periphery of the wiring substrate WS1 and the anisotropic conductive film CF1 is represented by two-dot chain lines.

An electrode substrate ES serving as the opposing substrate 3 includes the substrate 31, the conductor pattern CB1 and the protective layer 33. The substrate 31 has the display region Ad and the peripheral region As (see FIG. 5) as the region of the upper surface of the substrate 31. The peripheral region As is a region on the outer peripheral side of the substrate 31 than the display region Ad. The peripheral region As includes a region AR1 of the upper surface of the substrate 31, a region AR2 of the upper surface of the substrate 31 and a region AR3 of the upper surface of the substrate 31. The region AR2 is a region on the outer peripheral side of the substrate 31 than the region AR1, and the region AR3 is a region on the outer peripheral side of the substrate 31 than the region AR2. Hereinafter, two directions which mutually intersect, preferably orthogonally, with each other within the upper surface serving as the main surface of the substrate 31 are defined to be an X axis direction and a Y axis direction.

As described above, the expression "when seen in a plan view" in the present specification indicates the case in which components are seen from a direction perpendicular to the upper surface serving as the main surface of the substrate 21 (see FIG. 6) or the substrate 31.

In addition, various substrates, for example, a transparent glass substrate and a film made of resin may be used as the substrate 31.

The conductor pattern CB1 includes the plurality of sensing electrodes TDL and the plurality of wiring parts WTP. The conductor pattern CB1 is made of a conductive film.

Each of the plurality of sensing electrodes TDL is the sensing electrode of the touch sensing device 30. Each of the plurality of sensing electrodes TDL is formed on the upper surface of the substrate 31 in the display region Ad. Each of the plurality of sensing electrodes TDL is made of a conductive film. In the conductor pattern CB1, a conductor pattern formed of the plurality of sensing electrodes TDL is defined as a conductor pattern CB11.

Each of the plurality of sensing electrodes TDL may include a plurality of conductive lines arrayed in the X axis direction. At this time, each of the plurality of conductive lines may have a zigzag shape extending in the Y axis direction as a whole while being alternately bent in the opposite directions when seen in a plan view. Alternatively, each of the plurality of sensing electrodes TDL may have a mesh shape formed by the plurality of conductive lines when seen in a plan view.

The plurality of wiring parts WTP are the electrodes formed so as to correspond to each of the plurality of sensing electrodes TDL, and are electrically connected to each of the plurality of sensing electrodes TDL. Each of the plurality of wiring parts WTP is formed on the upper surface of the substrate 31 in the peripheral region As. Each of the plurality of wiring parts WTP is made of a conductive film. Each of the plurality of wiring parts WTP is continuously formed on the upper surface of the substrate 31 from the region AR1 of the upper surface of the substrate 31 via the region AR2 of the upper surface of the substrate 31 to the region AR3 of the upper surface of the substrate 31 when seen in a plan view.

Preferably, the region AR1, the region AR2 and the region AR3 are arranged in this order in the Y axis direction. Then, the plurality of wiring parts WTP extend in the Y axis direction and are arrayed in the X axis direction when seen in a plan view.

Each of the plurality of wiring parts WTP includes the lead wiring WRT and the electrode terminal ET1. Accordingly, the lead wiring WRT and the electrode terminal ET1 are formed on the upper surface of the substrate 31.

A portion of the wiring parts WTP formed in the region AR1 is defined as a portion PR1. The portion PR1 is apart of the lead wiring WRT. In addition, a portion of the wiring parts WTP formed in the region AR2 is defined as a portion PR2. The portion PR2 includes the other part of the lead wiring WRT and apart of the electrode terminal ET1. Also, a portion of the wiring parts WTP formed in the region AR3 is defined as a portion PR3. The portion PR3 is the other part of the electrode terminal ET1 and is electrically connected to the wiring substrate WS1. In the conductor pattern CB1, a conductor pattern formed of the portion PR1 is defined as a conductor pattern CB12, a conductor pattern formed of the portion PR2 is defined as a conductor pattern CB13, and a conductor pattern formed of the portion PR3 is defined as a conductor pattern CB14.

Preferably, the sensing electrode TDL and the wiring part WTP are formed of a single-layered or multi-layered conductive film including a metal layer or an alloy layer made of one or more metals selected from a group including aluminum (Al), copper (Cu), silver (Ag), molybdenum (Mo), titanium (Ti), chrome (Cr) and tungsten (W), an oxide film and a nitride film. In this manner, conductivity of the sensing electrode TDL and the wiring part WTP can be improved and thus the sensitivity or sensing speed of the sensing electrode TDL can be improved. In addition, it is also possible to blacken the surface by providing an oxide film or a nitride film. Black resin such as a color filter material may be used as a blackening layer.

Note that, in the example illustrated in FIG. 9, a planer shape of the electrode terminal ET1 is a rectangular shape, but the planer shape of the electrode terminal ET1 may be various shapes, for example, a circular shape and the like.

The protective layer 33 is formed so as to cover the conductor pattern CB1 made up of the plurality of sensing electrodes TDL and the plurality of wiring parts WTP in the display region Ad, the region AR1 and the region AR2. In the protective layer 33, a portion formed in the display region Ad is defined as a portion P31, a portion formed in the region AR1 is defined as a portion P32, and a portion formed in the region AR2 is defined as a portion P33.

The protective layer 33 protects the sensing electrodes TDL and the wiring parts TWP made of the conductive film by preventing moisture in the air and acidic organic substance from contacting the sensing electrodes TDL and the wiring parts TWP so that the sensing electrodes TDL and the wiring parts WTP are not corroded. As the protective layer 33, for example, a resin film made of resin containing one or both of ultraviolet (UV) setting resin and thermosetting resin such as acryl resin, epoxy resin, polyimide resin, or the like may be used. Note that the protective layer 33 has also a function of flattening the upper surface of the substrate 31 on which the sensing electrodes TDL and the wiring parts WTP are formed.

In the wiring part WTP, the portion PR1 and the portion PR2 formed in the region AR1 and the region AR2 are covered with the protective layer 33. However, in the wiring part WTP, the portion PR3 formed in the region AR3 is exposed from the protective layer 33. Accordingly, in the region AR3, a side surface of the portion PR3 of the wiring part WTP and an edge portion of the portion PR3 of the wiring part WTP on an opposite side to the region AR1 side are exposed from the protective layer 33. More specifically, a side surface of the wiring part WTP of the portion formed in the region AR3 is exposed from the protective layer 33.

At this time, an average film thickness AT2 of the portion P33 of the protective layer 33 is smaller than an average film thickness AT1 of the portion P32 of the protective layer 33. More specifically, a film thickness TH2 of a portion formed on the portion PR2 of the wiring part WTP in the portion P33 of the protective layer 33 is smaller than a film thickness TH1 of a portion formed on the portion PR1 of the wiring part WTP in the portion P32 of the protective layer 33.

In this case, a height of a stepped portion STP1 of an edge portion EG1 of the protective layer 33 on the region AR3 side decreases in comparison with the case where the average film thickness AT2 of the portion P33 of the protective layer 33 is equal to the average film thickness AT1 of the portion P32 of the protective layer 33. Thus, when the wiring substrate WS1 disposed astride the stepped portion STP1 is pressed to the substrate 31 via the anisotropic conductive film CF1 interposed therebetween, a degree that a plurality of metal particles MP1 inside the anisotropic conductive film CF1 are crushed to be in contact with each other in the thickness direction of the anisotropic conductive film CF1 becomes substantially uniform in a plane of the anisotropic conductive film CF1. Accordingly, it is possible to electrically stably connect the portion PR3 of the wiring part WTP, that is, the electrode terminal ET1 and the electrode terminal ET2.

Note that, in this specification, the average film thickness AT1 of the portion P32 of the protective layer 33 formed in the region AR1 means difference between an average height position of the upper surface of the conductor pattern CB1 in the region AR1, that is, the conductor pattern CB12 and an average height position of the upper surface of the portion P32 of the protective layer 33. In addition, the average film thickness AT2 of the portion P33 of the protective layer 33 formed in the region AR2 means difference between an average height position of the upper surface of the conductor pattern CB1 in the region AR2, that is, the conductor pattern CB13 and an average height position of the upper surface of the portion P33 of the protective layer 33.

An average film thickness of the portion P31 of the protective layer 33 and the average film thickness AT1 of the portion P32 of the protective layer 33 can be made larger than a film thickness of the conductor pattern CB1. For example, the film thickness of the conductor pattern CB1 can be made to be 10 to 2000 nm, and the average film thickness of the portion P31 of the protective layer 33 and the average film thickness AT1 of the portion P32 of the protective layer 33 can be made to be 500 to 10000 nm.

Here, it is assumed that the X axis direction and the Y axis direction are orthogonal to each other, a width of the portion PR1, that is, the lead wiring WRT in the X axis direction is defined as a width WD1, and a width of the portion PR3, that is, the electrode terminal ET1 in the X axis direction is defined as a width WD2. At this time, preferably, the width WD2 is larger than the width WD1. In this manner, the width of the electrode terminal ET1 in the X axis direction can be made larger than the width of the lead wiring WRT in the X axis direction. Thus, it is possible to increase the area of the portion at which the electrode terminal ET1 and the electrode terminal ET2 are in contact with each other.

The width WD2 of the electrode terminal ET1 in the X axis direction is, for example, 50 to 1500 μm, or preferably 75 to 1000 μm. In addition, an array pitch DS1 of the electrode terminal ET1 in the X axis direction is, for example, 100 to 2000 μm, or preferably 150 to 1500 μm, and is larger than the width WD2. Since the array pitch DS1 is within such a range, it is possible to prevent or suppress two electrode terminals ET1 adjacent to each other from being short-circuited by the anisotropic conductive film CF1 described later.

A shape accuracy of the pattern formed by the method of applying a raw material liquid discharged as droplets, for example, an ink jet method or an electric field jet method is lower than a shape accuracy of the pattern formed by a method of patterning an insulating film by, for example, photolithography and etching. Thus, in the case where the raw material liquid is applied by discharging it as droplets, there is a disadvantage that it is not possible to pattern the protective layer 33 so that a central portion of the portion PR3 of the wiring part WTP is exposed from the protective layer 33 and a peripheral portion of the portion PR3 of the wiring part WTP is covered with the protective layer 33. However, as described above, in the case where the array pitch DS1 is 100 to 2000 μm, the advantage that the average film thickness AT2 of the portion P33 of the protective layer 33 can be easily made smaller than the average film thickness AT1 of the portion P32 of the protective layer 33 by applying the raw material liquid discharged as droplets significantly exceeds the disadvantage of the low shape accuracy of the pattern. Accordingly, the effect of being able to electrically stably connect the electrode terminal ET1 and the electrode terminal ET2 becomes larger in comparison with the case where the array pitch DS1 is less than 100 μm or the case where the array pitch DS1 exceeds 2000 μm.

In addition, the electrode substrate ES serving as the opposing substrate 3 may have the anisotropic conductive film (ACF) CF1 and the wiring substrate WS1. The anisotropic conductive film CF1 is disposed so as to cover the wiring part WTP in the region AR2 and the region AR3. The wiring substrate WS1 is disposed on the anisotropic conductive film CF1. For example, a flexible printed wiring board referred to also as a flexible printed circuit (FPC) substrate may be used as the wiring substrate WS1. Hereinafter, an example in which the FPC substrate is used as the wiring substrate WS1 will be described.

The wiring substrate WS1 includes a base WB1 and a plurality of electrode terminals ET2. The plurality of electrode terminals ET2 are formed on a lower surface serving as a main surface of the base WB1. The plurality of electrode terminals ET2 are provided so as to correspond to the portion PR3 of each of the plurality of wiring parts WTP. Each of the plurality of electrode terminals ET2 faces the portion PR3 of each of the plurality of wiring parts WTP via the anisotropic conductive film CF1 interposed therebetween.

A width WD3 of the electrode terminal ET2 in the X axis direction is, for example, 50 to 1500 µm, or preferably 75 to 1000 µm. In addition, an array pitch DS2 of the electrode terminal ET2 in the X axis direction is, for example, 100 to 2000 µm, or preferably 150 to 1500 µm, and is larger than the width WD3. Since the array pitch DS2 is within such a range, it is possible to prevent or suppress two electrode terminals ET2 adjacent to each other from being short-circuited by the anisotropic conductive film CF1. Note that some of the plurality of electrode terminals ET1 or some of the plurality of electrode terminals ET2 may be arranged as dummy electrode terminals. Further, the plurality of electrode terminals ET1 and the plurality of electrode terminals ET2 may be arranged so that the array pitch DS2 of the plurality of electrode terminals ET2 is 1/integer such as ½ or an integral multiple such as once and twice with respect to the array pitch DS1 of the plurality of electrode terminals ET1.

The anisotropic conductive film CF1 is a film obtained by molding a thermosetting resin mixed with the fine metal particles MP1 having conductivity into a film shape. The wiring substrate WS1 is pressed to the substrate 31 while performing, for example, heat treatment in a state in which the anisotropic conductive film CF1 is sandwiched between the portion PR3 of the wiring part WTP, that is, the electrode terminal ET1 and the electrode terminal ET2. In this manner, the metal particles MP1 inside the anisotropic conductive film CF1 are in contact with each other in the thickness direction of the anisotropic conductive film CF1, so that a conductive path is formed in the thickness direction of the anisotropic conductive film CF1. Then, the portion PR3 of the wiring part WTP, that is, the electrode terminal ET1 and the electrode terminal ET2 facing each other are electrically connected to each other via the anisotropic conductive film CF1 interposed therebetween.

Note that, in FIG. 10, the case where a diameter of the metal particles MP1 is substantially equal to a film thickness of the anisotropic conductive film CF1 is illustrated for easy understanding. However, the diameter of the metal particles MP1 may be smaller than the film thickness of the anisotropic conductive film CF1, and in this case, the plurality of metal particles MP1 are in contact with each other in the thickness direction of the anisotropic conductive film CF1, so that the conductive path is formed in the thickness direction of the anisotropic conductive film CF1.

In addition, preferably, a distance DS3 between facing side surfaces of two electrode terminals ET1 adjacent to each other is five times or more of an average value of the diameter of the metal particles MP1 contained in the anisotropic conductive film. CF1, that is, an average particle diameter. In this manner, it is possible to prevent or suppress the two electrode terminals ET1 adjacent to each other from being short-circuited by the anisotropic conductive film CF1.

Alternatively, preferably, a distance DS4 between facing side surfaces of two electrode terminals ET2 adjacent to each other is five times or more of an average value of the diameter of the metal particles MP1 contained in the anisotropic conductive film CF1, that is, the average particle diameter. In this manner, it is possible to prevent or suppress the two electrode terminals ET2 adjacent to each other from being short-circuited by the anisotropic conductive film CF1.

Preferably, an edge portion EG2 of the anisotropic conductive film CF1 on the region AR1 side and an edge portion EG3 of the wiring substrate WS1 on the region AR1 side are arranged on the protective layer 33. Thus, any portion of the portion PR2 of the wiring part WTP is covered with any one of the protective layer 33 and the anisotropic conductive film CF1 and it is possible to prevent the moisture in the air from being in contact with any portion of the portion PR2 of the wiring part WTP, so that it is possible to reliably protect the wiring part WTP made of the conductive film from corrosion.

More preferably, the edge portion EG3 of the wiring substrate WS1 on the region AR1 side is arranged on the portion P33 of the protective layer 33 via the anisotropic conductive film CF1 interposed therebetween. In this manner, the wiring substrate WS1 does not overlap the portion P32 having the average film thickness AT1 larger than the average film thickness AT2 of the portion P33 in the protective layer 33 when seen in a plan view. Thus, when the wiring substrate WS1 disposed astride the stepped portion STP1 is pressed to the substrate 31 via the anisotropic conductive film CF1 interposed therebetween, the ease of contact that a plurality of metal particles MP1 inside the anisotropic conductive film CF1 are crushed to be in contact with each other in the thickness direction of the anisotropic conductive film CF1 becomes substantially uniform in the plane of the anisotropic conductive film CF1. Accordingly, it is possible to electrically stably connect the electrode terminal ET1 and the electrode terminal ET2.

<Method of Manufacturing Electrode Substrate>

Next, a method of manufacturing the electrode substrate will be described with reference to FIGS. 11 to 20.

Figure 18:
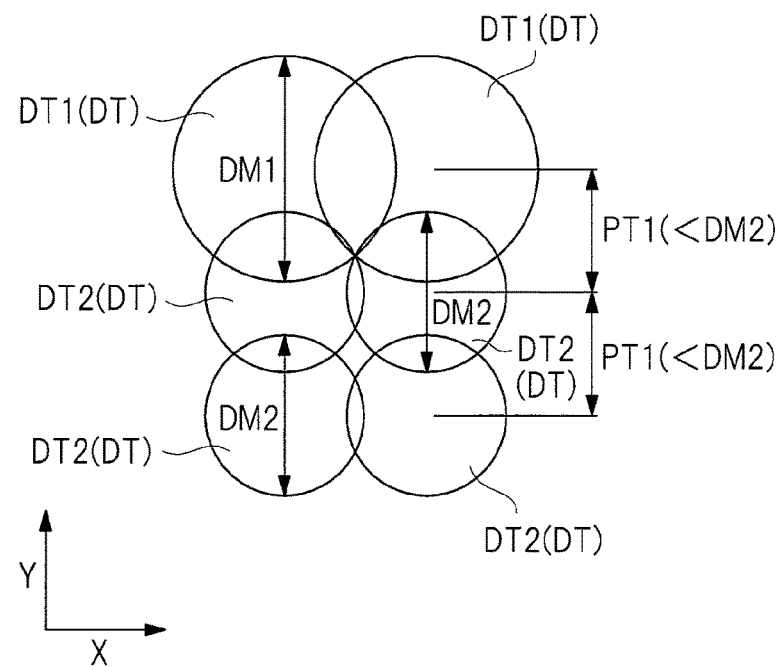
FIG. 18 is a diagram illustrating an arrangement of dots formed by depositing droplets.
Figure 19:
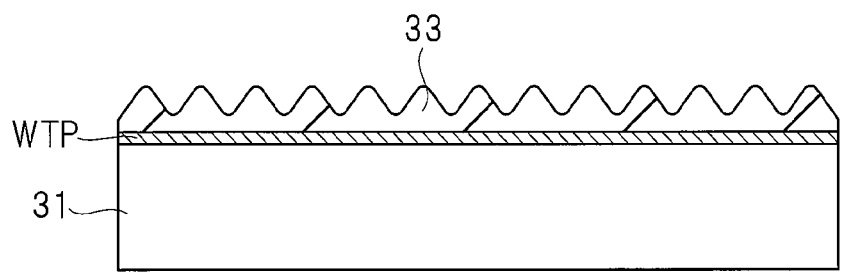
FIG. 19 is a cross-sectional view illustrating an example of a protective layer having irregularities on an upper surface.

FIGS. 11 to 13 and 20 are cross-sectional views during a manufacturing process of the electrode substrate according to the first embodiment. FIG. 14 is a perspective view during the manufacturing process of the electrode substrate according to the first embodiment. FIGS. 15 to 18 are diagrams illustrating arrangement of dots formed by depositing droplets. FIG. 19 is a cross-sectional view illustrating an example of the protective layer having irregularities on the upper surface.

Figure 11:
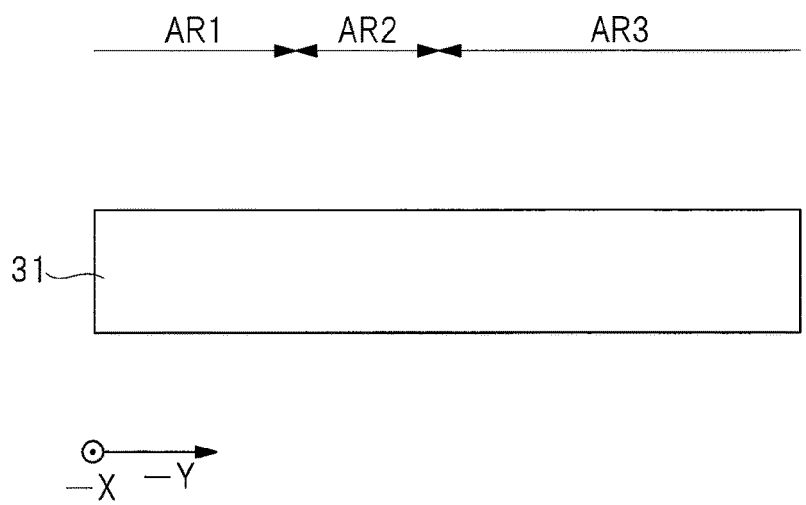
FIG. 11 is a cross-sectional view during a manufacturing process of the electrode substrate according to the first embodiment.

First, as illustrated in FIG. 11, the substrate 31 is prepared. The substrate 31 has the display region Ad and the peripheral region As (see FIG. 5) as the region of the upper surface serving as the main surface of the substrate 31. The peripheral region As is the region on the outer peripheral side of the substrate 31 than the display region Ad. The peripheral region As includes the region AR1 of the upper surface of the substrate 31, the region AR2 of the upper surface of the substrate 31 and the region AR3 of the upper surface of the substrate 31. The region AR2 is the region on the outer peripheral side of the substrate 31 than the region AR1, and the region AR3 is the region on the outer peripheral side of the substrate 31 than the region AR2. Preferably, as illustrated in FIG. 9, the region AR1, the region AR2 and the region AR3 are arranged in this order in the Y axis direction when seen in a plan view.

As described above, various substrates, for example, a transparent glass substrate and a film made of resin may be used as the substrate 31.

Figure 12:
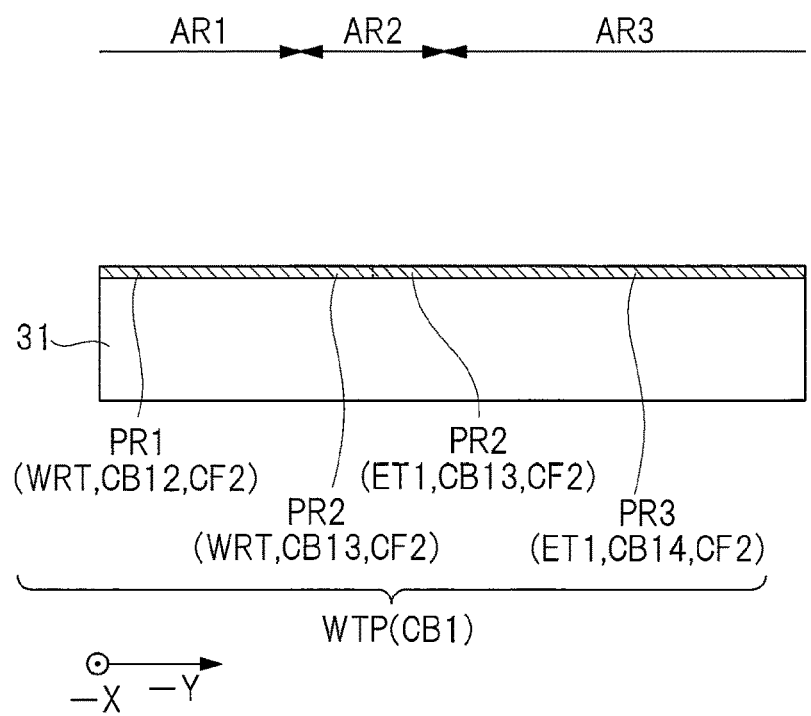
FIG. 12 is a cross-sectional view during the manufacturing process of the electrode substrate according to the first embodiment.

Next, as illustrated in FIG. 12, the conductor pattern CB1 is formed. In this step of forming the conductor pattern CB1, the conductor pattern CB1 made up of the plurality of sensing electrodes TDL and the plurality of wiring parts WTP is formed in the display region Ad (see FIG. 5), the region AR1, the region AR2 and the region AR3 on the upper surface of the substrate 31.

In this step of forming the conductor pattern CB1, first, a conductive film CF2 is formed on the entire upper surface of the substrate 31. In this step of forming the conductive film CF2, the conductive film made of, for example, a metal film can be formed by, for example, a sputtering method or a chemical vapor deposition (CVD) method. Preferably, a single-layered or multi-layered conductive film including a metal layer or an alloy layer made of one or more metals selected from a group including aluminum (Al), copper (Cu), silver (Ag), molybdenum (Mo), chrome (Cr) and tungsten (W) can be formed as the conductive film CF2.

Note that, after performing the step of forming the conductive film CF2 and before performing a patterning step described later, a surface processing may be performed to the substrate 31 on which the conductive film CF2 has been formed. In this manner, a surface tension on the upper surface of the conductive film CF2 and a surface tension on the upper surface of the substrate 31 can be made substantially equal to each other, and wettability of the raw material liquid to be applied by the method of applying the material discharged as droplets can be made uniform. As such a surface processing, a surface processing by UV light, a surface processing by atmospheric pressure (AP) plasma, or a surface processing by hexamethyldisiloxane (HMDS) can be performed.

Next, the conductive film CF2 is patterned. In this step of patterning the conductive film CF2, for example, the conductive film CF2 can be patterned by using photolithography and etching. In this manner, the plurality of sensing electrodes TDL made of the conductive film CF2 are formed in the display region Ad (see FIG. 6). In addition, as illustrated in FIG. 12, the plurality of wiring parts WTP made of the conductive film CF2 are formed in the region AR1, the region AR2 and the region AR3. In this manner, the conductor pattern CB1 made up of the plurality of sensing electrodes TDL and the plurality of wiring parts WTP is formed.

Each of the plurality of sensing electrodes TDL is formed on the upper surface of the substrate 31 in the display region Ad. For example, the plurality of sensing electrodes TDL extend in the Y axis direction and are arrayed in the X axis direction when seen in a plan view (see FIG. 5). Meanwhile, each of the plurality of wiring parts WTP is continuously formed on the upper surface of the substrate 31 from the region AR1 via the region AR2 to the region AR3. Preferably, the plurality of wiring parts WTP extend in the Y axis direction and are arrayed in the X axis direction when seen in a plan view (see FIG. 9).

The portion of the wiring part WTP formed in the region AR1 is defined as the portion PR1. The portion PR1 is a part of the lead wiring WRT. Also, the portion of the wiring part WTP formed in the region AR2 is defined as the portion PR2. The portion PR2 includes the other part of the lead wiring WRT and a part of the electrode terminal ET1. Further, the portion of the wiring part WTP formed in the region AR3 is defined as the portion PR3. The portion PR3 is the other part of the electrode terminal ET1 and is electrically connected to the wiring substrate WS1. In the conductor pattern CB1, the conductor pattern formed of the portion PR1 is defined as the conductor pattern CB12, the conductor pattern formed of the portion PR2 is defined as the conductor pattern CB13, and the conductor pattern formed of the portion PR3 is defined as the conductor pattern CB14.

Figure 13:
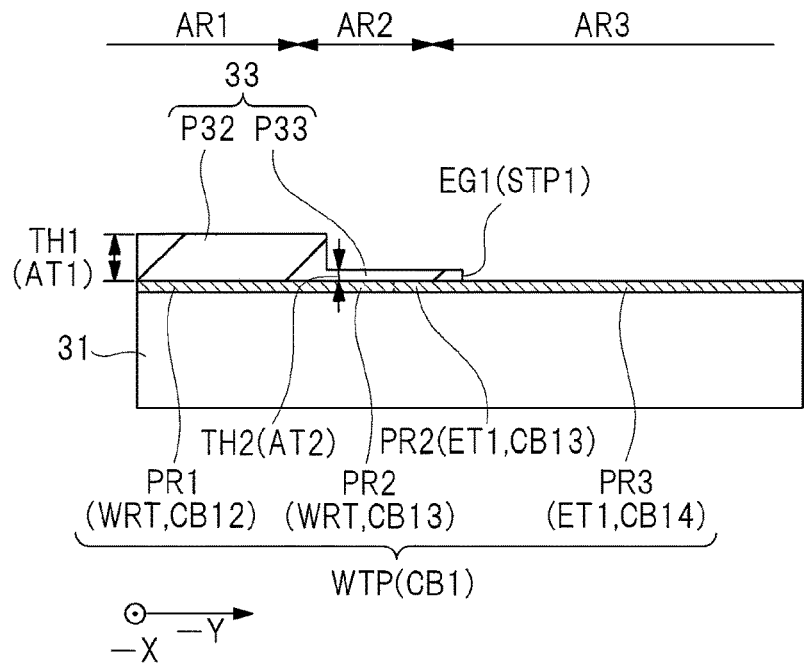
FIG. 13 is a cross-sectional view during the manufacturing process of the electrode substrate according to the first embodiment.
Figure 14:
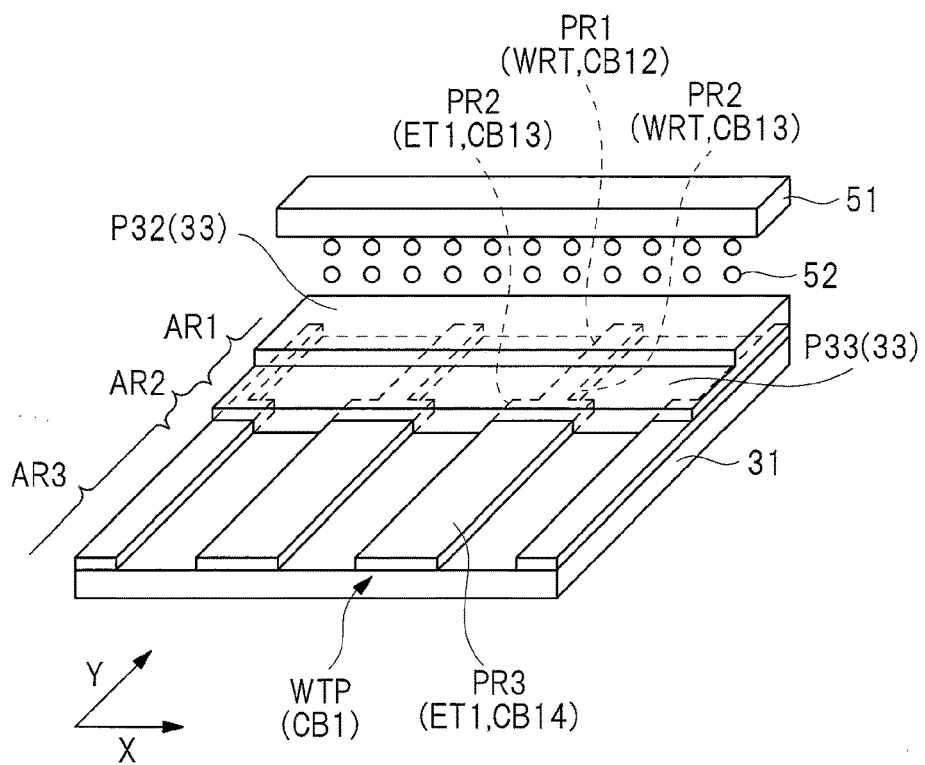
FIG. 14 is a perspective view during the manufacturing process of the electrode substrate according to the first embodiment.

Next, as illustrated in FIG. 13, the protective layer 33 is formed. In this step of forming the protective layer 33, the protective layer 33 is formed so as to cover the conductor pattern CB1 made up of the plurality of sensing electrodes TDL and the plurality of wiring parts WTP by applying the raw material liquid for forming the protective layer discharged as droplets to the upper surface of the substrate 31 in the display region Ad, the region AR1 and the region AR2. Meanwhile, since the raw material liquid for forming the protective layer is not applied in the region AR3, the side surface of each of the plurality of wiring parts WTP is exposed from the protective layer 33.

In this step of applying the raw material liquid discharged as droplets to the upper surface (first main surface) of the substrate (first substrate) 31 in the region AR1 and the region AR2, for example, a double coating may be performed, in which the raw material liquid is once discharged and applied to a certain region and the raw material liquid is then discharged and applied again from the top of the raw material liquid applied first, thereby forming the protective layer 33 from a region which overlaps the region coated with the raw material liquid applied first to another region. Also, the same is true for the following embodiments.

Examples of the method of applying the raw material liquid for forming the protective layer discharged as droplets include the ink jet method, the electric field jet method and the like. In addition, hereinafter, the case where the raw material liquid for forming the protective layer is applied by the ink jet method will be described as an example.

A resin film made of UV setting resin or thermosetting resin, for example, acrylic resin, epoxy resin or polyimide resin can be formed as the protective layer 33. Accordingly, a raw material liquid containing the above-mentioned UV setting resin or thermosetting resin can be used as the raw material liquid for forming the protective layer.

For example, when the raw material liquid is applied by the ink jet method, as illustrated in FIG. 14, the droplets of a raw material liquid 52 are discharged from a nozzle provided in a nozzle head 51 toward the upper surface of the substrate 31 while relatively moving the nozzle head 51 provided to be relatively movable with respect to the substrate 31 in a certain direction with respect to the substrate 31. In this manner, a coating film is formed in the display region Ad by applying the raw material liquid 52 so as to cover the plurality of sensing electrodes TDL (not illustrated). In addition, as illustrated in FIG. 13, a coating film is formed in the region AR1 and the region AR2 by applying the raw material liquid 52 so as to cover the plurality of wiring parts WTP. Specifically, a coating film made of a plurality of dots formed by depositing the droplets discharged from the nozzle on the upper surface of the substrate 31 is applied in the display region Ad, the region AR1 and the region AR2.

Thereafter, the protective layer 33 is formed by curing the applied coating film. In the case where a raw material liquid containing the UV setting resin is used as the raw material liquid 52, the coating film is cured by irradiating the applied coating film with light including UV, that is, UV light. Alternatively, in the case where a raw material liquid containing the thermosetting resin is used as the raw material liquid 52, the coating film is cured by performing the heat treatment to the applied coating film. In this manner, the protective layer 33 made of the plurality of dots formed by depositing the droplets discharged from the nozzle on the upper surface of the substrate 31 is formed.

Note that, as illustrated in FIG. 14, it is possible to reduce the time required for the step of applying the raw material liquid 52 by discharging the raw material liquid 52 simultaneously from a plurality of nozzles by using the nozzle head 51 having the plurality of nozzles arranged in a certain direction.

In the case where the raw material liquid is applied by the method of discharging the raw material liquid for forming the protective layer as droplets, it is unnecessary to perform the photolithography and etching for patterning. Thus, it is possible to form the protective layer having a desired pattern without increasing the number of manufacturing processes. In addition, in the case where the raw material liquid is applied by the method of discharging the raw material liquid for forming the protective layer as droplets, it is unnecessary to prepare a photomask for patterning. Thus, it is possible to reduce the manufacturing cost. Further, in the case where the raw material liquid is applied by the method of discharging the raw material liquid for forming the protective layer as droplets, it is possible to efficiently use the raw material liquid. Thus, it is possible to reduce the manufacturing cost. Furthermore, in the case where the raw material liquid is applied by the method of discharging the raw material liquid for forming the protective layer as droplets, it can be formed under the atmospheric pressure and it is unnecessary to use a film-forming apparatus provided with a vacuum chamber. Thus, it is possible to reduce the size of the film-forming apparatus.

In the first embodiment, the application amount of the raw material liquid per unit area of the upper surface of the substrate 31 in the region AR2 is made smaller than the application amount of the raw material liquid per unit area of the upper surface of the substrate 31 in the region AR1. In this manner, the average film thickness AT2 of the portion P33 of the protective layer 33 formed in the region AR2 is made smaller than the average film thickness AT1 of the portion P32 of the protective layer 33 formed in the region AR1. At this time, the film thickness TH2 of the portion formed on the portion PR2 of the wiring part WTP in the portion P33 of the protective layer 33 is smaller than the film thickness TH1 of the portion formed on the portion PR1 of the wiring part WTP in the portion P33 of the protective layer 33.

More specifically, the application amount of the raw material liquid per unit area of the upper surface of the substrate 31 in the region AR2 is made smaller than the application amount of the raw material liquid per unit area of the upper surface of the substrate 31 in the region AR1. In this manner, the film thickness TH2 of the protective layer 33 of the portion formed on the portion PR2 of the wiring part WTP is made smaller than the film thickness TH1 of the protective layer 33 of the portion formed on the portion PR1 of the wiring part WTP.

Here, a condition suitable for continuously forming the protective layer 33 when forming the protective layer 33 by the method of applying the raw material liquid discharged as droplets will be described with reference to FIGS. 15 to 18. Hereinafter, a step of discharging the plurality of droplets of the raw material liquid at a pitch PT1 in a certain direction when seen in a plan view will be described among the steps included in the process of forming the protective layer 33. At this time, the volume of each of the plurality of droplets discharged at the pitch PT1 is not uniform. More specifically, the volume of each of two droplets among the plurality of droplets discharged at the pitch PT1 is different from each other.

In such a case, a dot DT formed when a droplet having a maximum volume among each volume of the plurality of droplets is deposited on the upper surface of the substrate 31 is defined as a dot DT1, and a dot DT formed when a droplet having a minimum volume among each volume of the plurality of droplets is deposited on the upper surface of the substrate 31 is defined as a dot DT2. In addition, a diameter of the dot DT1 is defined as a diameter DM1, and a diameter of the dot DT2 is defined as a diameter DM2. The diameter DM1 is the maximum value of each diameter of the plurality of dots DT, and the diameter DM2 is the minimum value of each diameter of the plurality of dots DT.

Note that the pitch PT1 is an interval between deposition positions at which two adjacent droplets are deposited, and is an interval between the centers of two dots DT formed when the two adjacent droplets are deposited.

Figure 15:
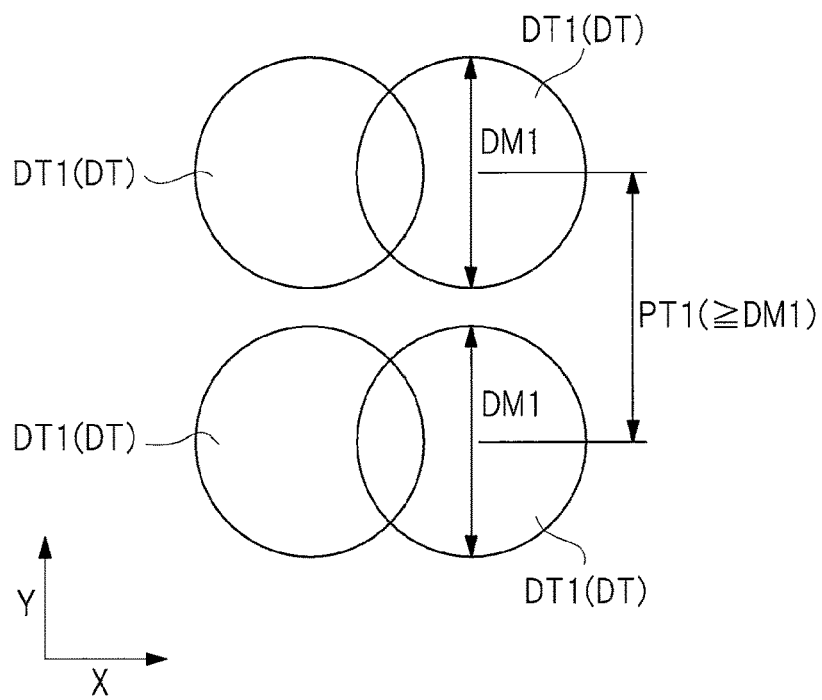
FIG. 15 is a diagram illustrating an arrangement of dots formed by depositing droplets.
Figure 16:
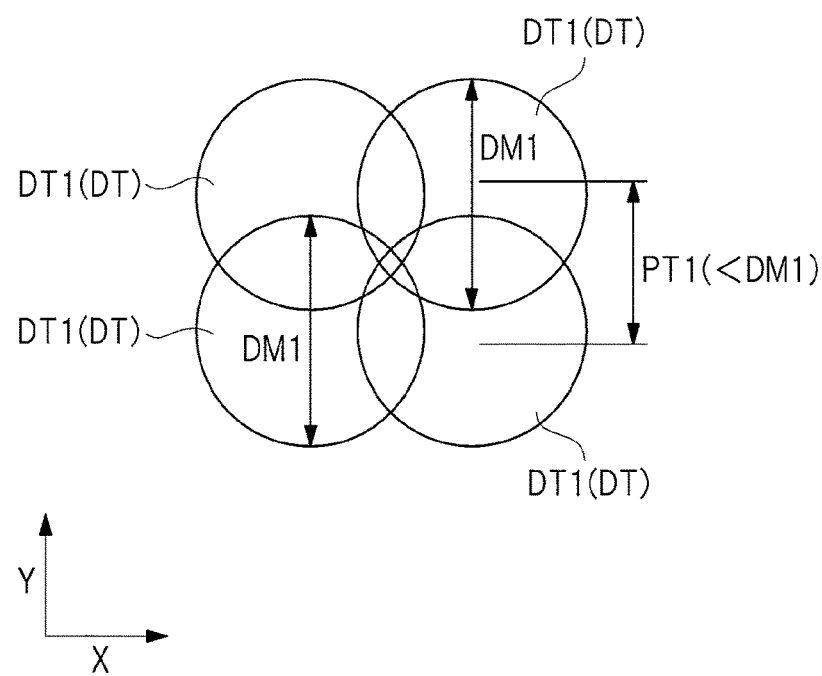
FIG. 16 is a diagram illustrating an arrangement of dots formed by depositing droplets.

As illustrated in FIG. 15, in the case where the pitch PT1 is equal to or larger than the diameter DM1 of the dot DT1, there is a fear that two dots DT1 adjacent in the Y axis direction do not overlap each other when seen in a plan view. On the other hand, as illustrated in FIG. 16, in the case where the pitch PT1 is less than the diameter DM1 of the dot DT1, two dots DT1 adjacent in the Y axis direction overlap each other when seen in a plan view. Thus, it is possible to continuously form the protective layer 33 in the region AR1 and the region AR2 by the plurality of dots DT1 formed by depositing the droplets discharged onto the upper surface of the substrate 31.

Figure 17:
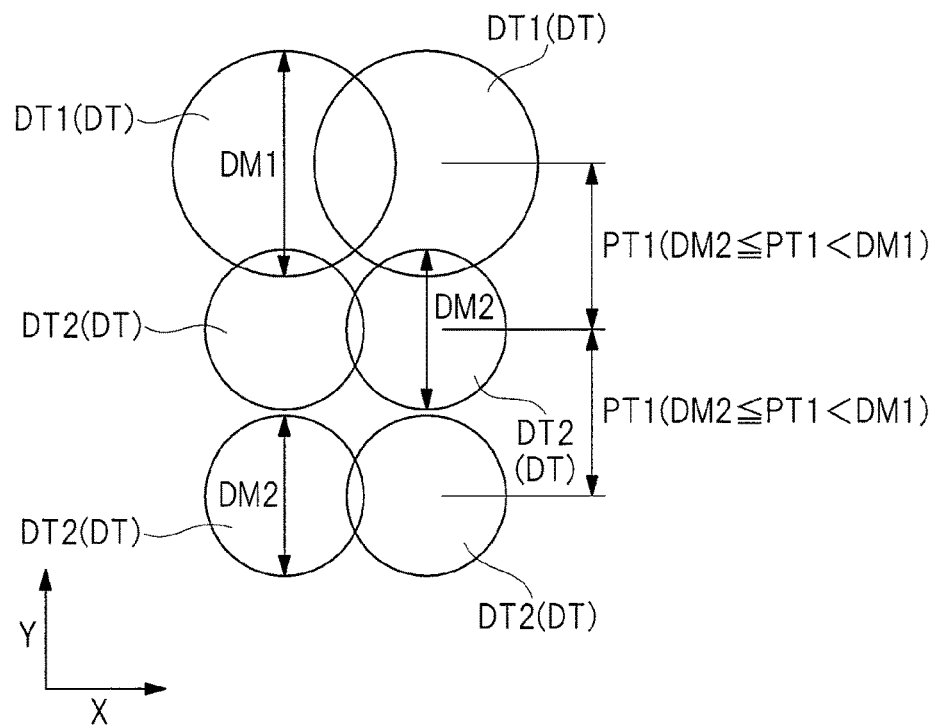
FIG. 17 is a diagram illustrating an arrangement of dots formed by depositing droplets.

In addition, as illustrated in FIG. 17, even when the pitch PT1 is smaller than the diameter DM1 of the dot DT1, there is a fear that two dots DT2 adjacent in the Y axis direction do not overlap each other when seen in a plan view in the case where the pitch PT1 is equal to or larger than the diameter DM2 of the dot DT2. On the other hand, as illustrated in FIG. 18, in the case where the pitch PT1 is smaller than the diameter DM2 of the dot DT2, two dots DT2 adjacent in the Y axis direction overlap each other when seen in a plan view. Thus, it is possible to reliably form the protective layer 33 continuously in the region AR1 and the region AR2 by the plurality of dots DT formed by depositing the droplets discharged onto the upper surface of the substrate 31.

Preferably, the difference between the surface tension on the upper surface of the conductor pattern CB1 and the surface tension on the upper surface of the substrate 31 is within 10% with respect to the surface tension on the upper surface of the substrate 31. In this manner, the surface tension on the upper surface of the conductor pattern CB1 and the surface tension on the upper surface of the substrate 31 become substantially equal. Thus, the spread width of the deposited droplets can be made uniform between the upper surface of the conductor pattern CB1 and the upper surface of the substrate 31. Accordingly, a diameter of a dot formed by depositing one of two droplets having the same volume on the upper surface of the conductor pattern CB1 can be made substantially equal to a diameter of a dot formed by depositing the other droplet on the upper surface of the substrate 31.

Note that, by adjusting the volume of the droplets to be discharged when the plurality of droplets of the raw material liquid are discharged at a constant pitch in a certain direction when seen in a plan view, it is possible to control the diameter of the dots formed by depositing the droplets between the diameter DM1 and the diameter DM2.

Alternatively, as illustrated in the example of FIG. 19, by adjusting the volume of the droplets to be discharged so as to be periodically varied between the maximum volume and the minimum volume when the plurality of droplets of the raw material liquid are discharged at a constant pitch in, for example, the X axis direction and the Y axis direction when seen in a plan view, it is also possible to form the protective layer 33 having irregularities on the upper surface.

Next, the wiring substrate WS1 (see FIG. 10) is electrically connected to the electrode terminal Eli. In this step of electrically connecting the wiring substrate WS1 and the electrode terminal ET1, the wiring substrate WS1 is disposed so as to cover the wiring part WTP via the anisotropic conductive film (ACF) CF1 (see FIG. 10) interposed therebetween. Hereinafter, a method of disposing the wiring substrate WS1 on the anisotropic conductive film CF1 after disposing the anisotropic conductive film CF1 so as to cover the wiring part WTP will be described. However, the anisotropic conductive film CF1 and the wiring substrate WS1 may be disposed in the same step so as to cover the wiring part WTP.

Figure 20:
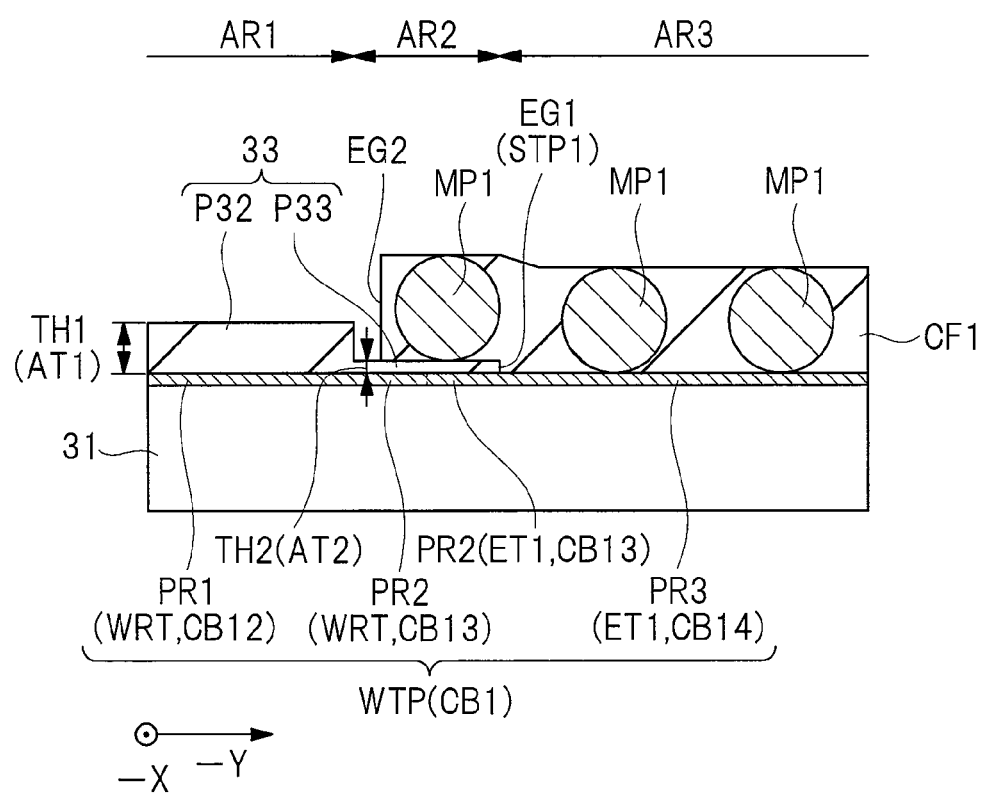
FIG. 20 is a cross-sectional view during the manufacturing process of the electrode substrate according to the first embodiment.

First, as illustrated in FIG. 20, the anisotropic conductive film CF1 is disposed in the region AR2 and the region AR3 so as to cover the wiring part WTP. As described above, the anisotropic conductive film CF1 is the film obtained by molding the thermosetting resin mixed with the fine metal particles MP1 having conductivity into a film shape.

Next, as illustrated in FIG. 10, the wiring substrate WS1 is disposed on the anisotropic conductive film CF1.

As described above, for example, the flexible printed wiring board referred to also as the flexible printed circuit (FPC) substrate may be used as the wiring substrate WS1. The wiring substrate WS1 includes the base WB1 and the plurality of electrode terminals ET2. The plurality of electrode terminals ET2 are formed on the lower surface serving as the main surface of the base WB1. The plurality of electrode terminals ET2 are arranged so as to correspond to the portion PR3 of each of the plurality of wiring parts WTP.

In this manner, the wiring substrate WS1 is pressed to the substrate 31 while performing, for example, heat treatment in a state in which the anisotropic conductive film CF1 is sandwiched between the portion PR3 of the wiring part WTP, that is, the electrode terminal ET1 and the electrode terminal ET2. At this time, the plurality of metal particles MP1 inside the anisotropic conductive film CF1 are crushed to be in contact with each other in the thickness direction of the anisotropic conductive film CF1, thereby forming the conductive path in the thickness direction of the anisotropic conductive film CF1. Then, the electrode terminal ET1 and the electrode terminal ET2 facing each other are electrically connected via the anisotropic conductive film CF1 interposed therebetween.

Preferably, in the step of disposing the wiring substrate WS1, the electrode terminal ET2 of the wiring substrate WS1 faces the portion PR3 of the wiring part WTP via the anisotropic conductive film CF1 interposed therebetween, and the edge portion EG2 of the anisotropic conductive film CF1 on the region AR1 side and the edge portion EG3 of the wiring substrate WS1 on the region AR1 side are arranged on the protective layer 33. Then, in such a state, the portion PR3 of the wiring part WTP and the electrode terminal ET2 are electrically connected via the anisotropic conductive film CF1 interposed therebetween. Thus, any portion of the portion PR2 of the wiring part WTP is covered with any one of the protective layer 33 and the anisotropic conductive film CF1 and it is possible to prevent the moisture in the air from being in contact with any portion in the portion PR2 of the wiring part WTP, so that it is possible to reliably protect the sensing electrode TDL made of the conductive film from corrosion.

More preferably, in the step of disposing the wiring substrate WS1, the portion PR3 of the wiring part WTP and the electrode terminal ET2 are electrically connected via the anisotropic conductive film CF1 interposed therebetween in a state in which the edge portion EG3 of the wiring substrate WS1 on the region AR1 side is arranged on the portion P33 of the protective layer 33 via the anisotropic conductive film CF1 interposed therebetween. In this manner, the wiring substrate WS1 does not overlap the portion P32 having the average film thickness AT1 larger than the average film thickness AT2 of the portion P33 in the protective layer 33 when seen in a plan view. Thus, when the wiring substrate WS1 disposed astride the stepped portion STP1 is pressed to the substrate 31 via the anisotropic conductive film CF1 interposed therebetween, the ease of contact that a plurality of metal particles MP1 inside the anisotropic conductive film CF1 are crushed to be in contact with each other in the thickness direction of the anisotropic conductive film CF1 becomes substantially uniform in the plane of the anisotropic conductive film CF1. Accordingly, it is possible to electrically stably connect the electrode terminal ET1 and the electrode terminal ET2.

<Stability of Electrical Connection Between Electrode Substrate and Wiring Substrate>

Next, the stability of the electrical connection between the electrode substrate and the wiring substrate will be described while comparing it with an electrode substrate according to the comparative example 1.

Figure 21:
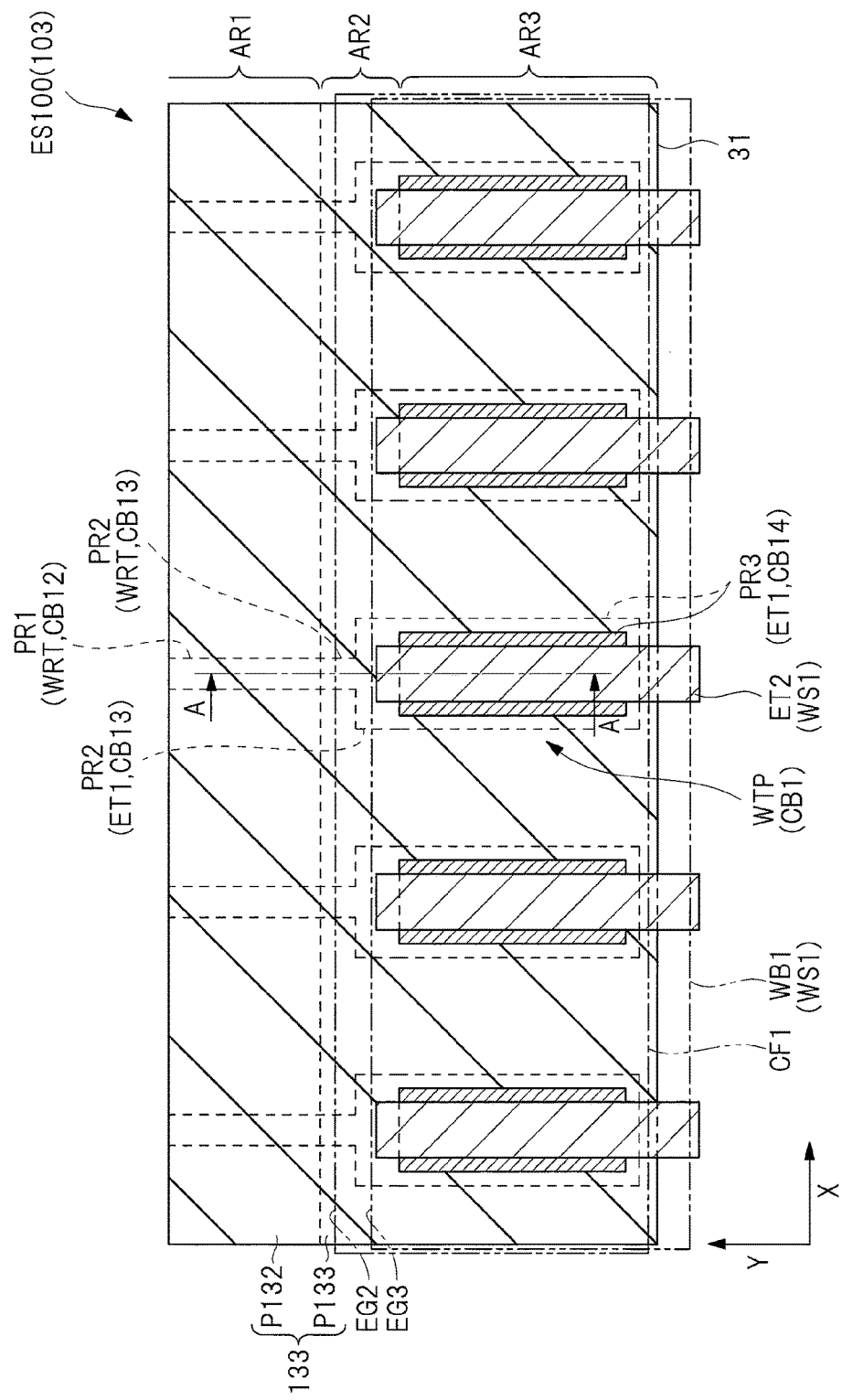
FIG. 21 is a plan view illustrating an electrode substrate according to a comparative example 1.
Figure 22:
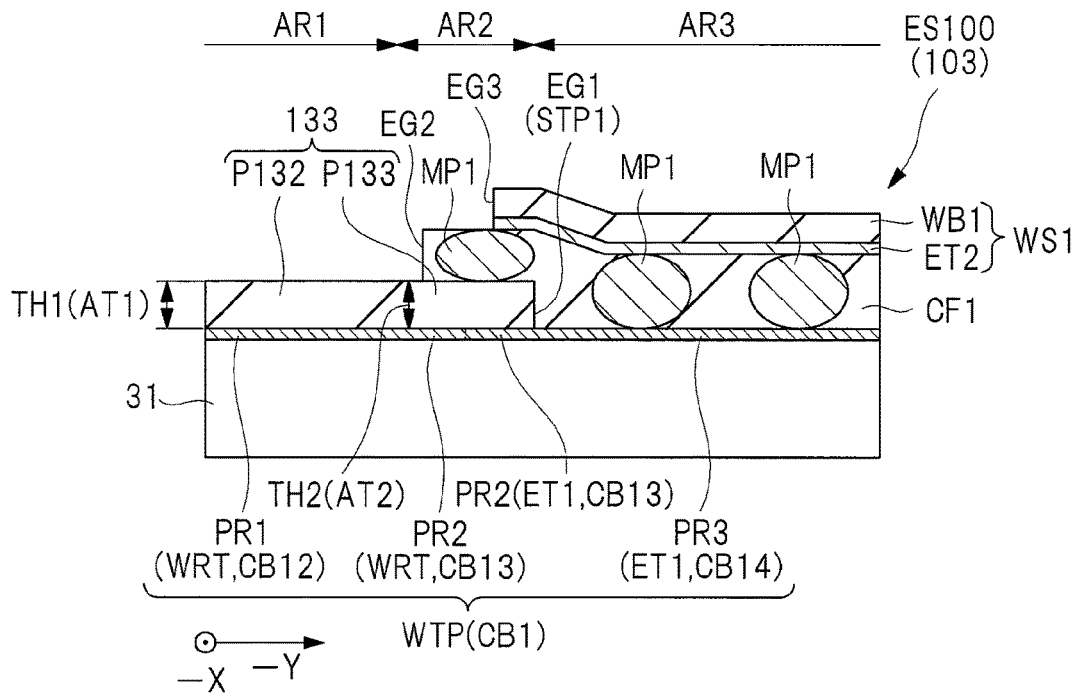
FIG. 22 is a cross-sectional view illustrating the electrode substrate according to the comparative example 1.
Figure 23:
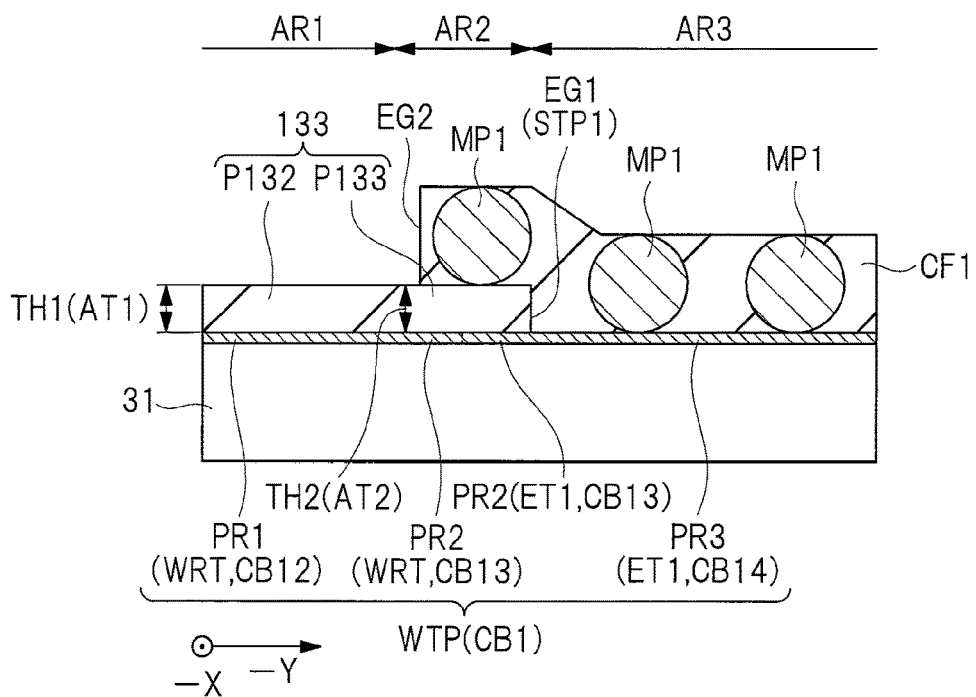
FIG. 23 is a cross-sectional view during a manufacturing process of the electrode substrate according to the comparative example 1.

FIG. 21 is a plan view illustrating the electrode substrate according to the comparative example 1. FIG. 22 is a cross-sectional view illustrating the electrode substrate according to the comparative example 1. FIG. 23 is a cross-sectional view during a manufacturing process of the electrode substrate according to the comparative example 1.

In the comparative example 1, an electrode substrate ES100 serving as an opposing substrate 103 has the substrate 31, the conductor pattern CB1 and a protective layer 133. Also in the comparative example 1, similarly to the first embodiment, the substrate 31 includes the region AR1 of the upper surface of the substrate 31, the region AR2 of the upper surface of the substrate 31 and the region AR3 of the upper surface of the substrate 31 as the regions of the upper surface of the substrate 31.

Also in the comparative example 1, similarly to the first embodiment, the conductor pattern CB1 includes the plurality of wiring parts WTP. Each of the plurality of wiring parts WTP is continuously formed on the upper surface of the substrate 31 from the region AR1 of the upper surface of the substrate 31 via the region AR2 of the upper surface of the substrate 31 to the region AR3 of the upper surface of the substrate 31 when seen in a plan view. The plurality of wiring parts WTP extend in the Y axis direction and are arrayed in the X axis direction when seen in a plan view.

In addition, also in the comparative example 1, each of the plurality of wiring parts WTP includes the lead wiring WRT and the electrode terminal ET1 similarly to the first embodiment. Also, the portion of the wiring part WTP formed in the region AR1 is defined as the portion PR1, the portion of the wiring part WTP formed in the region AR2 is defined as the portion PR2, and the portion of the wiring part WTP formed in the region AR3 is defined as the portion PR3.

The protective layer 133 is formed so as to cover the conductor pattern CB1 made up of the plurality of sensing electrodes TDL and the plurality of wiring parts WTP in the region AR1 and the region AR2. In the protective layer 133, a portion formed in the region AR1 is defined as a portion P132 and a portion formed in the region AR2 is defined as a portion P133.

In the wiring part WTP, the portion PR1 and the portion PR2 formed in the region AR1 and the region AR2 are covered with the protective layer 133. In the comparative example 1, the protective layer 133 is not formed by the method of applying the raw material liquid discharged as droplets such as the ink jet method or the electric field jet method. In the comparative example 1, the protective layer 133 is formed by a method of, for example, forming an insulating film to be the protective layer 133 on the entire upper surface of the substrate 31 and then patterning the insulating film by, for example, photolithography and etching.

In the comparative example 1, an average film thickness AT2 of the portion P133 of the protective layer 133 is equal to an average film thickness AT1 of the portion P132 of the protective layer 133. More specifically, the film thickness TH2 of the portion formed on the portion PR2 of the wiring part WTP in the portion P133 of the protective layer 133 is equal to the film thickness TH1 of the portion formed on the portion PR1 of the wiring part WTP in the portion P132 of the protective layer 133.

In the manufacturing process of the electrode substrate according to the comparative example 1, the conductor pattern CB1 made up of the plurality of sensing electrodes TDL and the plurality of wiring parts WTP is formed by performing the same steps as those described with reference to FIGS. 11 and 12, and then the protective layer 133 is formed so as to cover the conductor pattern CB1 as illustrated in FIG. 23. Next, as illustrated in FIG. 23, the anisotropic conductive film CF1 is disposed so as to cover the wiring part WTP on the substrate 31 in the region AR2 and the region AR3. Thereafter, the wiring substrate WS1 is disposed on the anisotropic conductive film CF1 in the region AR2 and the region AR3, so that the portion PR3 of the wiring part WTP, that is, the electrode terminal ET1 and the electrode terminal ET2 are electrically connected via the anisotropic conductive film CF1 interposed therebetween as illustrated in FIG. 22.

In the comparative example 1, since the average film thickness AT2 of the portion P133 of the protective layer 133 is equal to the average film thickness AT1 of the portion P132 of the protective layer 133, the height of the stepped portion STP1 in the edge portion EG1 of the protective layer 133 on the region AR3 side is large. Thus, when the wiring substrate WS1 disposed astride the stepped portion STP1 is pressed to the substrate 31 via the anisotropic conductive film CF1 interposed therebetween, the ease of contact that a plurality of metal particles MP1 inside the anisotropic conductive film CF1 are crushed to be in contact with each other in the thickness direction of the anisotropic conductive film CF1 does not become uniform in the plane of the anisotropic conductive film CF1. Accordingly, it is difficult to electrically stably connect the electrode terminal ET1 and the electrode terminal ET2.

In the comparative example 1, the protective layer 133 is not formed by applying the raw material liquid discharged as droplets. Thus, for making the average film thickness AT2 of the portion P133 of the protective layer 133 smaller than the average film thickness AT1 of the portion P132 of the protective layer 133, a method as described below is conceivable. That is, for example, a method is conceivable, in which a first insulating film is formed on the entire upper surface of the substrate 31, the first insulating film thus formed is patterned to remove the first insulating film in the region AR2, and then, a second insulating film is formed on the entire upper surface of the substrate 31 again and the second insulating film thus formed is patterned. However, in such a method, the number of steps in the process of forming the protective layer 133 increases.

In the technique described in the Patent Document 1, the organic film pattern having the stepped structure in the thickness direction is formed by applying and forming an organic flattened film, which is a photosensitive organic resin film, by a spin coating method or the like, and then performing the development after the exposure by a half-tone exposure technique. However, in the technique described in the Patent Document 1, when the organic film pattern having the stepped structure in the thickness direction is formed, it is necessary to perform half-tone exposure using a special photomask such as a half-tone mask. Thus, the number of steps in the process of forming the electrode substrate increases, and the manufacturing cost of the electrode substrate increases.

In this manner, in the comparative example 1, it is difficult to easily adjust the film thickness of the protective layer 133 so that the protective layer 133 has different film thicknesses between two regions of the upper surface of the substrate 31 included in the electrode substrate ES100, that is, between the region AR1 and the region AR2. Thus, it is not possible to electrically stably connect the electrode terminal ET2 arranged astride the stepped portion in the edge portion EG1 of the protective layer 133 and the electrode terminal ET1, and electric properties of the display apparatus are degraded.

Note that, as described above, the protective layer 133 is not formed by applying the raw material liquid discharged as droplets in the comparative example 1. Thus, it is possible to cover a peripheral part of the portion PR3 of the wiring part WTP with the protective layer 133 by patterning the protective layer 133 by, for example, photolithography and etching. Accordingly, in the region AR3, the side surface of the portion PR3 of the wiring part WTP and the edge portion of the portion PR3 of the wiring part WTP on the opposite side to the region AR1 side are covered with the protective layer 133.

<Main Feature and Effect of Present Embodiment>

In the first embodiment, the average film thickness AT2 of the portion P33 of the protective layer 33 formed in the region AR2 is smaller than the average film thickness AT1 of the portion P32 of the protective layer 33 formed in the region AR1. More specifically, the film thickness TH2 of the portion formed on the portion PR2 of the wiring part WTP in the portion P33 of the protective layer 33 is smaller than the film thickness TH1 of the portion formed on the portion PR1 of the wiring part WTP in the portion P32 of the protective layer 33.

In this case, as compared with the comparative example 1, a height of the stepped portion STP1 in the edge portion EG1 of the protective layer 33 on the region AR3 side decreases. Thus, when the wiring substrate WS1 disposed astride the stepped portion STP1 is pressed to the substrate 31 via the anisotropic conductive film CF1 interposed therebetween, the ease of contact that the plurality of metal particles MP1 inside the anisotropic conductive film CF1 are crushed to be in contact with each other in the thickness direction of the anisotropic conductive film CF1 becomes substantially uniform in a plane of the anisotropic conductive film CF1. Accordingly, it is possible to electrically stably connect the portion PR3 of the wiring part WTP, that is, the electrode terminal ET1 and the electrode terminal ET2.

More specifically, in the first embodiment, it is possible to easily adjust the film thickness of the protective layer 33 so that the protective layer 33 has different film thicknesses between two regions of the upper surface of the substrate 31 included in the electrode substrate ES, that is, between the region AR1 and the region AR2. Thus, it is possible to electrically stably connect the electrode terminal ET2 arranged astride the stepped portion in the edge portion EG1 of the protective layer 133 and the electrode terminal ET1. Accordingly, electric properties of the display apparatus can be improved.

In addition, in the first embodiment, the protective layer 33 is formed by applying the raw material liquid for forming the protective layer discharged as droplets. Thus, it is unnecessary to perform the method described below in order to make the average film thickness AT2 of the portion P33 of the protective layer 33 smaller than the average film thickness AT1 of the portion P32 of the protective layer 33. That is, for example, it is unnecessary to perform the method in which the first insulating film is formed on the entire upper surface of the substrate 31, the first insulating film thus formed is patterned to remove the first insulating film in the region AR2, and then, the second insulating film is formed on the entire upper surface of the substrate 31 again, and the second insulating film thus formed is patterned. Accordingly, it is possible to reduce the number of steps in the process of forming the protective layer 33.

Further, in the first embodiment, it is unnecessary to prepare the photomask, for example, the half-tone mask in order to make the average film thickness AT2 of the portion P33 of the protective layer 33 smaller than the average film thickness AT1 of the portion P32 of the protective layer 33. Accordingly, it is possible to reduce the manufacturing cost of the electrode substrate and to reduce the number of steps in the process of forming the protective layer 33.

Note that a shape accuracy of the pattern by the method of applying a raw material liquid discharged as droplets such as an ink jet method or an electric field jet method is lower than a shape accuracy of the pattern by a method of patterning an insulating film by, for example, photolithography and etching. Specifically, a minimum value of the pitch PT1 of the plurality of dots described with reference to FIGS. 16 and 18 is about 70 µm, but the array pitch DS1 of the electrode terminal ET1 in the X axis direction is about 100 µm and is in the same order with the minimum value of the pitch PT1. Thus, in the method of forming the protective layer 33 by applying the raw material liquid discharged as droplets, it is not possible to pattern the protective layer 33 so that a central portion of the portion PR3 of the wiring part WTP is exposed from the protective layer 33 and a peripheral portion of the portion PR3 of the wiring part WTP is covered with the protective layer 33. Accordingly, in the region AR3, the side surface of the portion PR3 of the wiring part WTP and the edge portion of the portion PR3 of the wiring part WTP on the opposite side to the region AR1 side are exposed from the protective layer 33. More specifically, the side surface of the wiring part WTP of the portion formed in the region AR3 is exposed from the protective layer 33.

Preferably, the array pitch DS1 of the electrode terminal ET1 in the X axis direction is 100 to 2000 µm. In such a range of the array pitch DS1, the advantage that the average film thickness AT2 of the portion P33 of the protective layer 33 can be easily made smaller than the average film thickness AT1 of the portion P32 of the protective layer 33 by applying the raw material liquid discharged as droplets significantly exceeds the disadvantage of the low shape accuracy of the pattern. Accordingly, the effect of being able to electrically stably connect the electrode terminal ET1 and the electrode terminal ET2 becomes larger in comparison with the case where the array pitch DS1 is smaller than 100 µm or the case where the array pitch DS1 exceeds 2000 µm.

Second Embodiment

In the first embodiment, the example in which the display device provided with a touch panel as an input device is applied to a liquid crystal display device with a touch sensing function in which sensing electrodes of the input device are provided on an upper surface of a substrate included in an opposing substrate has been described. Meanwhile, in the second embodiment, an example in which a display device provided with a touch panel as an input device is applied to a liquid crystal display device with a touch sensing function in which sensing electrodes and driving electrodes of the input device are provided on an upper surface of a substrate included in an opposing substrate will be described.

In the display apparatus according to the second embodiment, the respective parts other than the opposing substrate 3 are the same as those in the display apparatus according to the first embodiment, and thus, the description thereof will be omitted.

In addition, in the second embodiment, the driving electrode COML (see FIG. 6) operates as the driving electrode of the liquid crystal display device 20 (see FIG. 1), but does not operate as the driving electrode of the touch sensing device 30 (see FIG. 1). Accordingly, unlike the first embodiment, it is not always necessary to provide the plurality of driving electrodes as the driving electrode COML, and, for example, one driving electrode in which the plurality of driving electrodes COML of the first embodiment are combined and integrated may be provided.

<Configuration of Electrode Substrate>

Figure 24:
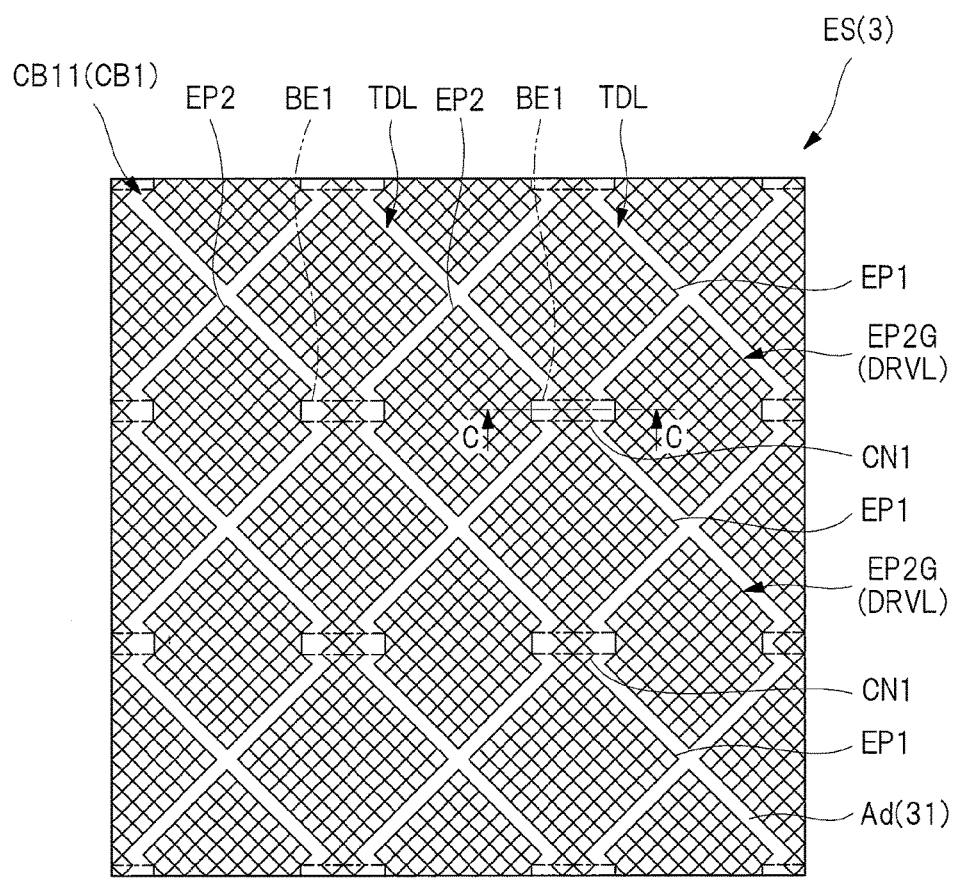
FIG. 24 is a plan view illustrating an electrode substrate according to the second embodiment.
Figure 25:
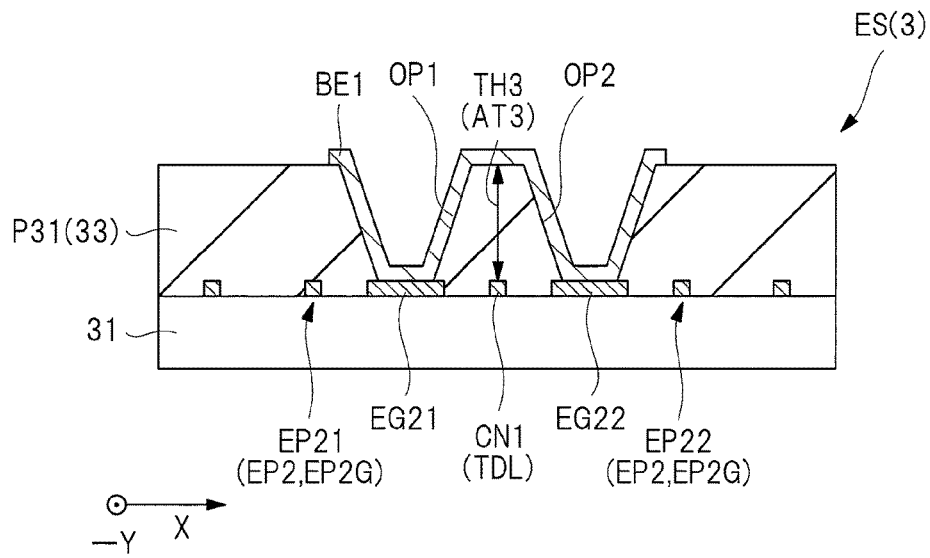
FIG. 25 is a cross-sectional view illustrating the electrode substrate according to the second embodiment.
Figure 26:
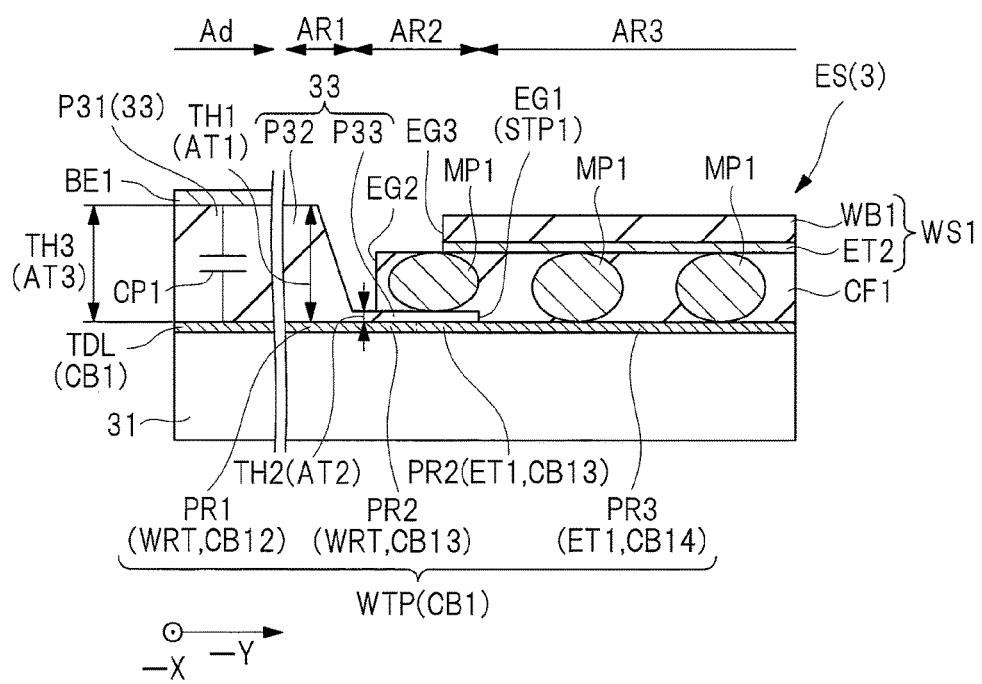
FIG. 26 is a cross-sectional view illustrating the electrode substrate according to the second embodiment.

FIG. 24 is a plan view illustrating the electrode substrate according to the second embodiment. FIGS. 25 and 26 are cross-sectional views illustrating the electrode substrate according to the second embodiment. FIG. 25 is a cross-sectional view taken along the line C-C of FIG. 24. FIG. 26 is a cross-sectional view corresponding to a part of a cross section of FIG. 10.

The electrode substrate ES serving as the opposing substrate 3 according to the second embodiment has the substrate 31, the conductor pattern CB1, the protective layer 33 and a plurality of bridge electrodes BE1. The substrate 31 according to the second embodiment can be the same as the substrate 31 according to the first embodiment.

The conductor pattern CB1 includes the plurality of sensing electrodes TDL, a plurality of electrode part groups EP2G and the plurality of wiring parts WTP. The wiring part WTP according to the second embodiment can be the same as the wiring part WTP according to the first embodiment. More specifically, each of the plurality of wiring parts WTP is continuously formed on the upper surface of the substrate 31 from the region AR1 of the upper surface of the substrate 31 via the region AR2 of the upper surface of the substrate 31 to the region AR3 of the upper surface of the substrate 31 when seen in a plan view. Each of the plurality of wiring parts WIT includes the lead wiring WRT and the electrode terminal ET1. In the conductor pattern CB1, a conductor pattern made up of the plurality of sensing electrodes TDL and the plurality of electrode part groups EP2G in the display region Ad is defined as the conductor pattern CB11.

The portion PR1 of the wiring part WTP formed in the region AR1 is a part of the lead wiring WRT, the portion PR2 of the wiring part WTP formed in the region AR2 includes the other part of the lead wiring WRT and a part of the electrode terminal ET1, and the portion PR3 of the wiring part WTP formed in the region AR3 is the other part of the electrode terminal ET1. In the conductor pattern CB1, the conductor pattern formed of the portion PR1 is defined as the conductor pattern CB12, the conductor pattern formed of the portion PR2 is defined as the conductor pattern CB13, and the conductor pattern formed of the portion PR3 is defined as the conductor pattern CB14.

Each of the plurality of sensing electrodes TDL is the sensing electrode of the touch sensing device 30. Each of the plurality of sensing electrodes TDL is formed on the upper surface of the substrate 31 in the display region Ad. The display region Ad is the region on the opposite side of the region AR2 with the region AR1 interposed therebetween. The plurality of sensing electrodes TDL extend in the Y axis direction and are arrayed in the X axis direction in the display region Ad. Each of the plurality of sensing electrodes TDL includes a plurality of electrode parts EP1 and a plurality of connection parts CN1. Each of the plurality of electrode parts EP1 and each of the plurality of connection parts CN1 are provided on the upper surface of the substrate 31 in the display region Ad. The plurality of electrode parts EP1 are arrayed in the Y axis direction when seen in a plan view. Also, two electrode parts EP1 adjacent in the Y axis direction are electrically connected by the connection part CN1. As illustrated in FIG. 24, each of the plurality of electrode parts EP1 may have a mesh shape formed of a plurality of conductive lines when seen in a plan view, and each of the plurality of connection parts CN1 may have a mesh shape formed of a plurality of conductive lines when seen in a plan view.

Each of the plurality of electrode part groups EP2G is formed on the upper surface of the substrate 31 in the display region Ad. The plurality of electrode part groups EP2G extend in the X axis direction and are arrayed in the Y axis direction in the display region Ad. Each of the plurality of electrode part groups EP2G includes the plurality of electrode parts EP2. Each of the plurality of electrode parts EP2 is provided on the upper surface of the substrate 31 in the display region Ad. The plurality of electrode parts EP2 are arrayed in the X axis direction when seen in a plan view. As illustrated in FIG. 24, the plurality of electrode parts EP2 may have a mesh shape formed of a plurality of conductive lines when seen in a plan view. In addition, two electrode parts EP2 adjacent in the X axis direction are electrically connected by the bridge electrode BE1.

The protective layer 33 is formed so as to cover the conductor pattern CB1 made up of the plurality of sensing electrodes TDL, the plurality of electrode part groups EP2G and the plurality of wiring parts WTP in the display region Ad, the region AR1 and the region AR2. In the protective layer 33, the portion formed in the display region Ad is defined as the portion P31, the portion formed in the region AR1 is defined as the portion P32, and the portion formed in the region AR2 is defined as the portion P33. The portion P32 and the portion P33 according to the second embodiment can be the same as the portion P32 and the portion P33 according to the first embodiment.

The average film thickness AT2 of the portion P33 of the protective layer 33 formed in the region AR2 is smaller than the average film thickness AT3 of the portion P31 of the protective layer 33 formed in the display region Ad. More specifically, the film thickness TH2 of the portion formed on the portion PR2 of the wiring part WTP in the portion P33 of the protective layer 33 is smaller than a film thickness TH3 of a portion formed on the sensing electrode TDL and below the bridge electrode BE1 in the portion P31 of the protective layer 33.

Note that the average film thickness AT3 of the portion P31 of the protective layer 33 formed in the display region Ad may be equal to or different from the average film thickness AT1 of the portion P32 of the protective layer 33 formed in the region AR1. More specifically, the film thickness TH3 of the portion formed on the sensing electrode TDL and below the bridge electrode BE1 in the portion P31 of the protective layer 33 may be equal to or different from the film thickness TH1 of the portion formed on the portion PR1 of the wiring part WTP in the portion P32 of the protective layer 33.

In the display region Ad, an opening portion OP1 which penetrates the portion P31 and reaches an edge portion EG21 on a first side (right side in FIG. 25) of the electrode part EP2 in the X axis direction is formed on the upper surface of the portion P31 of the protective layer 33. In addition, in the display region Ad, an opening portion OP2 which penetrates the portion P31 and reaches an edge portion EG22 on the opposite side (left side in FIG. 25) to the first side of the electrode part EP2 in the X axis direction is formed on the upper surface of the portion P31 of the protective layer 33. The protective layer 33 of a portion positioned between the opening portion OP1 and the opening portion OP2 is formed so as to cover the connection part CN1 included in the sensing electrode TDL.

The bridge electrode BE1 is continuously formed on the edge portion EG21 exposed at the bottom of the opening portion OP1, on the edge portion EG22 exposed at the bottom of the opening portion OP2, on an inner wall of the opening portion OP1, on an inner wall of the opening portion OP2, and on the protective layer 33 of the portion positioned between the opening portion OP1 and the opening portion OP2. More specifically, the bridge electrode BE1 is formed astride the sensing electrode TDL in the display region Ad.

One electrode part EP2 is defined as an electrode part EP21, and another electrode part EP2 which is arranged on the first side (right side in FIG. 25) of the electrode part EP21 in the X axis direction and is adjacent to the electrode part EP21 is defined as an electrode part EP22. At this time, the edge portion EG21 of the electrode part EP21 on the first side in the X axis direction is exposed at the bottom of the opening portion OP1, and the edge portion EG21 exposed at the bottom of the opening portion OP1 is electrically connected to the bridge electrode BE1. In addition, the edge portion EG22 of the electrode part EP22 on the opposite side (left side in FIG. 25) to the first side in the X axis direction is exposed at the bottom of the opening portion OP2, and the edge portion EG22 exposed at the bottom of the opening portion OP2 is electrically connected to the bridge electrode BE1. Accordingly, the edge portion EG21 of the electrode part EP21 and the edge portion EG22 of the electrode part EP22 are electrically connected by the bridge electrode BE1.

In this manner, two electrode parts EP2 adjacent in the X axis direction are electrically connected by the bridge electrode BE1. Then, a driving electrode DRVL is formed of the electrode part group EP2G made up of the plurality of electrode parts EP2 in which the two electrode parts EP2 adjacent in the X axis direction are electrically connected by the bridge electrode BE1. Each of the plurality of driving electrodes DRVL is a driving electrode of the touch sensing device 30. The plurality of driving electrodes DRVL extend in the X axis direction and is arrayed in the Y axis direction in the display region Ad. Accordingly, the plurality of sensing electrodes TDL intersect with the plurality of driving electrodes DRVL when seen in a plan view.

<Method of Manufacturing Electrode Substrate>

In a manufacturing process of the electrode substrate according to the second embodiment, the substrate 31 is prepared by performing the step described with reference to FIG. 11, and then, the plurality of wiring parts WTP are formed by performing the step described with reference to FIG. 12. At this time, the plurality of sensing electrodes TDL electrically connected to the plurality of wiring parts WTP and the plurality of electrode part groups EP2G are formed on the upper surface of the substrate 31 in the display region Ad. The display region Ad is the region on the opposite side of the region AR2 with the region AR1 interposed therebetween.

Next, the protective layer 33 is formed by performing the step described with reference to FIG. 13. At this time, as described above in the first embodiment, the protective layer 33 is formed so as to cover the plurality of wiring parts WTP, the plurality of sensing electrodes TDL and the plurality of electrode part groups EP2G by applying the raw material liquid discharged as droplets to the upper surface of the substrate 31 in the region AR1, the region AR2 and the display region Ad.

In the second embodiment, the application amount of the raw material liquid per unit area of the upper surface of the substrate 31 in the region AR2 is made smaller than the application amount of the raw material liquid per unit area of the upper surface of the substrate 31 in the display region Ad. In this manner, as illustrated in FIG. 26, the average film thickness AT2 of the portion P33 of the protective layer 33 formed in the region AR2 is made smaller than the average film thickness AT3 of the portion P31 of the protective layer 33 formed in the display region Ad. At this time, the film thickness TH2 of the portion formed on the portion PR2 of the wiring part WTP in the portion P33 of the protective layer 33 is smaller than the film thickness TH3 of the portion formed on the sensing electrode TDL and below the bridge electrode BE1 in the portion P31 of the protective layer 33.

More specifically, the application amount of the raw material liquid per unit area of the upper surface of the substrate 31 in the region AR2 is made smaller than the application amount of the raw material liquid per unit area of the upper surface of the substrate 31 in the display region Ad. In this manner, the film thickness TH2 of the protective layer 33 of the portion formed on the portion PR2 of the wiring part WTP is made smaller than the film thickness TH3 of the protective layer 33 of the portion formed on the sensing electrode TDL and below the bridge electrode BE1.

Next, as illustrated in FIG. 25, in the protective layer 33, the opening portion OP1 which penetrates the portion P31 and reaches the edge portion EG21 of the electrode part EP21 and the opening portion OP2 which penetrates the portion P31 and reaches the edge portion EG22 of the electrode part EP22 are formed in the portion P31 formed in the display region Ad.

Next, as illustrated in FIG. 25, the bridge electrode BE1 is continuously formed on the edge portion EG21 exposed at the bottom of the opening portion OP1, on the edge portion EG22 exposed at the bottom of the opening portion OP2, on the inner wall of the opening portion OP1, on the inner wall of the opening portion OP2, and on the protective layer 33 of the portion positioned between the opening portion OP1 and the opening portion OP2. The bridge electrode BE1 is formed astride the sensing electrode TDL in the display region Ad.

Thereafter, the wiring substrate WS1 is electrically connected to the electrode terminal ET1 by performing the step described with reference to FIGS. 20 and 10.

<Main Feature and Effect of Present Embodiment>

In the second embodiment, similarly to the first embodiment, the average film thickness AT2 of the portion P33 of the protective layer 33 formed in the region AR2 is smaller than the average film thickness AT1 of the portion P32 of the protective layer 33 formed in the region AR1. More specifically, the film thickness TH2 of the portion formed on the portion PR2 of the wiring part WTP in the portion P33 of the protective layer 33 is smaller than the film thickness TH1 of the portion formed on the portion PR1 of the wiring part WTP in the portion P31 of the protective layer 33.

In this manner, similarly to the first embodiment, it is possible to electrically stably connect the portion PR3 of the wiring part WTP, that is, the electrode terminal ET1 and the electrode terminal ET2.

Further, in the second embodiment, the average film thickness AT2 of the portion P33 of the protective layer 33 formed in the region AR2 is smaller than the average film thickness AT3 of the portion P31 of the protective layer 33 formed in the display region Ad. More specifically, the film thickness TH2 of the portion formed on the portion PR2 of the wiring part WTP in the portion P33 of the protective layer 33 is smaller than the film thickness TH3 of the portion formed on the sensing electrode TDL in the portion P31 of the protective layer 33.

In this manner, it is possible to reduce a capacitance CP1 between the bridge electrode BE1 and the sensing electrode TDL in an intersecting region at which the driving electrode DRVL intersects with the sensing electrode TDL when seen in a plan view. Thus, it is possible to reduce the capacitance between the driving electrode DRVL and the sensing electrode TDL. Alternatively, it is possible to prevent the driving electrode DRVL and the sensing electrode TDL from being short-circuited in the intersecting region at which the driving electrode DRVL intersects with the sensing electrode TDL.

Third Embodiment

In the first embodiment, the example in which the film thickness of the portion positioned on the outer peripheral side of the substrate in the protective layer formed so as to cover the wiring part connected to the sensing electrode is smaller than the film thickness of the portion positioned on the central side of the substrate has been described. Meanwhile, in the third embodiment, an example in which a film thickness of a protective layer of a portion formed so as to cover a wiring part connected to a sensing electrode is smaller than a film thickness of the protective layer of a portion formed so as to cover the sensing electrode will be described.

The overall configuration of a display apparatus according to the third embodiment can be the same as the overall configuration of the display apparatus according to the first embodiment, and the description thereof will be omitted.

<Module and Display Device with Touch Sensing Function>

Figure 27:
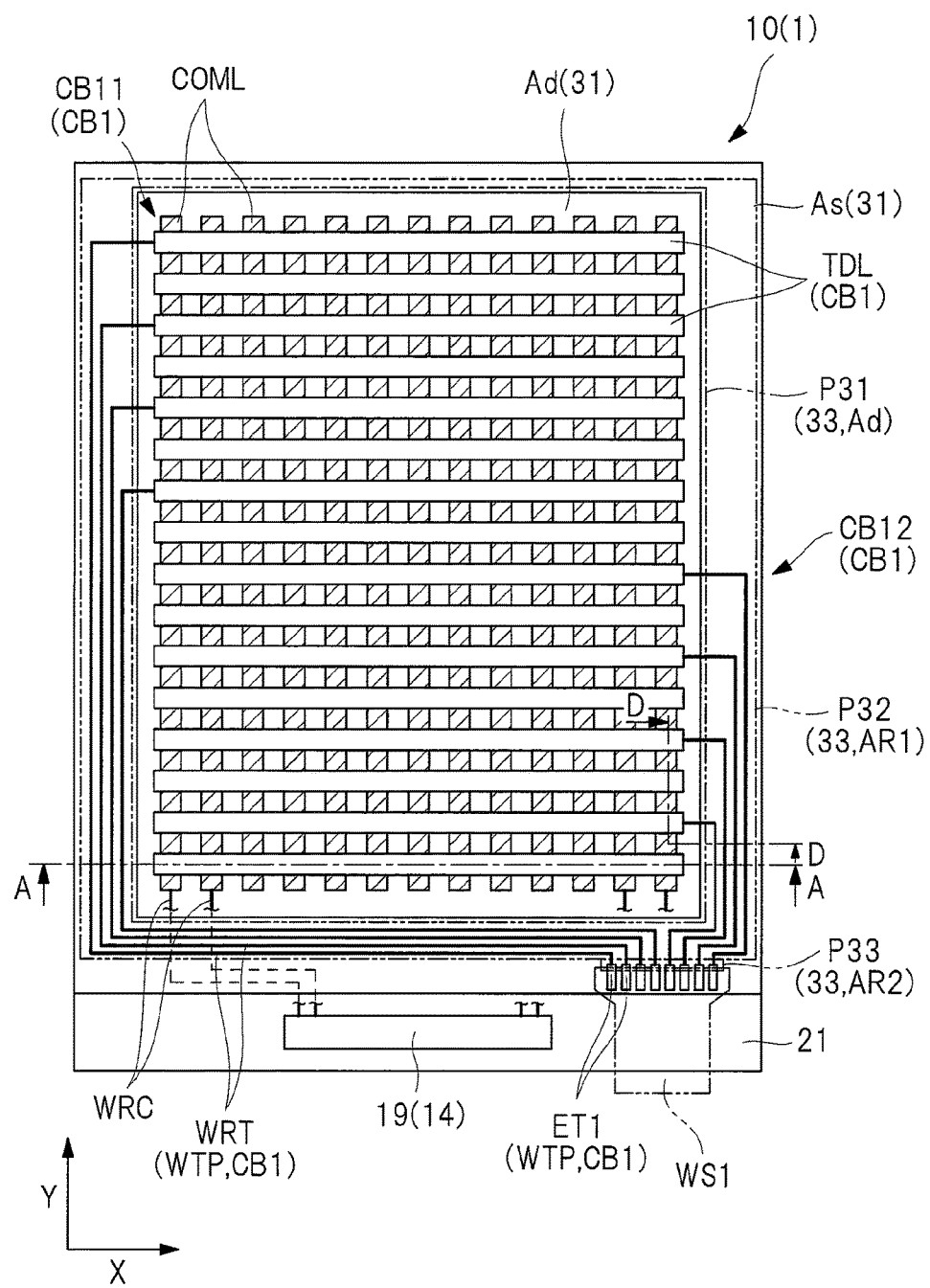
FIG. 27 is a plan view illustrating an example of a module having a display apparatus according to the third embodiment incorporated therein.
Figure 28:
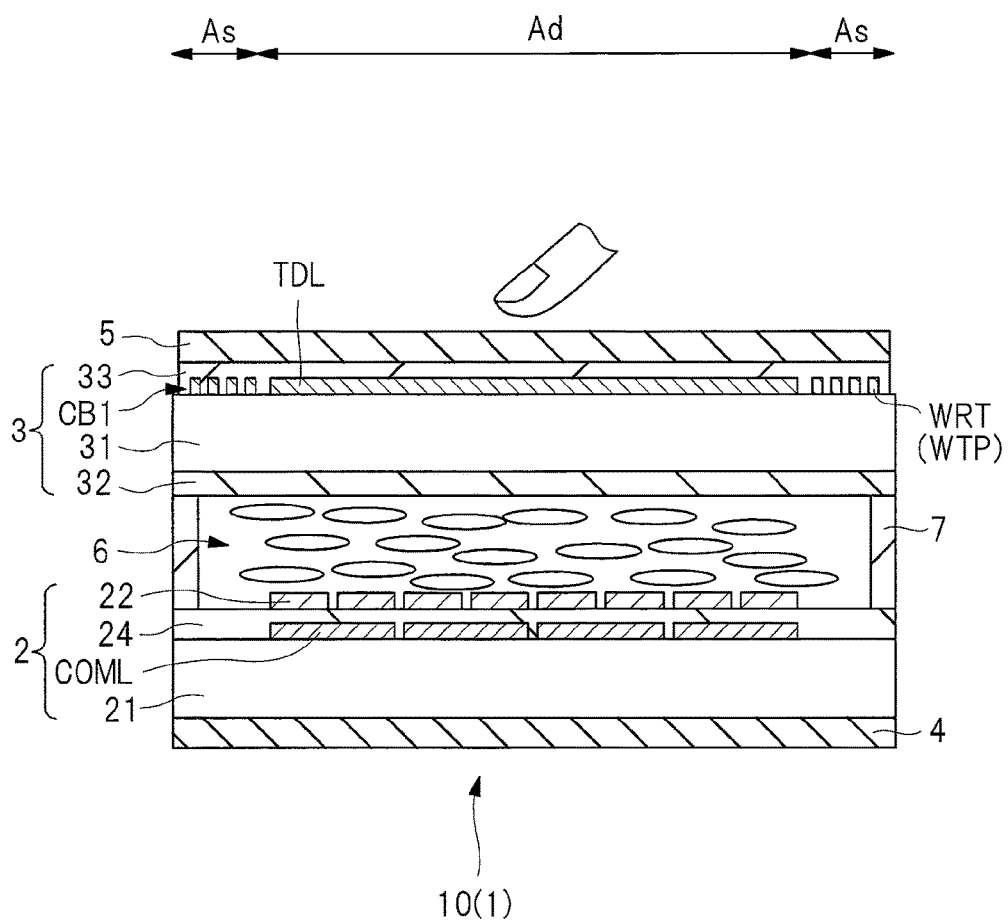
FIG. 28 is a cross-sectional view illustrating a display device with a touch sensing function in the display apparatus according to the third embodiment.

FIG. 27 is a plan view illustrating an example of a module having a display apparatus according to the third embodiment incorporated therein. FIG. 28 is a cross-sectional view illustrating a display device with a touch sensing function in the display apparatus according to the third embodiment. The cross-sectional view of FIG. 28 illustrates a part of the cross section taken along the line A-A of FIG. 27. Note that, in FIG. 27, the portions P31, P32 and P33 of the protective layer 33 and the wiring substrate WS1 are represented by two-dot chain lines.

As illustrated in FIG. 27, the display device 10 with a touch sensing function according to the third embodiment has the substrate 21, the substrate 31, the plurality of driving electrodes COML and the plurality of sensing electrodes TDL like the display device 10 with a touch sensing function according to the first embodiment.

The third embodiment is different from the first embodiment in that the plurality of driving electrodes COML extend in the Y axis direction and are arrayed in the X axis direction when seen in a plan view. In addition, the third embodiment is different from the first embodiment in that the plurality of sensing electrodes TDL extend in the X axis direction and are arrayed in the Y axis direction when seen in a plan view. Accordingly, hereinafter, apart different from the part described with reference to FIGS. 5 and 6 in the first embodiment will be mainly described with reference to FIGS. 27 and 28.

In addition, in the third embodiment, although not illustrated, each of the plurality of driving electrodes COML is provided so as to overlap the plurality of sub-pixels SPix arrayed in the Y axis direction when seen in a plan view unlike the first embodiment.

The display device 10 with a touch sensing function has the array substrate 2, the opposing substrate 3, the polarizing plate 4, the polarizing plate 5, the liquid crystal layer 6 and the sealing part 7. The opposing substrate 3 is arranged in opposition to the array substrate 2 so that the upper surface serving as a main surface of the array substrate 2 and the lower surface serving as a main surface of the opposing substrate 3 face each other. The liquid crystal layer 6 is provided between the array substrate 2 and the opposing substrate 3.

The polarizing plate 4, the polarizing plate 5, the liquid crystal layer 6 and the sealing part 7 according to the third embodiment can be the same as the polarizing plate 4, the polarizing plate 5, the liquid crystal layer 6 and the sealing part 7 according to the first embodiment.

As illustrated in FIG. 28, the array substrate 2 has the substrate 21, the plurality of driving electrodes COML, the insulating film 24 and the plurality of pixel electrodes 22. The substrate 21, the plurality of driving electrodes COML, the insulating film 24 and the plurality of pixel electrodes 22 according to the third embodiment can be the same as those according to the first embodiment except that the plurality of driving electrodes COML extend in the Y axis direction and are arrayed in the X axis direction when seen in a plan view.

Meanwhile, in the third embodiment, the plurality of sub-pixels SPix which belong to the same column share one driving electrode COML unlike the first embodiment. As described above, the plurality of signal lines SGL extend in the Y axis direction and are arrayed in the X axis direction in the display region Ad (see FIG. 7). Thus, the extending direction of each of the plurality of driving electrodes COML is parallel to the extending direction of each of the plurality of signal lines SGL.

The display operation using the gate driver 12, the source driver 13 and the driving electrode driver 14 in the liquid crystal display device 20 of the display apparatus according to the third embodiment can be performed in the same manner as the display operation in the liquid crystal display device 20 of the display apparatus according to the first embodiment.

The driving electrode COML in the display apparatus 1 according to the third embodiment operates as the driving electrode of the liquid crystal display device 20 and operates as the driving electrode of the touch sensing device 30 like the driving electrode COML in the display apparatus 1 according to the first embodiment.

Also in the third embodiment, similarly to the first embodiment, the electrostatic capacitance is generated at intersecting portions between each of the plurality of driving electrodes COML and each of the plurality of sensing electrodes TDL seen in a plan view. Thus, input positions are sensed based on the electrostatic capacitance between each of the plurality of driving electrodes COML and each of the plurality of sensing electrodes TDL. More specifically, by the electrode substrate like the substrate 31 on which the sensing electrodes TDL are formed (see FIG. 28) and the driving electrodes COML, a sensing unit for sensing the input position, that is, an input device is formed.

The touch sensing operation in the touch sensing device 30 of the display apparatus according to the third embodiment can be performed in the same manner as the touch sensing operation in the touch sensing device 30 of the display apparatus according to the first embodiment.

As described in the first embodiment with reference to FIG. 8, the plurality of driving electrodes COML and the plurality of sensing electrodes TDL which intersect with each other when seen in a plan view form an electrostatic capacitive touch sensor having a matrix arrangement. Accordingly, by scanning the entire touch sensing surface of the touch sensing device 30, positions which have been contacted or approached by a finger or the like can be sensed.

Further, as the touch sensing device 30 according to the third embodiment, the touch sensing device 30 of the self-capacitance method may be applied like the touch sensing device 30 according to the first embodiment.

As illustrated in FIGS. 27 and 28, the opposing substrate 3 has the substrate 31, the color filter 32, the conductor pattern CB1 and the protective layer 33. The substrate 31 and the color filter 32 according to the third embodiment can be the same as the substrate 31 and the color filter 32 according to the first embodiment.

The conductor pattern CB1 is formed on the upper surface of the substrate 31. The conductor pattern CB1 includes the plurality of sensing electrodes TDL and the plurality of wiring parts WTP. The plurality of sensing electrodes TDL are the sensing electrodes of the touch sensing device 30, and are formed on the upper surface of the substrate 31. Each of the plurality of wiring parts WTP includes the lead wiring WRT and the electrode terminal ET1. The lead wiring WRT and the electrode terminal ET1 are formed on the upper surface of the substrate 31. The protective layer 33 is formed on the upper surface of the substrate 31 so as to cover the conductor pattern CB1. Note that the shapes of the conductor pattern CB1 and the protective layer 33 will be described later.

<Configuration of Electrode Substrate>

Next, the configuration of the electrode substrate will be described with reference to FIGS. 27 to 30 while comparing it with a configuration of an electrode substrate according to the comparative example 2. In the description of the third embodiment, an electrode substrate used as the opposing substrate having the sensing electrodes formed in the display device with an input device is taken as an example of the electrode substrate.

Figure 29:
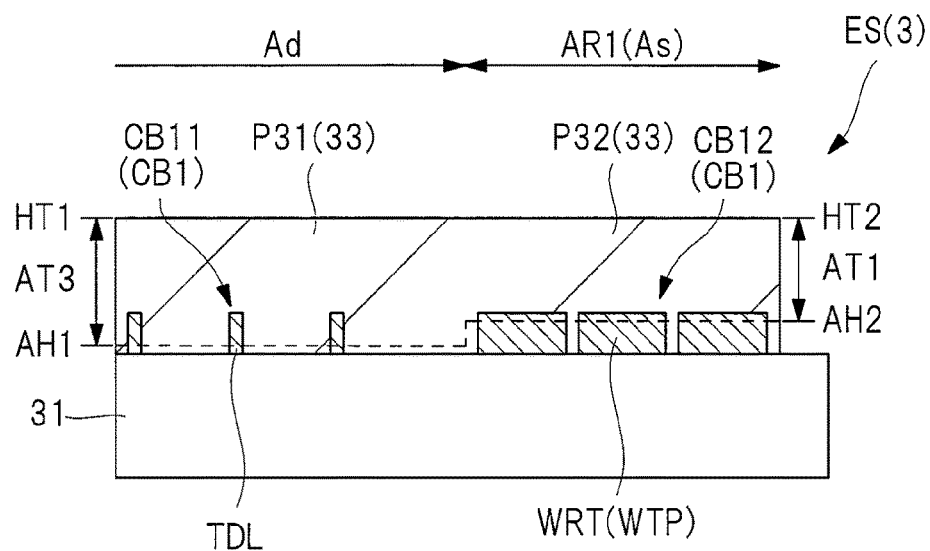
FIG. 29 is a cross-sectional view illustrating the electrode substrate according to the third embodiment.
Figure 30:
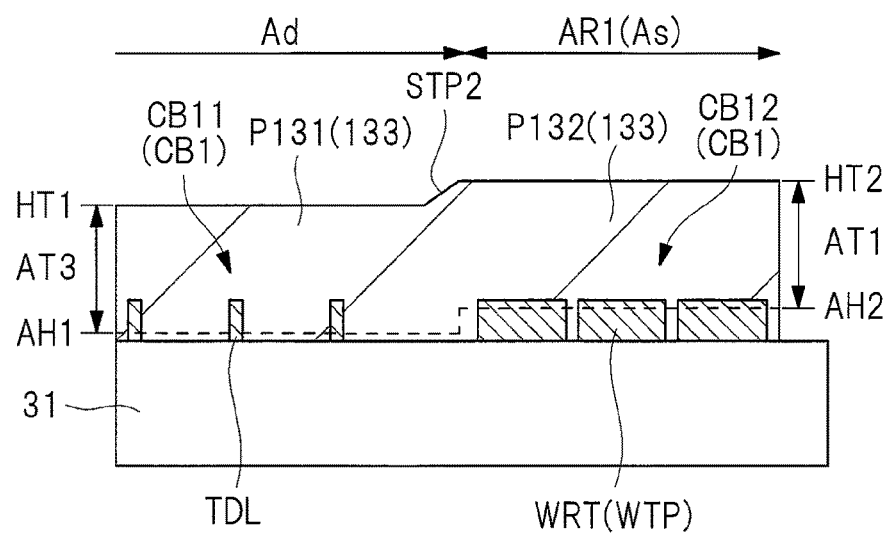
FIG. 30 is a cross-sectional view illustrating an electrode substrate according to a comparative example 2.

FIG. 29 is a cross-sectional view illustrating the electrode substrate according to the third embodiment. FIG. 30 is a cross-sectional view illustrating the electrode substrate according to the comparative example 2. FIG. 29 illustrates a part of a cross section taken along the line D-D of FIG. 27. The cross-sectional view of FIG. 30 corresponds to a cross section of FIG. 29.

The electrode substrate ES serving as the opposing substrate 3 according to the third embodiment has the substrate 31, the conductor pattern CB1 and the protective layer 33. As described above, the substrate 31 according to the third embodiment can be the same as the substrate 31 according to the first embodiment.

The conductor pattern CB1 includes the plurality of sensing electrodes TDL and the plurality of wiring parts WTP. Each of the plurality of sensing electrodes TDL is the sensing electrode of the touch sensing device 30. Each of the plurality of sensing electrodes TDL is formed on the upper surface of the substrate 31 in the display region Ad. In the conductor pattern CB1, the conductor pattern formed of the plurality of sensing electrodes TDL in the display region Ad is defined as the conductor pattern CB11.

The plurality of sensing electrodes TDL according to the third embodiment can be the same as the plurality of sensing electrodes TDL according to the first embodiment except that the plurality of sensing electrodes TDL extend in the X axis direction and are arrayed in the Y axis direction when seen in a plan view.

In addition, the wiring part WTP according to the third embodiment can be the same as the wiring part WTP according to the first embodiment illustrated in FIGS. 9 and 10. More specifically, each of the plurality of wiring parts WTP is continuously formed on the upper surface of the substrate 31 from the region AR1 of the upper surface of the substrate 31 via the region AR2 of the upper surface of the substrate 31 to the region AR3 of the upper surface of the substrate 31 when seen in a plan view. Each of the plurality of wiring parts WTP includes the lead wiring WRT and the electrode terminal ET1.

The portion PR1 of the wiring part WTP formed in the region AR1 is a part of the lead wiring WRT, the portion PR2 of the wiring part WTP formed in the region AR2 includes the other part of the lead wiring WRT and a part of the electrode terminal ET1, and the portion PR3 of the wiring part WTP formed in the region AR3 is the other part of the electrode terminal ET1. In the conductor pattern CB1, the conductor pattern formed of the portion PR1 is defined as the conductor pattern CB12, the conductor pattern formed of the portion PR2 is defined as the conductor pattern CB13, and the conductor pattern formed of the portion PR3 is defined as the conductor pattern CB14.

Meanwhile, as illustrated in FIG. 29, in the third embodiment, a ratio of the sum of areas of the plurality of lead wirings WRT to the area of the region AR1 is larger than a ratio of the sum of areas of the plurality of sensing electrodes TDL to the area of the display region Ad unlike the first embodiment. More specifically, the area ratio of the plurality of lead wirings WRT in the region AR1 is larger than the area ratio of the plurality of sensing electrodes TDL in the display region Ad. At this time, an average height position AH2 of the upper surface of the conductor pattern CB12 is higher than an average height position AH1 of the upper surface of the conductor pattern CB11.

Also in the third embodiment, similarly to the first embodiment, the protective layer 33 is formed so as to cover the conductor pattern CB1 made up of the plurality of sensing electrodes TDL and the plurality of wiring parts WTP in the display region Ad, the region AR1 and the region AR2. In the protective layer 33, the portion formed in the display region Ad is defined as the portion P31, the portion formed in the region AR1 is defined as the portion P32, and the portion formed in the region AR2 is defined as the portion P33.

In the third embodiment, the average film thickness AT1 of the portion P32 of the protective layer 33 formed in the region AR1 is smaller than the average film thickness AT3 of the portion of the protective layer 33 formed in the display region Ad.

Note that the average film thickness AT3 of the portion P31 of the protective layer 33 formed in the display region Ad means the difference between the average height position AH1 of the upper surface of the conductor pattern CB1 in the display region Ad, that is, the conductor pattern CB11 and an average height position HT1 of the upper surface of the portion P31 of the protective layer 33. In addition, the average film thickness AT1 of the portion P32 of the protective layer 33 formed in the region AR1 means the difference between the average height position AH2 of the upper surface of the conductor pattern CB1 in the region AR1, that is, the conductor pattern CB12 and an average height position HT2 of the upper surface of the portion P32 of the protective layer 33.

In the comparative example 2, unlike the third embodiment, the average film thickness AT1 of the portion P132 of the protective layer 133 formed in the region AR1 is equal to the average film thickness AT3 of the portion P131 of the protective layer 133 formed in the display region Ad as illustrated in FIG. 30. In the comparative example 2, the protective layer 133 is formed by, for example, the method of forming an insulating film to be the protective layer 133 on the entire upper surface of the substrate 31 and then patterning the insulating film by, for example, photolithography and etching. In addition, in the comparative example 2, the average height position HT2 of the upper surface of the portion P132 of the protective layer 133 is higher than the average height position HT1 of the upper surface of the portion P131 of the protective layer 133.

In the comparative example 2, a height of a stepped portion STP2 between the upper surface of the portion P132 of the protective layer 133 and the upper surface of the portion P131 of the protective layer 133 increases. When the height of the stepped portion STP2 increases, since a portion of the stepped portion STP2 formed in the display region Ad is visually recognized as an unevenness of the protective layer 133 in a part of the display region Ad adjacent to the region AR1, the visibility of an image to be displayed in the display region Ad is degraded.

That is, in the comparative example 2, it is difficult to easily adjust the film thickness of the protective layer 133 so that the protective layer 133 has different film thicknesses between two regions of the upper surface of the substrate 31 included in the electrode substrate, that is, between the display region Ad and the region AR1. Thus, the stepped portion STP2 between the upper surface of the portion P131 of the protective layer 133 and the upper surface of the portion P132 of the protective layer 133 is visually recognized as an unevenness of the protective layer 133, so that the visibility of an image to be displayed in the display region Ad is degraded and optical properties of the display apparatus are degraded.

Meanwhile, in the third embodiment, the protective layer 33 is formed by the method of applying the raw material liquid discharged as droplets, for example, the ink jet method or the electric field jet. In addition, the application amount of the raw material liquid per unit area of the upper surface of the substrate 31 in the region AR1 is made smaller than the application amount of the raw material liquid per unit area of the upper surface of the substrate 31 in the display region Ad. In this manner, the average film thickness AT1 of the portion P32 of the protective layer 33 formed in the region AR1 is made smaller than the average film thickness AT3 of the protective layer 33 of the portion formed in the display region Ad. Accordingly, difference between the average height position HT2 of the upper surface of the portion P32 of the protective layer 33 and the average height position HT1 of the upper surface of the portion P31 of the protective layer 33 decreases as compared with the comparative example 2.

In the third embodiment, as compared with the comparative example 2, the height of the stepped portion STP2 (see FIG. 30) between the upper surface of the portion P32 of the protective layer 33 and the upper surface of the portion P31 of the protective layer 33 can be decreased. Accordingly, by decreasing the height of the stepped portion STP2, a portion of the stepped portion STP2 formed in the display region Ad is less likely to be visually recognized as an unevenness of the protective layer 33 in a part of the display region Ad adjacent to the region AR1, and the visibility of an image to be displayed in the display region Ad can be improved.

More specifically, in the third embodiment, it is possible to easily adjust the film thickness of the protective layer 33 so that the protective layer 33 has different film thicknesses between two regions of the upper surface of the substrate 31 included in the electrode substrate ES, that is, between the display region Ad and the region AR1. Thus, it is possible to prevent or suppress the stepped portion between the upper surface of the portion P32 of the protective layer 33 and the upper surface of the portion P31 of the protective layer 33 from being visually recognized as the unevenness of the protective layer 33. Accordingly, it is possible to improve the visibility of the image to be displayed in the display region Ad, and thus, it is possible to improve the optical properties of the display apparatus.

Preferably, by further adjusting the application amount of the raw material liquid per unit area of the upper surface of the substrate 31 in the region AR1, it is possible to prevent the stepped portion from being formed between the upper surface of the portion P32 of the protective layer 33 and the upper surface of the portion P31 of the protective layer 33. More specifically, the average height position HT2 of the upper surface of the portion P32 of the protective layer 33 can be made equal to the average height position HT1 of the upper surface of the portion P31 of the protective layer 33. Accordingly, any unevenness of the protective layer 33 is not visually recognized at all in the portion of the display region Ad adjacent to the region AR1, and the visibility of the image to be displayed in the display region Ad can be further improved.

<Method of Manufacturing Electrode Substrate>

In a manufacturing process of the electrode substrate according to the third embodiment, after the substrate 31 is prepared by performing the step described with reference to FIG. 11, the plurality of wiring parts WTP are formed by performing the step described with reference to FIG. 12. At this time, the plurality of sensing electrodes TDL are formed on the upper surface of the substrate 31 in the display region Ad, and the plurality of lead wirings WRT are formed on the upper surface of the substrate 31 in the region AR1, thereby forming the conductor pattern CB1 made up of the plurality of sensing electrodes TDL and the plurality of lead wirings WRT. A ratio of the sum of areas of the plurality of lead wirings WRT to the area of the region AR1 is larger than a ratio of the sum of areas of the plurality of sensing electrodes TDL to the area of the display region Ad.

Next, when the protective layer 33 is formed by performing the step described with reference to FIG. 13, as described above in the first embodiment, the protective layer 33 is formed so as to cover the plurality of sensing electrodes TDL and the plurality of lead wirings WRT by applying the raw material liquid discharged as droplets to the upper surface of the substrate 31 in the display region Ad and the region AR1.

In the third embodiment, the application amount of the raw material liquid per unit area of the upper surface of the substrate 31 in the region AR1 is made smaller than the application amount of the raw material liquid per unit area of the upper surface of the substrate 31 in the display region Ad. In this manner, as illustrated in FIG. 29, the average film thickness AT1 of the portion P32 of the protective layer 33 formed in the region AR1 is made smaller than the average film thickness AT3 of the portion P31 of the protective layer 33 formed in the display region Ad.

Thereafter, the wiring substrate WS1 is electrically connected to the electrode terminal ET1 by performing the step described with reference to FIGS. 20 and 10.

<Main Feature and Effect of Present Embodiment>

In the third embodiment, the ratio of the sum of areas of the plurality of lead wirings WRT to the area of the region AR1 is larger than a ratio of the sum of areas of the plurality of sensing electrodes TDL to the area of the display region Ad. Also, the average film thickness AT1 of the portion P32 of the protective layer 33 formed in the region AR1 is smaller than the average film thickness AT3 of the portion P31 of the protective layer 33 formed in the display region Ad.

In this manner, the height of the stepped portion STP2 (see FIG. 30) between the upper surface of the portion P32 of the protective layer 33 and the upper surface of the portion P31 of the protective layer 33 can be decreased. Accordingly, by decreasing the height of the stepped portion STP2, a portion of the stepped portion STP2 formed in the display region Ad is less likely to be visually recognized as an unevenness of the protective layer 33 in a part of the display region Ad adjacent to the region AR1, and the visibility of an image to be displayed in the display region Ad can be improved.

Note that, in the third embodiment, in addition to making the average film thickness AT1 of the portion P32 of the protective layer 33 smaller than the average film thickness AT3 of the portion P31 of the protective layer 33, the average film thickness AT2 of the portion P33 of the protective layer 33 formed in the region AR2 may be made smaller than the average film thickness AT1 of the portion P32 of the protective layer 33 as illustrated in FIG. 10 similarly to the first embodiment. More specifically, the film thickness TH2 of the portion formed on the portion PR2 of the wiring part WTP in the portion P33 of the protective layer 33 may be made smaller than the film thickness TH1 of the portion formed on the portion PR1 of the wiring part WTP in the portion P31 of the protective layer 33.

In this manner, similarly to the first embodiment, the height of the stepped portion STP1 in the edge portion EG1 of the protective layer 33 on the region AR3 side decreases. Thus, when the wiring substrate WS1 disposed astride the stepped portion STP1 is pressed to the substrate 31 via the anisotropic conductive film CF1 interposed therebetween, the ease of contact that the plurality of metal particles MP1 inside the anisotropic conductive film CF1 are crushed to be in contact with each other in the thickness direction of the anisotropic conductive film CF1 becomes substantially uniform in a plane of the anisotropic conductive film CF1. Accordingly, it is possible to electrically stably connect the portion PR3 of the wiring part WTP, that is, the electrode terminal ET1 and the electrode terminal ET2.

Alternatively, in the third embodiment, unlike the first embodiment, it is not always necessary to make the average film thickness AT2 of the portion P33 of the protective layer 33 formed in the region AR2 smaller than the average film thickness AT1 of the portion P32 of the protective layer 33.

Fourth Embodiment

In the first embodiment, the example in which a display device provided with a touch panel as an input device is applied to an in-cell liquid crystal display device with a touch sensing function in which the driving electrode COML of the display device functions also as the driving electrode of the input device has been described.

Meanwhile, in the fourth embodiment, an example in which a display device provided with a touch panel as an input device is applied to an in-cell liquid crystal display device with a touch sensing function in which the driving electrode COML of the display device and the driving electrode of the input device are separately formed will be described.

Note that the display device according to the fourth embodiment can be applied not only to the liquid crystal display device but also to an in-cell display device in which an input device is integrated with various types of display devices such as an organic EL display device.

<Display Device with Touch Sensing Function>

Figure 31:
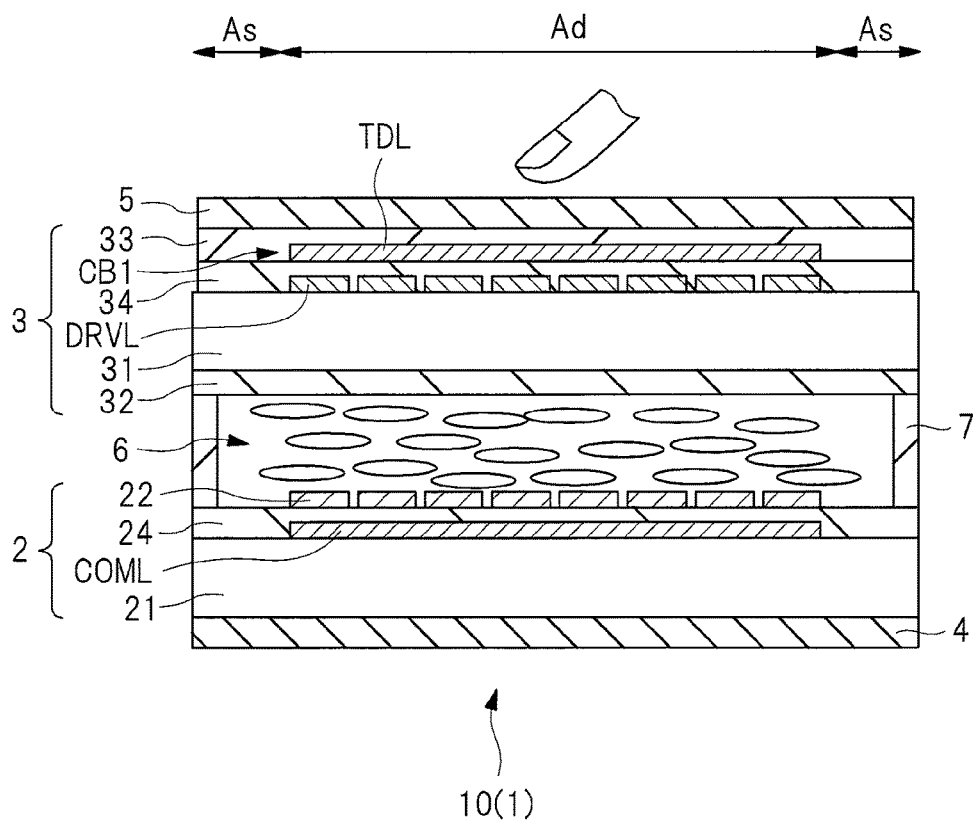
FIG. 31 is a cross-sectional view illustrating a display device with a touch sensing function in a display apparatus according to the fourth embodiment.

FIG. 31 is a cross-sectional view illustrating a display device with a touch sensing function in the display apparatus according to the fourth embodiment.

In the display apparatus according to the fourth embodiment, the respective parts other than the opposing substrate 3 are the same as those in the display apparatus according to the first embodiment, and thus, the description thereof will be omitted. Accordingly, hereinafter, a part different from the part described with reference to FIGS. 5, 6, 9 and 10 in the first embodiment will be mainly described with reference to FIG. 31.

The display device 10 with a touch sensing function has the array substrate 2, the opposing substrate 3, the polarizing plate 4, the polarizing plate 5, the liquid crystal layer 6 and the sealing part 7. The opposing substrate 3 is arranged in opposition to the array substrate 2 so that an upper surface serving as a main surface of the array substrate 2 and a lower surface serving as a main surface of the opposing substrate 3 face each other.

The polarizing plate 4, the polarizing plate 5, the liquid crystal layer 6 and the sealing part 7 according to the fourth embodiment can be the same as the polarizing plate 4, the polarizing plate 5, the liquid crystal layer 6 and the sealing part 7 according to the first embodiment.

In the fourth embodiment, the array substrate 2 has the driving electrode COML. The driving electrode COML operates as the driving electrode of the liquid crystal display device 20 (see FIG. 1), but does not operate as the driving electrode of the touch sensing device 30 (see FIG. 1). Accordingly, unlike the first embodiment, it is not always necessary to provide the plurality of driving electrodes as the driving electrode COML, and, for example, one driving electrode in which the plurality of driving electrodes COML of the first embodiment are combined and integrated may be provided.

In the array substrate 2 according to the fourth embodiment, the respective parts other than the driving electrode COML are the same as those of the array substrate 2 according to the first embodiment, and thus, the description thereof will be omitted.

In the fourth embodiment, the opposing substrate 3 has the substrate 31, the color filter 32, the driving electrode DRVL, an insulating film 34, the conductor pattern CB1 and the protective layer 33. The substrate 31 has the upper surface serving as the main surface and the lower surface serving as the main surface opposite to the upper surface. The color filter 32 is formed on the lower surface of the substrate 31. The driving electrode DRVL is the driving electrode of the touch sensing device 30 and is formed on the upper surface of the substrate 31. The insulating film 34 is formed on the upper surface of the substrate 31 so as to cover the driving electrode DRVL.

The conductor pattern CB1 includes the plurality of sensing electrodes TDL and the plurality of wiring parts WTP (see FIG. 5). Each of the plurality of sensing electrodes TDL is the sensing electrode of the touch sensing device 30. Each of the plurality of sensing electrodes TDL and each of the plurality of wiring parts WTP are formed on the insulating film 34 in the display region Ad. The conductor pattern CB1 according to the fourth embodiment can be the same as the conductor pattern CB1 according to the first embodiment except that the conductor pattern CB1 is formed on the upper surface of the substrate 31 via the driving electrode DRVL and the insulating film 34 interposed therebetween.

The protective layer 33 is formed on the insulating film 34 so as to cover the conductor pattern CB1 made up of the plurality of sensing electrodes TDL and the plurality of wiring parts WTP (see FIG. 5). The protective layer 33 according to the fourth embodiment can be the same as the protective layer 33 according to the first embodiment except that the protective layer 33 is formed on the upper surface of the substrate 31 via the driving electrode DRVL and the insulating film 34 interposed therebetween.

In the fourth embodiment, the driving electrode COML operates as the driving electrode of the liquid crystal display device 20, but does not operate as the driving electrode of the touch sensing device 30. The driving electrode DRVL operates as the driving electrode of the touch sensing device 30, but does not operate as the driving electrode of the liquid crystal display device 20. Thus, it is possible to independently perform the display operation by the driving electrode COML and the touch sensing operation by the driving electrode DRVL in parallel.

<Main Feature and Effect of Present Embodiment>

Also in the fourth embodiment, similarly to the first embodiment, the average film thickness AT2 of the portion P33 of the protective layer 33 formed in the region AR2 is smaller than the average film thickness AT1 of the portion P32 of the protective layer 33 formed in the region AR1 as illustrated in FIG. 10. More specifically, the film thickness TH2 of the portion formed on the portion PR2 of the wiring part WTP in the portion P33 of the protective layer 33 is smaller than the film thickness TH1 of the portion formed on the portion PR1 of the wiring part WTP in the portion P31 of the protective layer 33.

In this manner, similarly to the first embodiment, it is possible to electrically stably connect the portion PR3 of the wiring part WTP, that is, the electrode terminal ET1 and the electrode terminal ET2.

Further, in the fourth embodiment, the driving electrode COML of the display device and the driving electrode DRVL of the input device are separately formed. In this manner, since it is not necessary to separate the display period in which display operation is performed by the common electrodes COML and the touch sensing period in which touch sensing operation is performed by the driving electrodes DRVL, the sensing performance of touch sensing can be improved, for example, the sensing speed of touch sensing can be apparently improved.

In the first and fourth embodiments, an example in which a display device provided with a touch panel as an input device is applied to an in-cell liquid crystal display device with a touch sensing function has been described. However, the display device provided with a touch panel as an input device may be applied to an on-cell liquid crystal display device with a touch sensing function. The on-cell liquid crystal display device with a touch sensing function indicates a liquid crystal display device with a touch sensing function in which neither the driving electrodes nor the sensing electrodes included in the touch panel are incorporated in the liquid crystal display device.

<Input Device>

Figure 32:
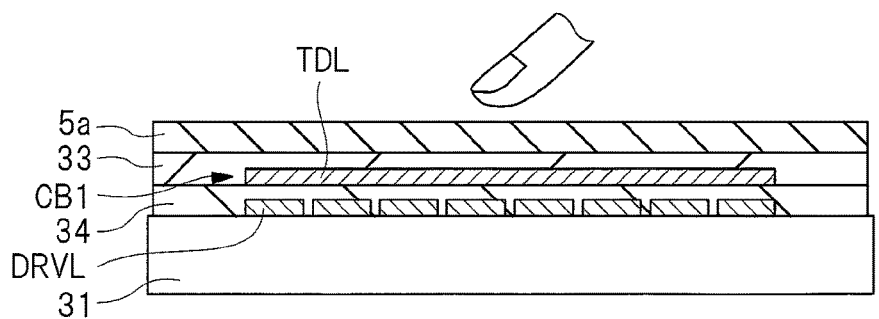
FIG. 32 is a cross-sectional view illustrating an input device as a modified example 1 of the fourth embodiment.

FIG. 32 is a cross-sectional view illustrating an input device as a modified example 1 of the fourth embodiment. In the example illustrated in FIG. 32, the input device has substantially the same configuration as the substrate 31 and the parts positioned above the substrate 31 in the display device with a touch sensing function illustrated in FIG. 31.

As illustrated in FIG. 32, the input device as the modified example 1 has the substrate 31, the driving electrode DRVL, the insulating film 34, the conductor pattern CB1 and the protective layer 33. In addition, in FIG. 32, a substrate 5a made of cover glass is provided instead of the polarizing plate 5 illustrated in FIG. 31.

The conductor pattern CB1 includes the plurality of sensing electrodes TDL and the plurality of wiring parts WTP (see FIG. 10). Also, although not illustrated in FIG. 32, the plurality of sensing electrodes TDL are connected to, for example, the touch sensing unit 40 illustrated in FIG. 1 via the plurality of wiring parts WTP interposed therebetween. Accordingly, the input device as the modified example 1 has the substrate 31, the driving electrode DRVL, the plurality of sensing electrodes TDL, a sensing circuit like the touch sensing unit 40 illustrated in, for example, FIG. 1 and the protective layer 33.

Also in such an input device, as illustrated in FIG. 10, the average film thickness AT2 of the portion P33 of the protective layer 33 formed in the region AR2 can be made smaller than the average film thickness AT1 of the portion P32 of the protective layer 33 formed in the region AR1, and thus the same effects as those of the display apparatus according to the first embodiment can be achieved.

<Touch Sensing Function of Self-Capacitance Method>

In the first to fourth embodiments and the modified example 1 of the fourth embodiment, the example in which the touch panel of the mutual capacitance method provided with the driving electrode and the sensing electrode is applied as the touch panel has been described. However, it is also possible to apply a touch panel of the self-capacitance method provided with only the sensing electrode as the touch panel.

Figure 33:
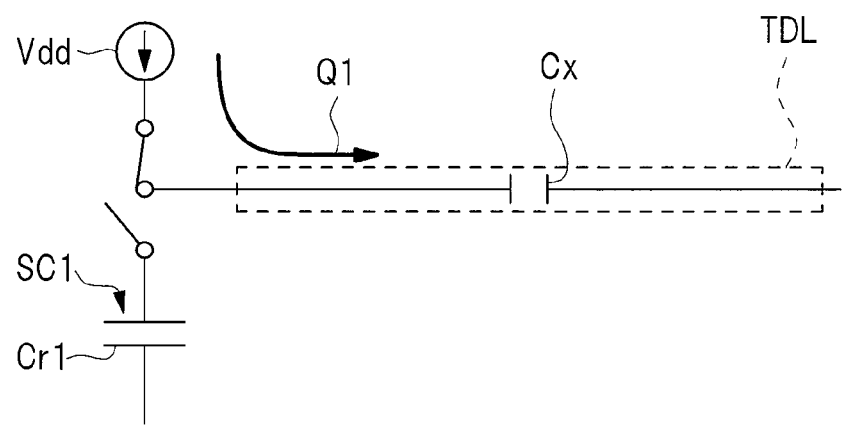
FIG. 33 is an explanatory diagram illustrating an electrical connection state of the sensing electrode in a self-capacitance method.
Figure 34:
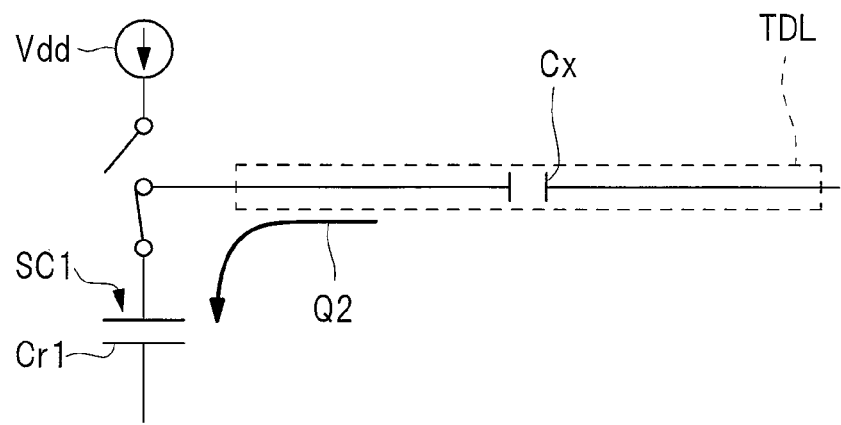
FIG. 34 is an explanatory diagram illustrating an electrical connection state of the sensing electrode in the self-capacitance method.

FIGS. 33 and 34 are explanatory diagrams illustrating the electrical connection state of the sensing electrode in the self-capacitance method.

As illustrated in FIG. 33, in the touch panel of the self-capacitance method, a charge amount Q1 is stored in the sensing electrode TDL having an electrostatic capacitance Cx when the sensing electrode TDL having the electrostatic capacitance Cx is disconnected from a sensing circuit SC1 having an electrostatic capacitance Cr1 and is electrically connected to a power source Vdd. Next, as illustrated in FIG. 34, a charge amount Q2 flowing to the sensing circuit SC1 is sensed when the sensing electrode TDL having the electrostatic capacitance Cx is disconnected from the power source Vdd and is electrically connected to the sensing circuit SC1 having the electrostatic capacitance Cr1.

Here, in the case where a finger is in contact with or approaches the sensing electrode TDL, the electrostatic capacitance Cx of the sensing electrode TDL varies due to the capacitance of the finger, and the charge amount Q2 flowing to the sensing circuit SC1 when the sensing electrode TDL is connected to the sensing circuit SC1 also varies. Accordingly, it is possible to determine whether the finger is in contact with or approaches the sensing electrode TDL by measuring the flowing charge amount Q2 by the sensing circuit SC1 and sensing the variation of the electrostatic capacitance Cx of the sensing electrode TDL.

In the case where the input device described with reference to FIG. 32 is an input device provided with the touch sensing function of the self-capacitance method, the sensing electrode TDL is provided instead of the driving electrode DRVL. When such an input device provided with the touch sensing function of the self-capacitance method is used as an input device of a modified example 2 of the fourth embodiment, the input device of the modified example 2 has the substrate 31, the plurality of sensing electrodes TDL, the sensing circuit like the touch sensing unit 40 illustrated in, for example, FIG. 1 and the protective layer 33. In addition, the input device of the modified example 2 may have the plurality of sensing electrodes TDL which extend in the X axis direction (see FIG. 5) and are arrayed at intervals in the Y axis direction (see FIG. 5) and the plurality of sensing electrodes TDL which extend in the Y axis direction and are arrayed at intervals in the X axis direction. In this case, it is possible to two-dimensionally sense the input position by sensing the variation in the electrostatic capacitance Cx of the plurality of sensing electrodes TDL extending in each direction.

In addition, also in such an input device, as illustrated in FIG. 10, the average film thickness AT2 of the portion P33 of the protective layer 33 formed in the region AR2 can be made smaller than the average film thickness AT1 of the portion P32 of the protective layer 33 formed in the region AR1, and thus the same effects as those of the display apparatus according to the first embodiment can be achieved.

In the foregoing, the invention made by the inventors of the present invention has been concretely described based on the embodiments. However, it is needless to say that the present invention is not limited to the foregoing embodiments and various modifications and alterations can be made within the scope of the present invention.

Further, in the foregoing embodiments, the cases of a liquid crystal display device have been illustrated as disclosure examples, but all kinds of flat-panel display devices such as an organic EL display device, other self-luminous type display devices and electronic paper display devices having electrophoresis elements may be listed as other application examples. Further, it goes without saying that the present invention is applicable to small, medium and large sized devices without any particular limitation.

In the category of the idea of the present invention, a person with ordinary skill in the art can conceive various modified examples and revised examples, and such modified examples and revised examples are also deemed to belong to the scope of the present invention.

For example, the examples obtained by appropriately making the additions, deletions or design changes of components or the additions, deletions or condition changes of processes to respective embodiments described above by a person with ordinary skill in the art also belong to the scope of the present invention as long as they include the gist of the present invention.

The present invention is advantageous when applied to a method of manufacturing an electrode substrate, an electrode substrate, a display apparatus and an input device.

What is claimed is:

1. An electrode substrate, comprising:
   a first substrate;
   a first electrode continuously formed on a first main surface of the first substrate from a first region of the first main surface of the first substrate via a second region of the first main surface of the first substrate to a third region of the first main surface of the first substrate;
   a protective layer formed so as to cover the first electrode in the first region and the second region;
   an anisotropic conductive film arranged so as to cover the first electrode in the second region and the third region; and
   a wiring substrate disposed on the anisotropic conductive film,
   wherein,
      a film thickness of the protective layer of a portion formed on the first electrode in the second region is smaller than a film thickness of the protective layer of a portion formed on the first electrode in the first region,
      a side surface of the first electrode of a portion formed in the third region is exposed from the protective layer,
      the wiring substrate includes a base and a second electrode formed on a second main surface of the base,
      the second electrode faces the first electrode of a portion formed in the third region via the anisotropic conductive film interposed therebetween,
      an edge portion of the anisotropic conductive film on the first region side and an edge portion of the wiring substrate on the first region side are arranged on the protective layer, and
      the first electrode and the second electrode are electrically connected via the anisotropic conductive film interposed therebetween.

2. The electrode substrate according to claim 1, wherein the edge portion of the wiring substrate on the first region side is arranged on the protective layer of a portion formed in the second region via the anisotropic conductive film interposed therebetween.

3. The electrode substrate according to claim 1, further comprising:
   a third electrode formed on the first main surface of the first substrate in a fourth region of the first main surface of the first substrate and electrically connected to the first electrode; and
   a fourth electrode formed astride the third electrode via the protective layer interposed therebetween in the fourth region,
   wherein,
      the fourth region is a region on an opposite side of the second region with the first region interposed therebetween,
      the protective layer is formed so as to cover the first electrode and the third electrode in the first region, the second region and the fourth region, and
      a film thickness of the protective layer of a portion formed on the first electrode in the second region is smaller than a film thickness of the protective layer of a portion formed on the third electrode in the fourth region.

4. The electrode substrate according to claim 1, wherein:
   the protective layer is formed by applying a raw material liquid discharged as droplets to the first main surface of the first substrate, and
   an application amount of the raw material liquid per unit area of the first main surface in the second region is made smaller than an application amount of the raw material liquid per unit area of the first main surface in the first region, so that a film thickness of the protective layer of a portion formed on the first electrode in the second region is made smaller than a film thickness of the protective layer of a portion formed on the first electrode in the first region.

5. The electrode substrate according to claim 1, wherein:
   the first region, the second region and the third region are arranged in this order in a first direction when seen in a plan view; and
   the electrode substrate further comprises a plurality of the first electrodes that extend in the first direction and are arrayed in a second direction intersecting with the first direction when seen in a plan view, both side surfaces of each of the plurality of first electrodes being exposed from the protective layer in the third region, and an array pitch in the second direction of the plurality of first electrodes being 100 to 2000 μm.

6. The electrode substrate according to claim 1, wherein the first electrode includes a metal layer or an alloy layer.

7. A display apparatus comprising:
   the electrode substrate according to claim 1;
   a second substrate facing the electrode substrate; and
   a display control unit provided between the second substrate and the electrode substrate.

8. An input device comprising the electrode substrate according to claim 1, wherein:
   the electrode substrate has a plurality of the first electrodes, and
   the input device further includes a sensing unit that senses an input position based on each electrostatic capacitance of the plurality of first electrodes.

9. The input device according to claim 8, further comprising a fifth electrode formed so as to overlap each of the plurality of first electrodes when seen in a plan view, wherein:
   the plurality of first electrodes are formed at intervals when seen in a plan view, and
   the sensing unit senses an input position based on each electrostatic capacitance between each of the plurality of first electrodes and the fifth electrode.

* * * * *